United States Patent
Tochibayashi et al.

(10) Patent No.: US 10,741,587 B2
(45) Date of Patent: Aug. 11, 2020

(54) SEMICONDUCTOR DEVICE, SEMICONDUCTOR WAFER, MODULE, ELECTRONIC DEVICE, AND MANUFACTURING METHOD THE SAME

(71) Applicant: Semiconductor Energy Laboratory Co., Ltd., Atsugi-shi, Kanagawa-ken (JP)

(72) Inventors: Katsuaki Tochibayashi, Kanagawa (JP); Ryota Hodo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 66 days.

(21) Appl. No.: 15/450,220

(22) Filed: Mar. 6, 2017

(65) Prior Publication Data
US 2017/0263651 A1   Sep. 14, 2017

(30) Foreign Application Priority Data
Mar. 11, 2016 (JP) ................. 2016-048267

(51) Int. Cl.
*H01L 27/12* (2006.01)
*H01L 29/423* (2006.01)
(Continued)

(52) U.S. Cl.
CPC ...... *H01L 27/1225* (2013.01); *H01L 23/5226* (2013.01); *H01L 23/5283* (2013.01); *H01L 23/544* (2013.01); *H01L 27/124* (2013.01); *H01L 27/127* (2013.01); *H01L 27/1207* (2013.01); *H01L 27/1248* (2013.01); *H01L 27/1288* (2013.01); *H01L 27/3218* (2013.01); *H01L 27/3258* (2013.01); *H01L 27/3262* (2013.01); *H01L 27/3276* (2013.01); *H01L 29/42384* (2013.01); *H01L 29/66969* (2013.01); *H01L 29/78648* (2013.01);
(Continued)

(58) Field of Classification Search
CPC ............... H01L 27/1225; H01L 23/544; H01L 29/66969; H01L 27/1248; H01L 27/127; H01L 27/1288; H01L 27/124; H01L 23/5226; H01L 23/5283; H01L 27/3276; H01L 27/3262; H01L 27/3258; H01L 27/32; H01L 29/45; H01L 29/7869; H01L 27/1214; H01L 27/1255; H01L 29/4908
USPC ....... 257/43, E29.068, E33.053; 438/104, 23
See application file for complete search history.

(56) References Cited

U.S. PATENT DOCUMENTS 8,547,771 B2   10/2013   Koyama
8,995,174 B2    3/2015   Koyama
(Continued)

FOREIGN PATENT DOCUMENTS

JP    2012-257187 A    12/2012

*Primary Examiner* — Mouloucoulaye Inoussa
(74) *Attorney, Agent, or Firm* — Fish & Richardson P.C.

(57) ABSTRACT

A semiconductor device including a transistor having high reliability is provided. The semiconductor device includes a transistor. The transistor includes first and second gate electrodes, a source electrode, a drain electrode, first to third oxides, first and second barrier films, and first and second gate insulators. The first barrier film is located over the source electrode, the second barrier film is located over the drain electrode, and the first and second barrier films each have a function of blocking oxygen and impurities such as hydrogen.

12 Claims, 57 Drawing Sheets

(51) Int. Cl.
  *H01L 29/786* (2006.01)
  *H01L 23/522* (2006.01)
  *H01L 23/528* (2006.01)
  *H01L 23/544* (2006.01)
  *H01L 27/32* (2006.01)
  *H01L 29/66* (2006.01)

(52) U.S. Cl.
  CPC  *H01L 2223/54453* (2013.01); *H01L 2224/05* (2013.01); *H01L 2224/48463* (2013.01); *H01L 2227/323* (2013.01)

(56) References Cited

U.S. PATENT DOCUMENTS

| | | |
|---|---|---|
| 9,076,825 B2 | 7/2015 | Yamamoto et al. |
| 9,437,744 B2 | 9/2016 | Sasagawa et al. |
| 2012/0051118 A1 | 3/2012 | Yamazaki et al. |
| 2014/0027764 A1 | 1/2014 | Yamazaki et al. |
| 2014/0374908 A1* | 12/2014 | Koezuka ........... H01L 23/53238 257/751 |
| 2015/0069387 A1 | 3/2015 | Yamamoto et al. |
| 2015/0349130 A1 | 12/2015 | Tanemura et al. |
| 2016/0013321 A1* | 1/2016 | Kobayashi ............. H01L 29/045 257/43 |
| 2016/0163870 A1* | 6/2016 | Ito ....................... H01L 29/7869 257/43 |
| 2016/0172500 A1* | 6/2016 | Yamazaki ........... H01L 29/7869 257/43 |
| 2017/0062433 A1 | 3/2017 | Miyairi et al. |
| 2017/0104018 A1 | 4/2017 | Yamazaki et al. |
| 2017/0170211 A1* | 6/2017 | Yamazaki ............ H01L 27/1225 |
| 2017/0179294 A1 | 6/2017 | Kato et al. |

* cited by examiner

FIG. 1A
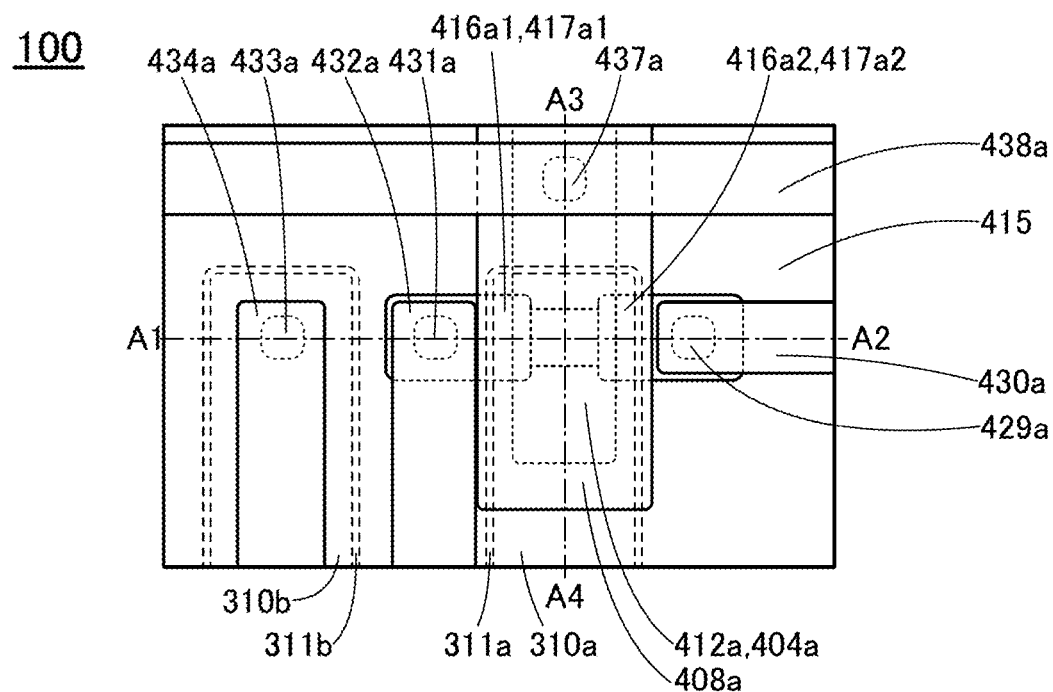
FIG. 1B
FIG. 1C
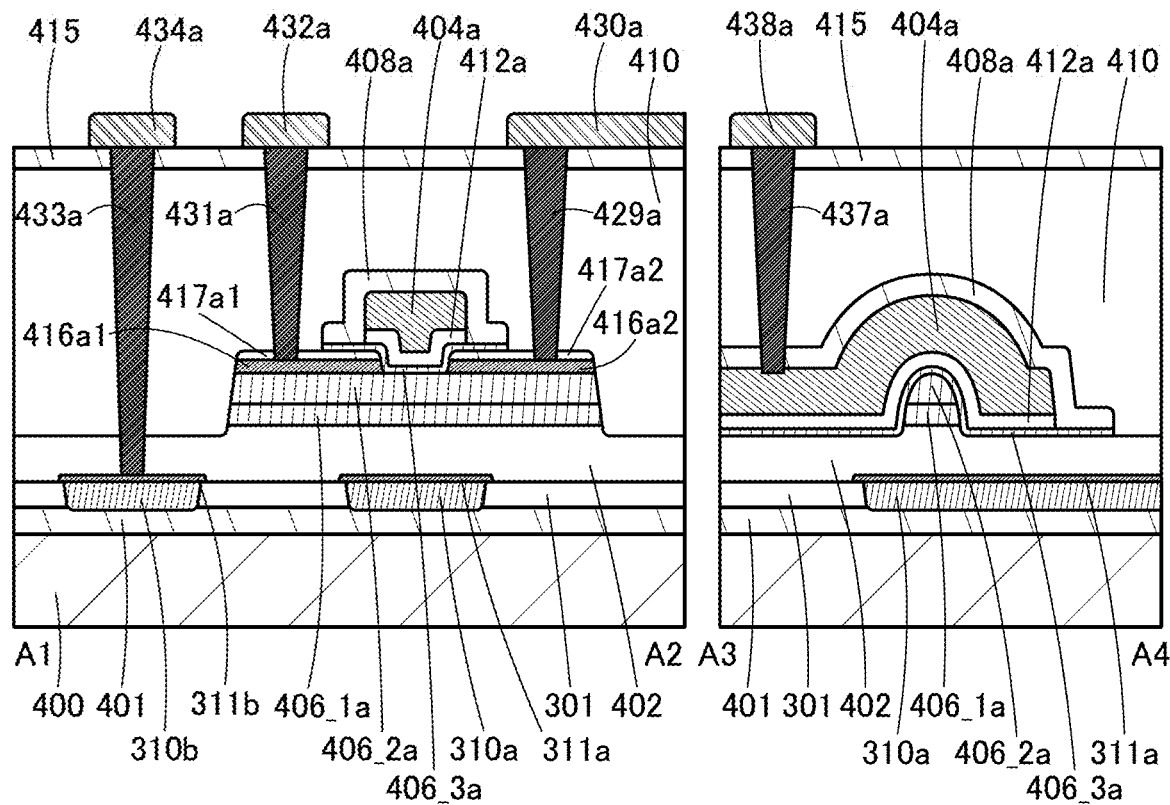

FIG. 3A
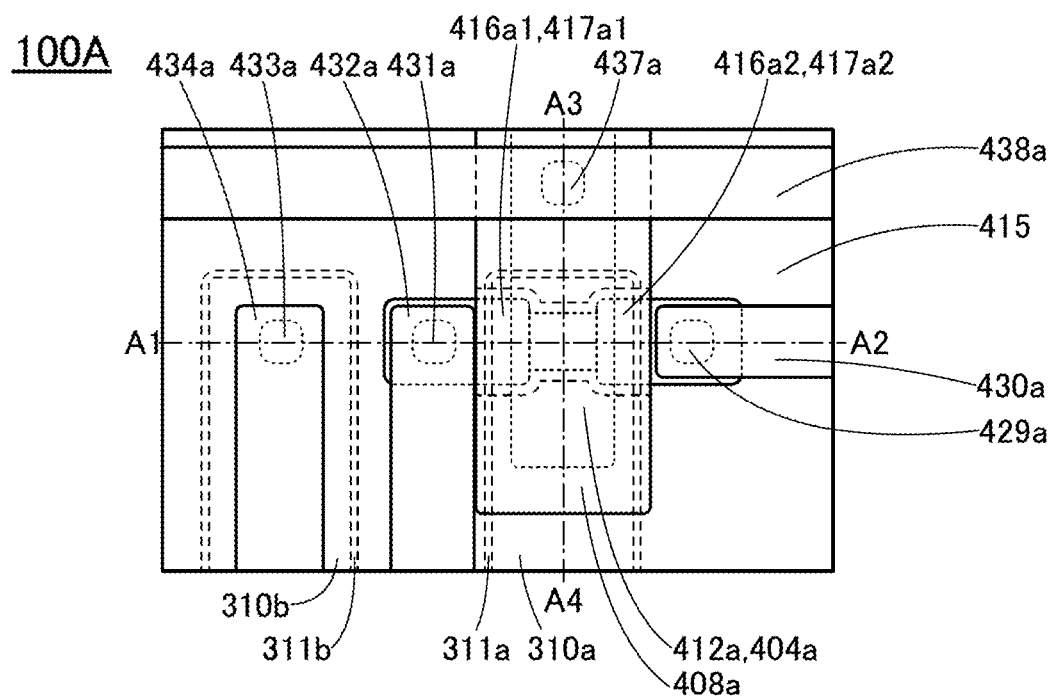
FIG. 3B
FIG. 3C
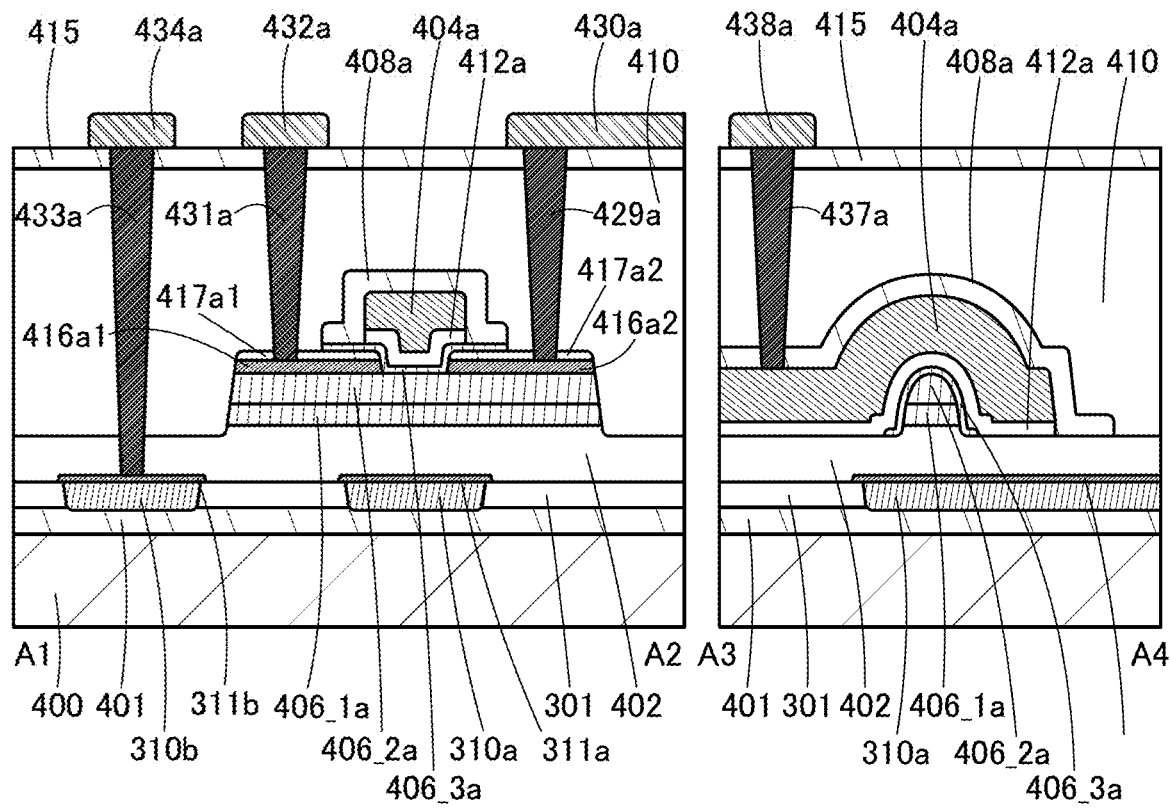

FIG. 5A
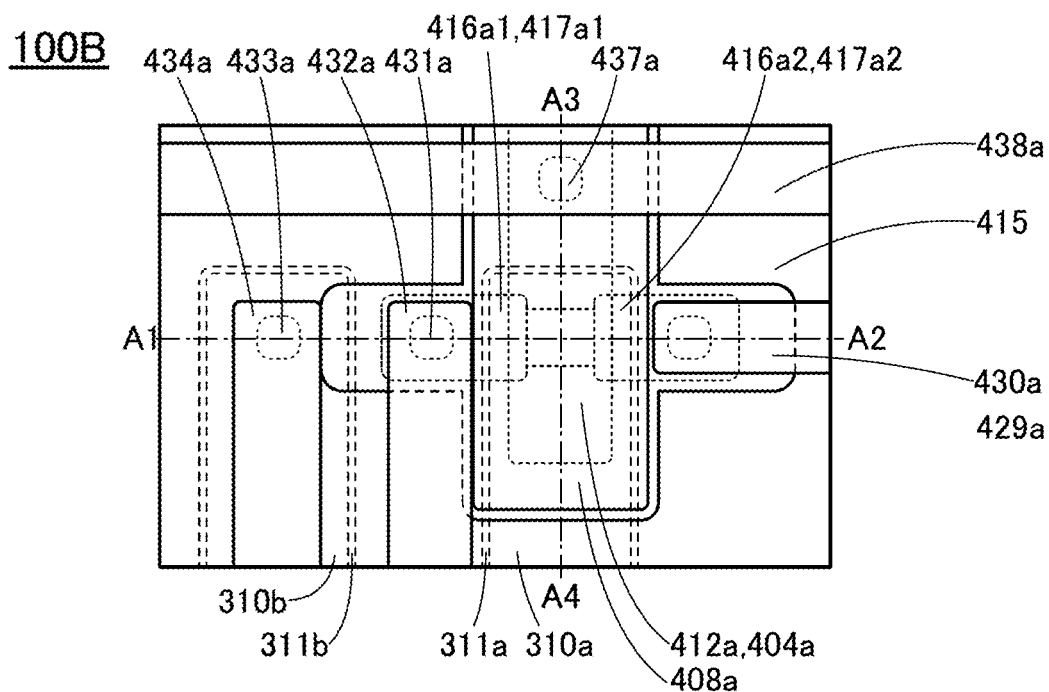
FIG. 5B
FIG. 5C
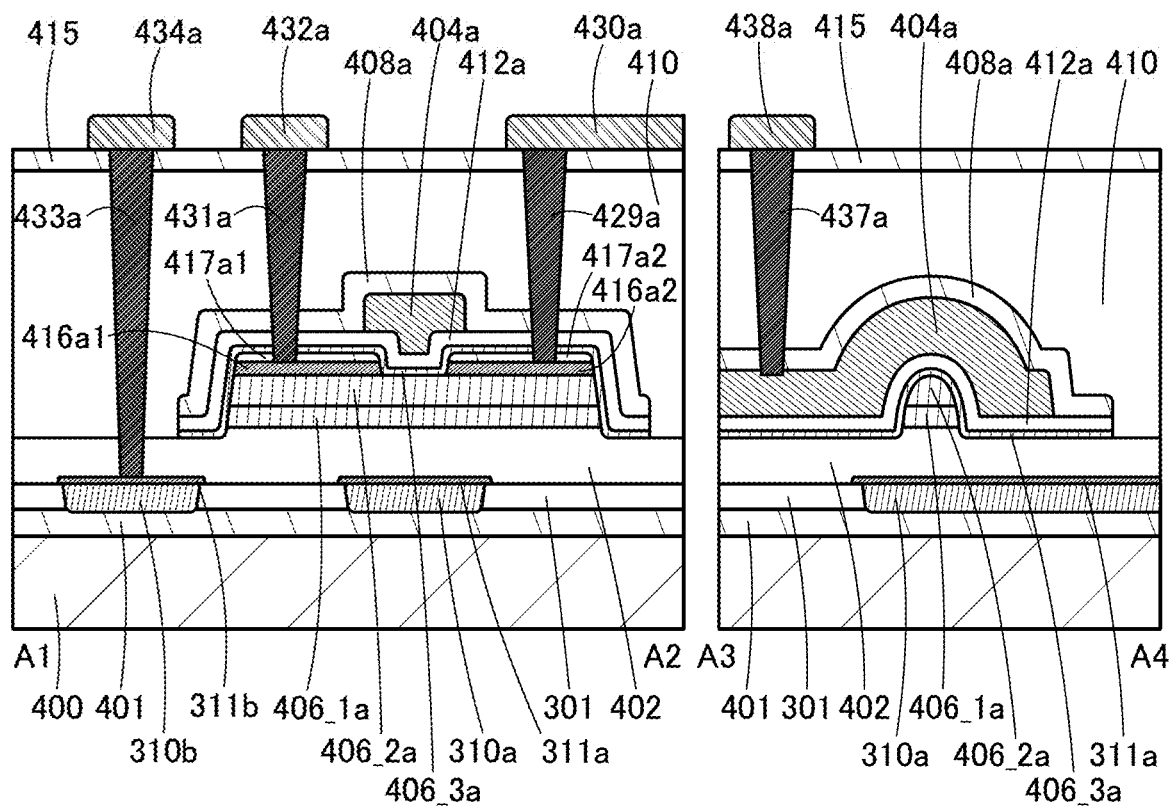

FIG. 7A
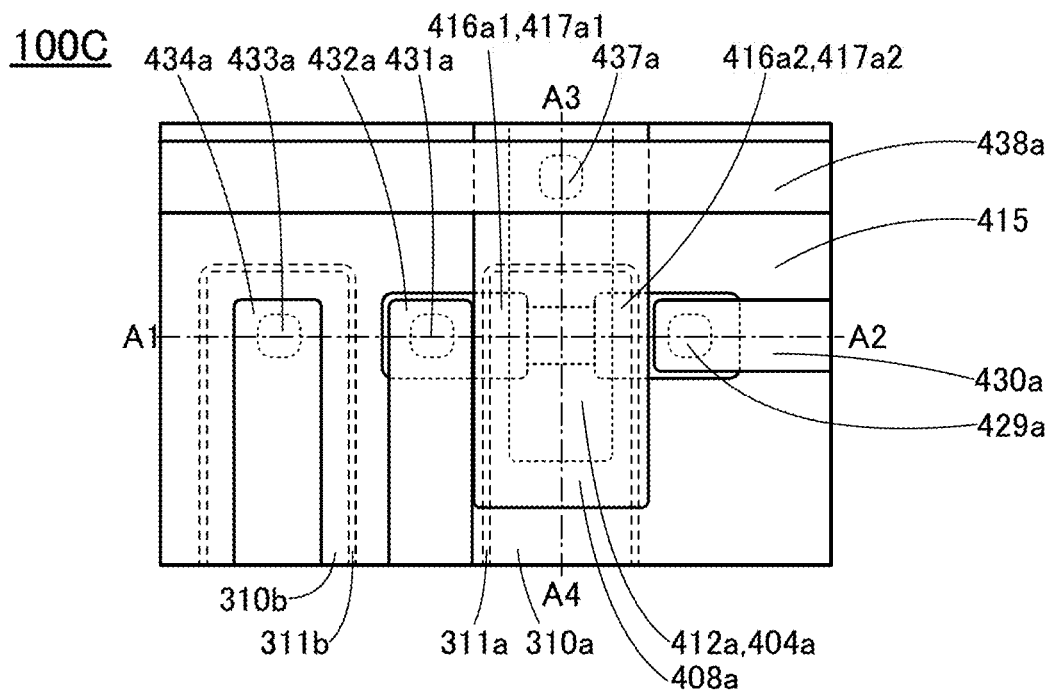
FIG. 7B
FIG. 7C
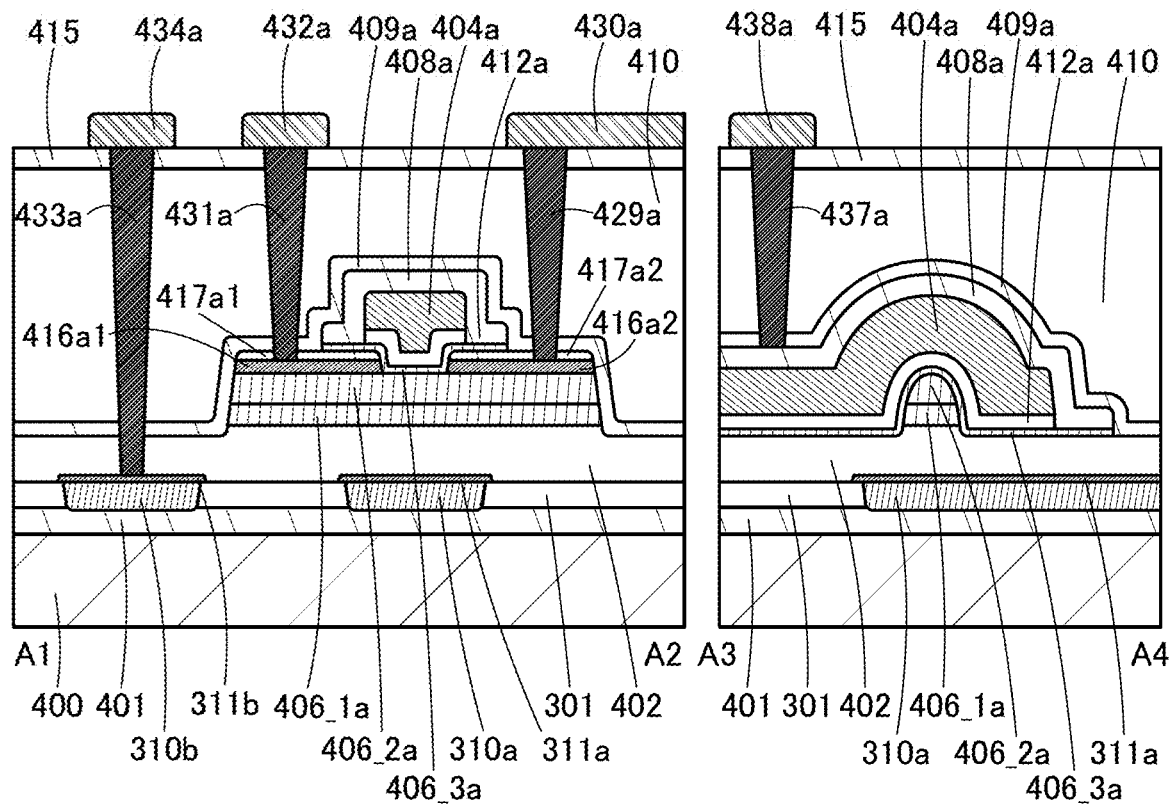

FIG. 23A
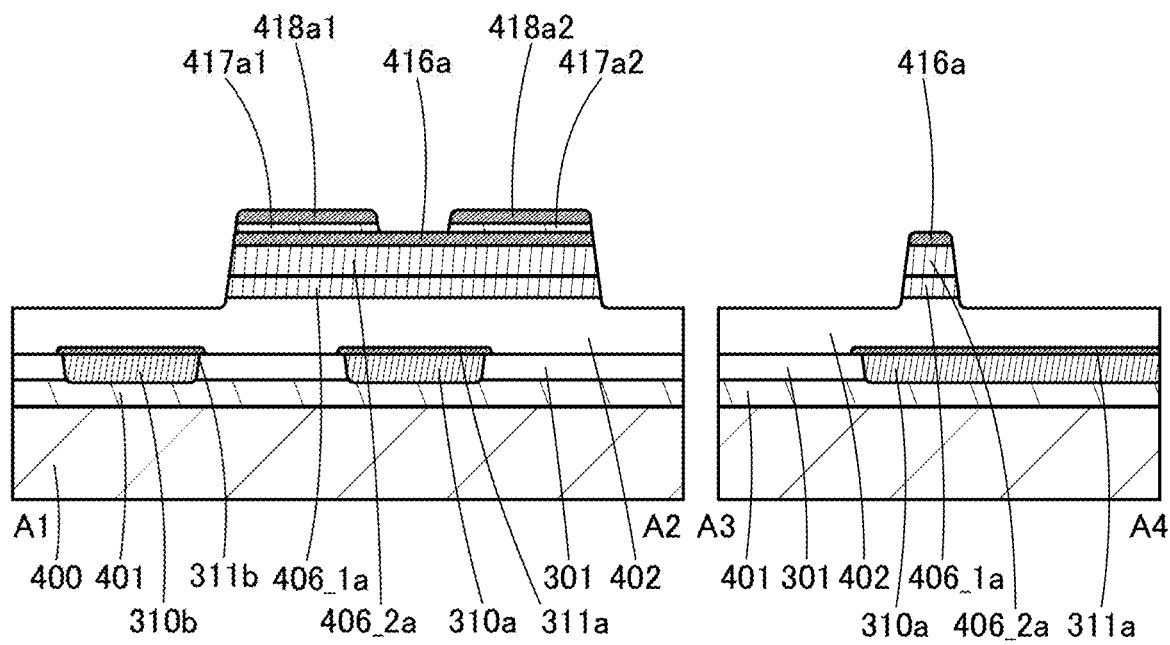
FIG. 23B
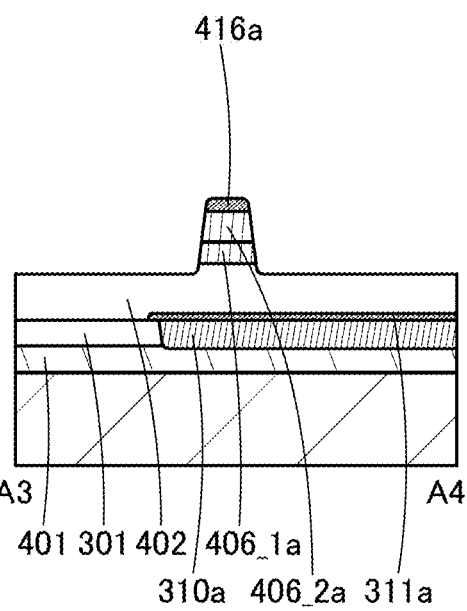
FIG. 23C
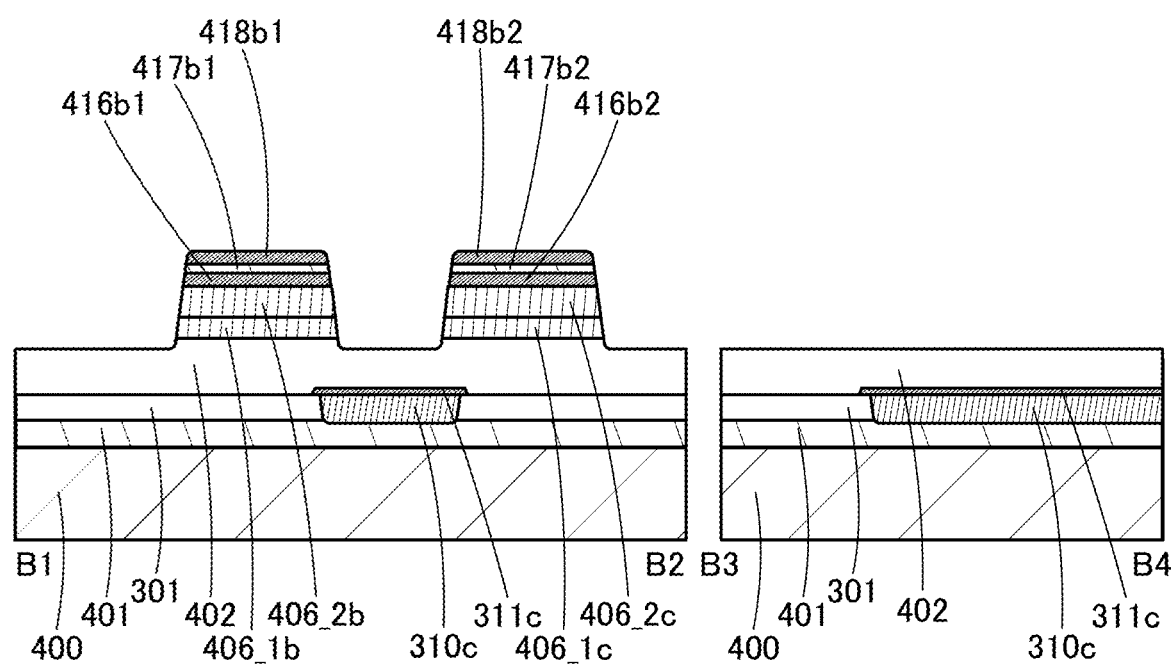
FIG. 23D

FIG. 24A
FIG. 24B
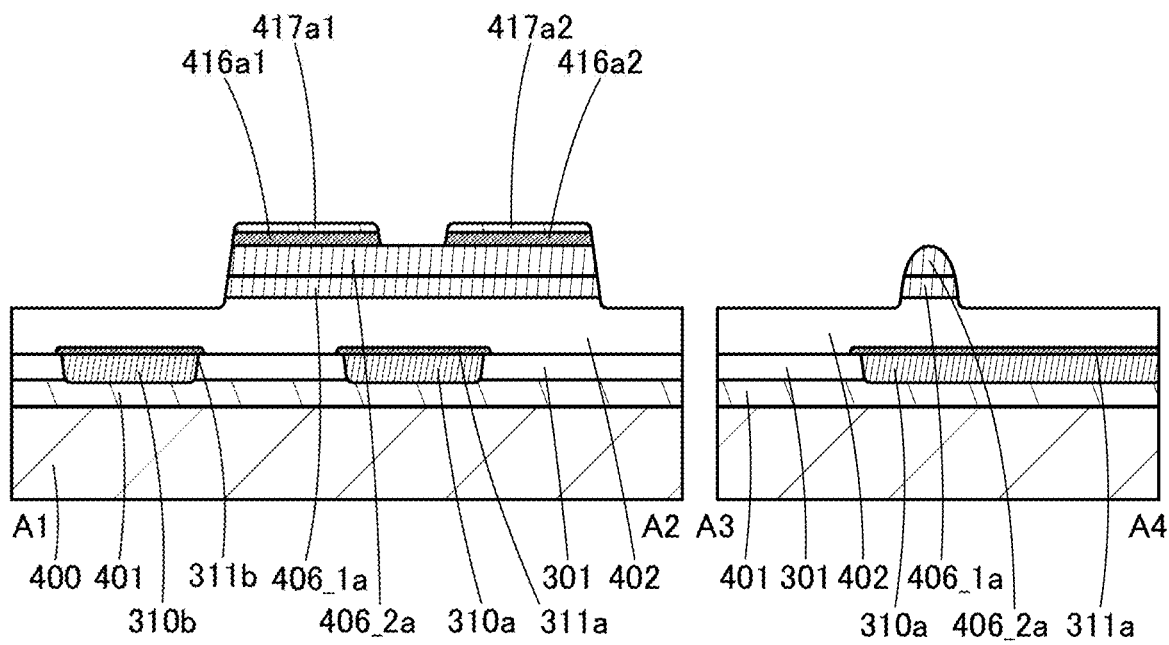
FIG. 24C
FIG. 24D
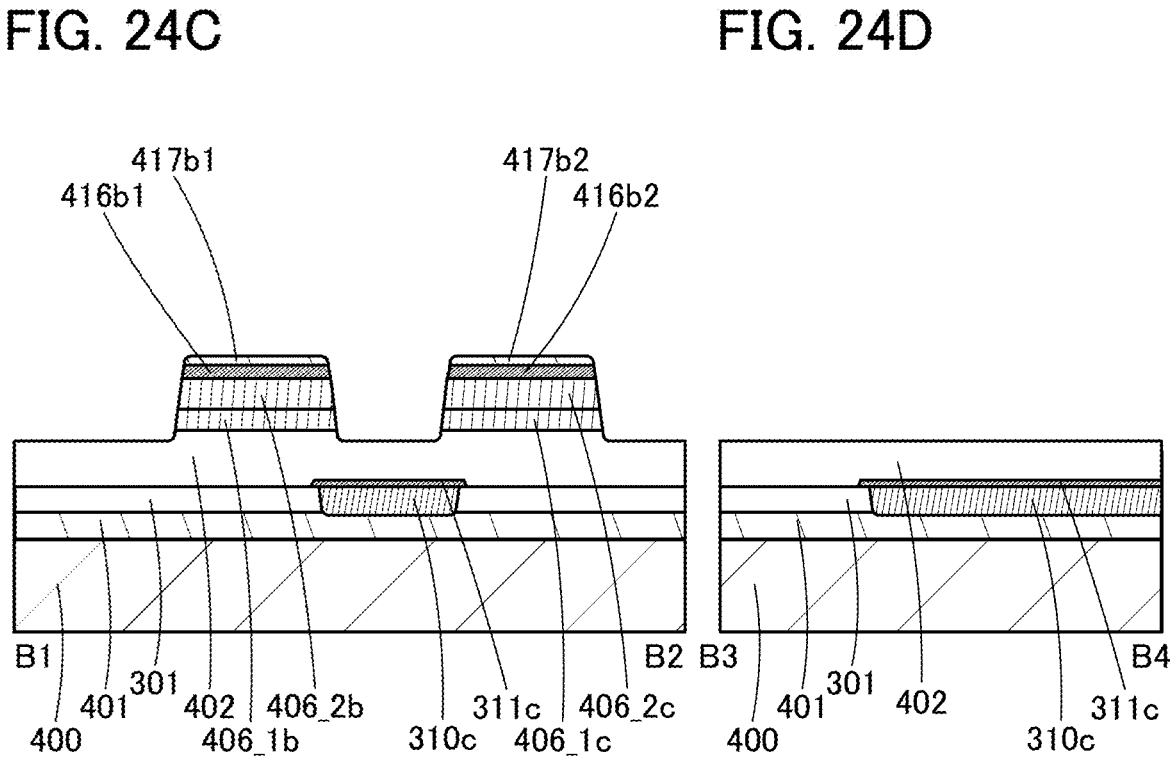

FIG. 29A
FIG. 29B
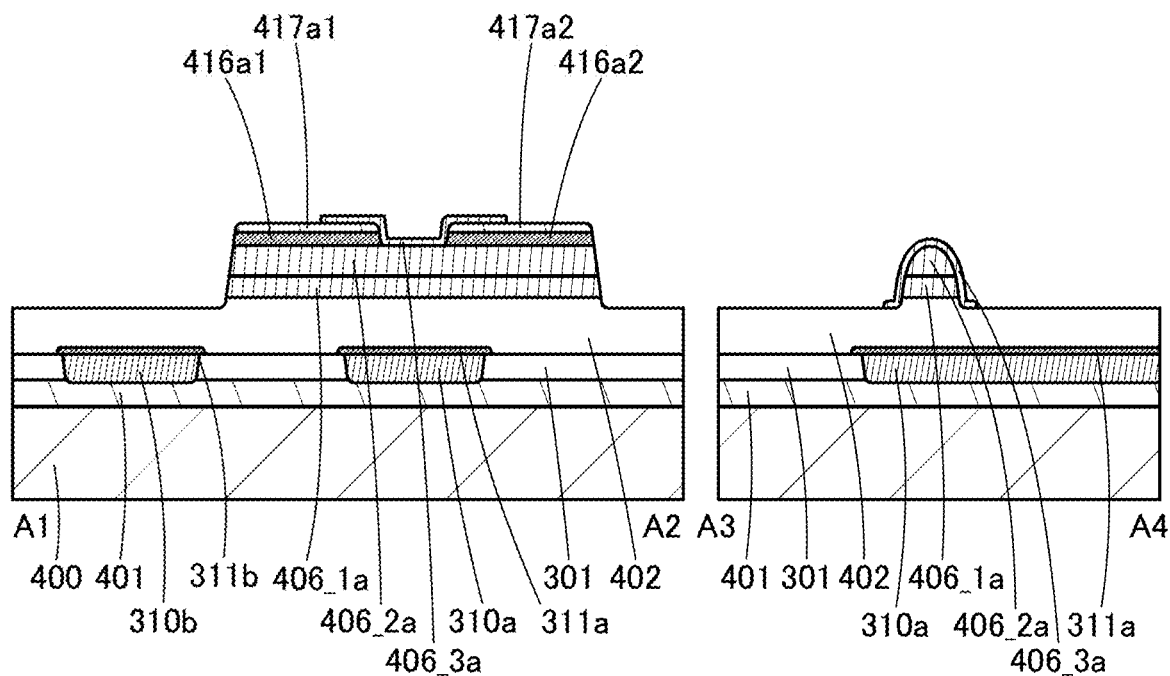
FIG. 29C
FIG. 29D
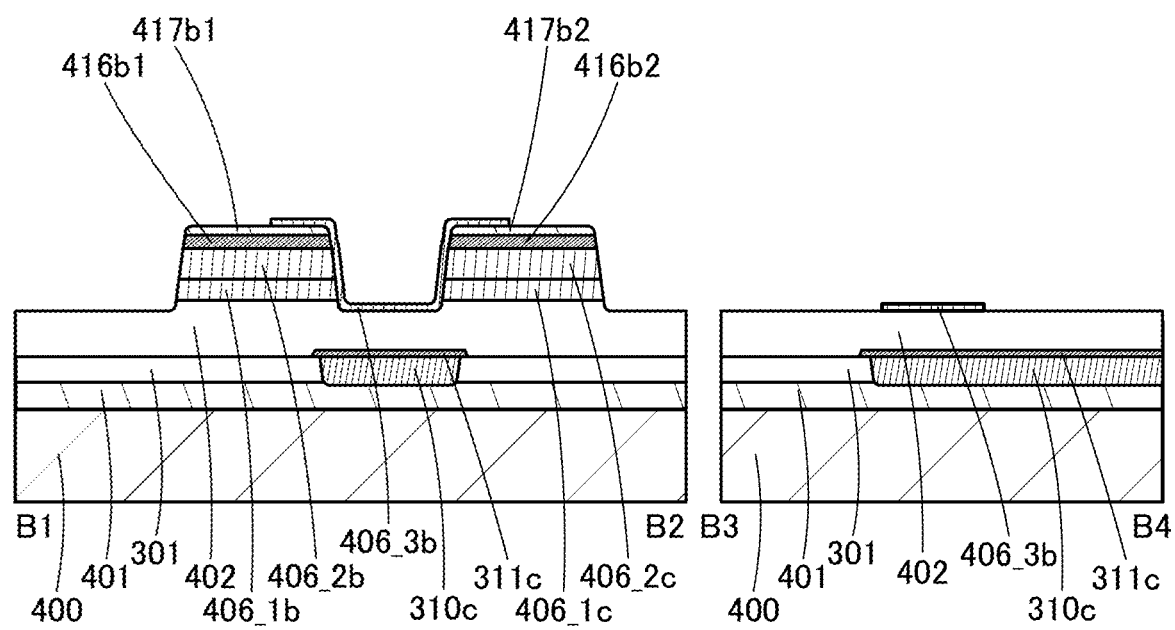

SEMICONDUCTOR DEVICE, SEMICONDUCTOR WAFER, MODULE, ELECTRONIC DEVICE, AND MANUFACTURING METHOD THE SAME

BACKGROUND OF THE INVENTION

1. Field of the Invention

The present invention relates to a transistor. The present invention relates to an object, a method, or a manufacturing method. One embodiment of the present invention relates to a process, a machine, manufacture, or a composition of matter. One embodiment of the present invention relates to a semiconductor device, a light-emitting device, a display device, an electronic appliance, a lighting device, and a manufacturing method thereof. In particular, one embodiment of the present invention relates to a light-emitting device using an organic electroluminescence (hereinafter also referred to as EL) phenomenon, and a method for fabricating the light-emitting device. For example, one embodiment of the present invention relates to an LSI, a CPU, a power device mounted in a power circuit, a semiconductor integrated circuit including a memory, a thyristor, a converter, an image sensor, and the like, and an electronic device including any of the above as a component.

Note that one embodiment of the present invention is not limited to the above technical field.

In this specification, a semiconductor device generally means a device that can function by utilizing semiconductor characteristics. An electro-optical device, a semiconductor circuit, and an electronic device include a semiconductor device in some cases.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). A silicon-based semiconductor material is widely known as a material for a semiconductor thin film that can be used for a transistor. As another material, an oxide semiconductor has been attracting attention.

It is known that a transistor including an oxide semiconductor has an extremely low leakage current in an off state. For example, a low-power-consumption CPU utilizing a characteristic of low leakage current of the transistor including an oxide semiconductor has been disclosed (see Patent Document 1).

A transistor including an oxide semiconductor is known to have a problem of low reliability because of high possibility of change in electrical characteristics, although the transistor including an oxide semiconductor can be operated at higher speed than a transistor including amorphous silicon and can be manufactured more easily than a transistor including polycrystalline silicon. For example, the threshold voltage of the transistor is changed in some cases after a bias-temperature stress test (BT test).

REFERENCE

Patent Document

[Patent Document 1] Japanese Published Patent Application No. 2012-257187

SUMMARY OF THE INVENTION

An object of one embodiment of the present invention is to improve the reliability of a semiconductor device including an oxide semiconductor. There is a problem in that a transistor including an oxide semiconductor tends to have normally-on characteristics and it is difficult to provide a logic circuit which operates properly in a driver circuit. Thus, an object of one embodiment of the present invention is to obtain normally-off characteristics of a transistor including an oxide semiconductor.

Another object is to provide a transistor having high reliability. Another object is to provide a transistor with extremely low leakage current in an off state.

Another object is to provide semiconductor devices with high productivity. Another object is to provide semiconductor devices with high yield. Another object is to provide a semiconductor device that occupies a small area.

Another object is to provide a highly integrated semiconductor device. Another object is to provide a semiconductor device which can operate at high speed. Another object is to provide a semiconductor device with low power consumption.

Another object is to provide a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device includes a transistor. The transistor includes first to fourth conductors, first to third oxides, first and second barrier films, and first and second insulators. The first insulator comprises a region overlapping the first conductor. The first oxide is located over the first insulator. The second oxide is located over the first oxide. The second oxide comprises first to third regions. The second region is located between the first region and the third region. The second conductor is located over the second oxide. The first barrier film is located over the second conductor. The second conductor and the first barrier film each include a region overlapping the first region. The third conductor is located over the second oxide. The second barrier film is located over the third conductor. The third conductor and the second barrier film each include a region overlapping the third region. The third oxide includes a region overlapping the first barrier film, a region overlapping the second barrier film, and a region overlapping the second region. The second insulator is located over the third oxide. The fourth conductor is located over the second insulator. The second insulator and the fourth conductor each include a region overlapping the second region.

(2) One embodiment of the present invention is the semiconductor device described in (1), in which the first to third oxides each include an oxide semiconductor.

(3) One embodiment of the present invention is the semiconductor device described in (1) or (2), in which the first and second barrier films each include metal and oxygen.

(4) One embodiment of the present invention is a module including the semiconductor device described in any one of (1) to (3) and a printed circuit board.

(5) One embodiment of the present invention is an electronic device including the semiconductor device described in any one of (1) to (3), the module described in (4), and a speaker or an operation key.

(6) One embodiment of the present invention is the semiconductor wafer including a plurality of semiconductor devices and a region for dicing. Each of the plurality of semiconductor devices is the semiconductor devices described in any one of (1) to (3).

(7) One embodiment of the present invention is a method for manufacturing a semiconductor device, including the steps of forming a second insulator over a first insulator; forming an opening in the second insulator so that a bottom of the opening reaches the first insulator; forming a first gate electrode in the opening; forming a first gate insulator over the second insulator and the first gate electrode; forming a first oxide over the first gate insulator; forming a second oxide over the first oxide; forming a first conductor over the second oxide; forming a barrier film over the first conductor; forming a second conductor over the barrier film; processing the second conductor and the barrier film by a lithography method to form an opening in which the first conductor is exposed at a bottom; processing the second conductor, the barrier film, and the first conductor by a lithography method to form a first layer including the opening, the second conductor, the barrier film, and the first conductor; processing the second oxide and the first oxide by using the first layer as an etching mask; removing part of the first conductor exposed at the bottom of the opening and the second conductor, so that the second oxide is exposed at the bottom of the opening; dividing the first conductor into a source electrode and a drain electrode; dividing the barrier film into a first barrier film and a second barrier film; forming a second layer including the first oxide, the second oxide, the source electrode, the drain electrode, the first barrier film, and the second barrier film; performing treatment using plasma containing an oxidation gas to reduce an impurity included in the first and second oxides by diffusion of the impurity; performing heat treatment in an atmosphere containing a nitrogen gas and heat treatment in an atmosphere containing an oxygen gas to reduce hydrogen and water included in the first and second oxides by diffusion of the hydrogen and the water; forming a third oxide over the second layer; forming a second gate insulator over the third oxide; and forming a second gate electrode over the second gate insulator.

(8) One embodiment of the present invention is the method for manufacturing a semiconductor device, described in (7), in which the oxidation gas includes dinitrogen monoxide.

(9) One embodiment of the present invention is the method for manufacturing a semiconductor device, described in (7) or (8), in which the barrier film includes metal and oxygen.

(10) One embodiment of the present invention is a method for manufacturing a module. The module includes a semiconductor device manufactured by the method for manufacturing a semiconductor device described in any one of (7) to (9), and a printed circuit board.

(11) One embodiment of the present invention is a method for manufacturing an electronic device. The electronic device includes a semiconductor device manufactured by the method for manufacturing a semiconductor device described in any one of (7) to (9), a module manufactured by the method for manufacturing a module described in (10), and a speaker or an operation key.

A change in electric characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

A novel semiconductor device can be provided. A module including the semiconductor device can be provided. An electronic device including the semiconductor device or the module can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 1A to 1C illustrate a cross-sectional structure of a semiconductor device of one embodiment of the present invention.

FIGS. 3A to 3C illustrate a cross-sectional structure of a semiconductor device of one embodiment of the present invention.

FIGS. 5A to 5C illustrate a cross-sectional structure of a semiconductor device of one embodiment of the present invention.

FIGS. 7A to 7C illustrate a cross-sectional structure of a semiconductor device of one embodiment of the present invention.

FIGS. 23A to 23D illustrate a method for manufacturing a transistor of one embodiment of the present invention.

FIGS. 24A to 24D illustrate a method for manufacturing a transistor of one embodiment of the present invention.

FIGS. 29A to 29D illustrate a method for manufacturing a transistor of one embodiment of the present invention.

DETAILED DESCRIPTION OF THE INVENTION

Figure 2A:
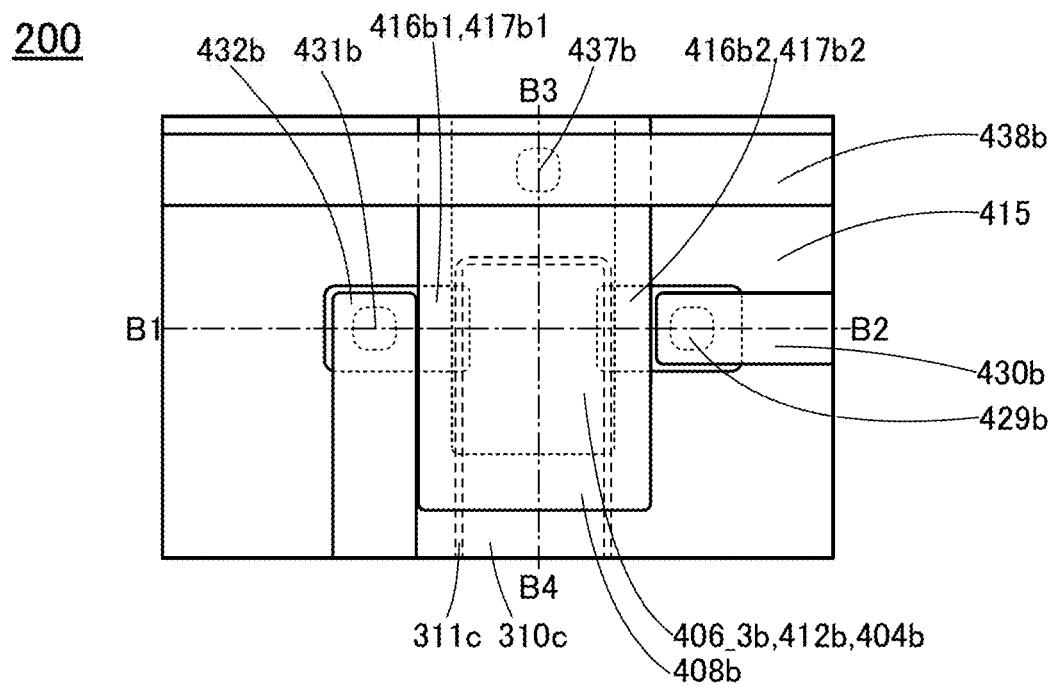
FIGS. 2A to 2C illustrate a cross-sectional structure of a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Further, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. The transistor has a channel region between the drain (a drain terminal, a drain region, or a drain electrode) and the source (a source terminal, a source region, or a source electrode), and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentration ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 50. In addition, the term "substantially parallel" indicates that the angle formed between two straight lines is greater than or equal to −30° and less than or equal to 30°. The term "perpendicular" indicates that the angle formed between two straight lines is greater than or equal to 800 and less than or equal to 1000, and accordingly also includes the case where the angle is greater than or equal to 850 and less than or equal to 950. In addition, the term "substantially perpendicular" indicates that the angle formed between two straight lines is greater than or equal to 600 and less than or equal to 1200.

In this specification, trigonal and rhombohedral crystal systems are included in a hexagonal crystal system.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification, a barrier film refers to a film having a function of blocking oxygen and impurities such as hydrogen. The barrier film that has conductivity may be referred to as a conductive barrier film.

Embodiment 1

Providing transistors having different electrical characteristics over the same layer can increase the degree of freedom in design of a semiconductor device and the integration degree in the semiconductor device. In this embodiment, an example of an embodiment where transistors having different electrical characteristics are provided over the same layer is described.

<Transistor Structure 1>

Structures of a transistor 100 and a transistor 200 included in a semiconductor device of one embodiment of the present invention are described below.

FIGS. 1A to 1C are a top view and cross-sectional views illustrating the transistor 100 of one embodiment of the present invention. FIG. 1A is the top view. FIG. 1B is a cross-sectional view taken along dashed-dotted line A1-A2 illustrated in FIG. 1A. FIG. 1C is a cross-sectional view taken along dashed-dotted line A3-A4 illustrated in FIG. 1A. Note that for simplification of the drawing, some components are not illustrated in the top view in FIG. 1A.

In FIGS. 1B and 1C, the transistor 100 includes an insulator 401 over a substrate 400; an insulator 301 which is located over the insulator 401 and includes openings in which a conductor 310*a* and a conductor 310*b* are provided; a conductor 311*a* and a conductor 311*b* over the conductor 310*a* and the conductor 310*b*; an insulator 402 over the insulator 301, the conductor 311*a*, and the conductor 311*b*; an oxide 406_1*a* over the insulator 402; an oxide 406_2*a* over the oxide 406_1*a*; a conductor 416*a*1 and a conductor 416*a*2 each of which includes a region in contact with a top surface of the oxide 406_2*a*; a barrier film 417*a*1 over the conductor 416*a*1; a barrier film 417*a*2 over the conductor 416*a*2; an oxide 406_3*a* which includes a region in contact with the top surface of the oxide 406_2*a*, a side surface of the conductor 416*a*1, a top surface of the barrier film 417*a*1, a side surface of the conductor 416*a*2, and a top surface of the barrier film 417a2; an insulator 412a over the oxide 406_3a; a conductor 404a which includes a region overlapping the oxide 406_3a with the insulator 412a positioned therebetween; an insulator 408a over the insulator 412a and the conductor 404a; an insulator 410 over the insulator 408a; and an insulator 415 over the insulator 410. In addition, the transistor 100 includes a first opening which passes through the insulator 415 and the insulator 402 and reaches the conductor 311b; a second opening which passes through the insulator 410 and the barrier film 417a1 and reaches the conductor 416a1; a third opening which passes through the insulator 410 and the barrier film 417a2 and reaches the conductor 416a2; a fourth opening which passes through the insulator 410 and the insulator 408a and reaches the conductor 404a; a conductor 433a, a conductor 431a, a conductor 429a, and a conductor 437a which are embedded in the first opening, the second opening, the third opening, and the fourth opening, respectively; a conductor 434a which is located over the insulator 415 and includes a region in contact with the conductor 433a; a conductor 432a which is located over the insulator 415 and includes a region in contact with the conductor 431a; a conductor 430a which is located over the insulator 415 and includes a region in contact with the conductor 429a; and a conductor 438a which is located over the insulator 415 and includes a region in contact with the conductor 437a.

The conductor 404a functions as a first gate electrode in the transistor 100. Furthermore, the conductor 404a can have a stacked-layered structure including a conductor that allows less oxygen to pass therethrough. For example, when the conductor that allows less oxygen to pass therethrough is formed as a lower layer, an increase in the electric resistance value due to oxidation of the conductor 404a can be prevented. The insulator 412a functions as a first gate insulator.

The conductors 416a1 and 416a2 function as source and drain electrodes. The conductors 416a1 and 416a2 can each have a stacked-layer structure including a conductor that allows less oxygen to pass therethrough. For example, when the conductor that allows less oxygen to pass therethrough is formed as an upper layer, an increase in the electric resistance value due to oxidation of the conductors 416a1 and 416a2 can be prevented. Note that the electric resistance values of the conductors can be measured by a two-terminal method or the like.

The barrier films 417a1 and 417a2 have a function of blocking oxygen and impurities such as hydrogen. The barrier film 417a1 is located over the conductor 416a1 and prevents the diffusion of oxygen into the conductor 416a1. The barrier film 417a2 is located over the conductor 416a2 and prevents the diffusion of oxygen into the conductor 416a2.

In the transistor 100, the resistance of the oxide 406_2a can be controlled by a potential applied to the conductor 404a. That is, conduction or non-conduction between the conductors 416a1 and 416a2 can be controlled by the potential applied to the conductor 404a.

As illustrated in FIGS. 1B and 1C, the top surface of the oxide 406_2a is in contact with the conductors 416a1 and 416a2. The oxides 406_1a and 406_2a can be electrically surrounded by an electric field of the conductor 404a functioning as the first gate electrode. A structure in which the electric field of the first gate electrode electrically surrounds a semiconductor is referred to as a surrounded channel (s-channel) structure. Therefore, a channel is formed in the entire oxide 406_2a in some cases. In the s-channel structure, a large amount of current can flow between the source and the drain of the transistor, so that an on-state current can be increased. In addition, since the oxides 406_1a and 406_2a are electrically surrounded by the electric field of the conductor 404a, an off-state current can be reduced.

The conductors 310a and 311a function as a second gate electrode. The conductor 311a functions as a conductive barrier film. Since the conductor 311a is provided so as to cover the conductor 310a, it can prevent oxidation of the conductor 310a.

The insulator 402 functions as a second gate insulating film. The threshold voltage of the transistor 100 be controlled by a potential applied to the conductors 310a and 311a. The first gate electrode and the second gate electrode are electrically connected to each other, whereby a high on-state current can be obtained. Note that the function of the first gate electrode and that of the second gate electrode may be interchanged.

The conductor 310b and the conductor 311b function as wirings. The conductor 311b functions as a conductive barrier film. Since the conductor 311b is provided so as to cover the conductor 310b, it can prevent oxidation of the conductor 310b.

The structure of the transistor 200 which has different characteristics from the transistor 100 is described below.

Figure 2B:
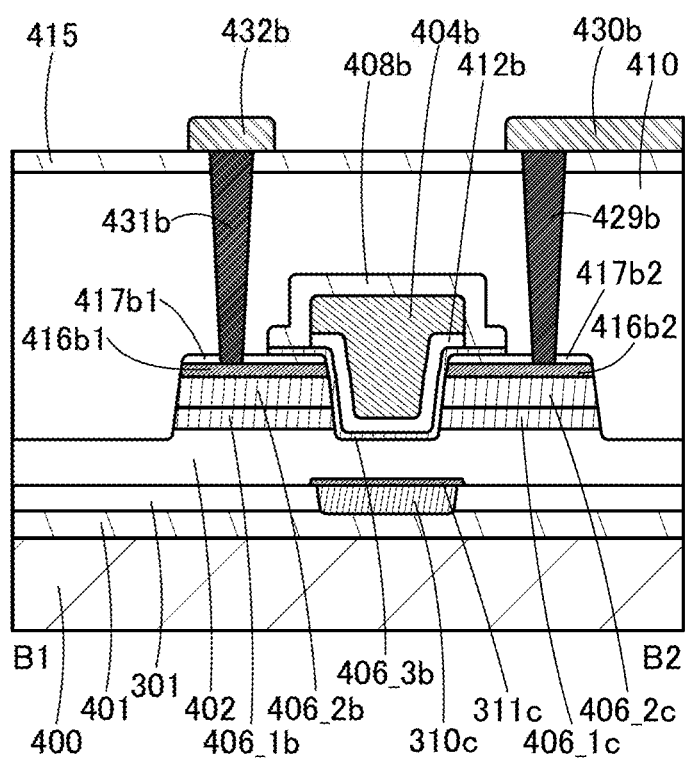
Figure 2C:
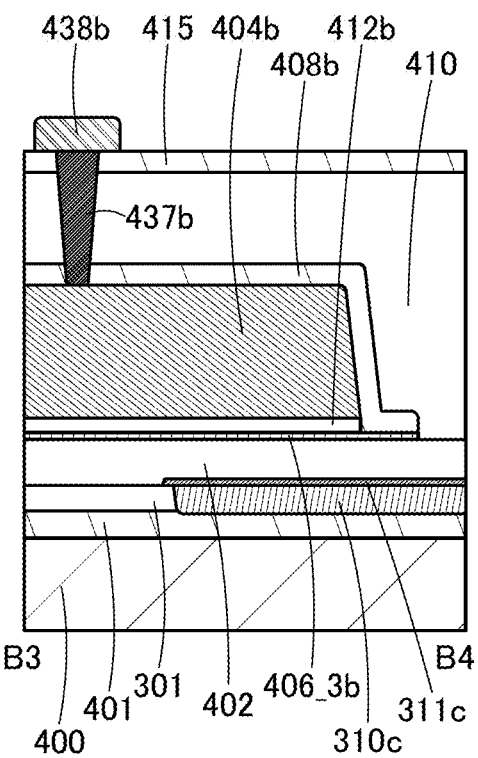

FIGS. 2A to 2C are a top view and cross-sectional views illustrating the transistor 200 of one embodiment of the present invention. FIG. 2A is the top view. FIG. 2B is a cross-sectional view taken along dashed-dotted line B1-B2 illustrated in FIG. 2A. FIG. 2C is a cross-sectional view taken along dashed-dotted line B3-B4 illustrated in FIG. 2A. Note that for simplification of the drawing, some components are not illustrated in the top view in FIG. 2A.

In FIGS. 2B and 2C, the transistor 200 includes the insulator 401 over the substrate 400; the insulator 301 which is located over the insulator 401 and includes an opening in which a conductor 310c is provided; a conductor 311c over the conductor 310c; the insulator 402 over the insulator 301 and the conductor 311c; an oxide 406_1b and an oxide 406_1c over the insulator 402; an oxide 406_2b and an oxide 406_2c over the oxide 406_1b and the oxide 406_1c; a conductor 416b1 which includes a region in contact with a top surface of the oxide 406_2b; a conductor 416b2 which includes a region in contact with a top surface of the oxide 406_2c; a barrier film 417b1 over the conductor 416b1; a barrier film 417b2 over the conductor 416b2; an oxide 406_3b which includes a region in contact with a top surface of the insulator 402, a side surface of the oxide 406_1b, a side surface of the oxide 406_2b, a side surface of the conductor 416b1, top and side surfaces of the barrier film 417b1, a side surface of the oxide 406_1c, a side surface of the oxide 406_2c, a side surface of the conductor 416b2, and top and side surfaces of the barrier film 417b2; an insulator 412b over the oxide 406_3b; a conductor 404b which includes a region overlapping the oxide 406_3b with the insulator 412b positioned therebetween; an insulator 408b over the insulator 412b and the conductor 404b; the insulator 410 over the insulator 408b; and the insulator 415 over the insulator 410. In addition, the transistor 200 includes a fifth opening which passes through the insulator 410 and the barrier film 417b1 and reaches the conductor 416b1; a sixth opening which passes through the insulator 410 and the barrier film 417b2 and reaches the conductor 416b2; a seventh opening which passes through the insulator 410 and the insulator 408b and reaches the conductor 404b; a conductor 431b, a conductor 429b, and a conductor 437b which are embedded in the fifth opening, the sixth opening, and the seventh opening, respectively; a conductor 432b which is located over the insulator 415 and includes a region in contact with the conductor 431b; a conductor 430b which is located over the insulator 415 and includes a region in contact with the conductor 429b; and a conductor 438b which is located over the insulator 415 and includes a region in contact with the conductor 437b.

The conductor 404b functions as a first gate electrode in the transistor 200. Furthermore, the conductor 404b can have a stacked-layered structure including a conductor that allows less oxygen to pass therethrough. For example, when the conductor that allows less oxygen to pass therethrough is formed as a lower layer, an increase in the electric resistance value due to oxidation of the conductor 404b can be prevented. The insulator 412b functions as a first gate insulator.

The conductors 416b1 and 416b2 function as source and drain electrodes. The conductors 416b1 and 416b2 can each have a stacked-layer structure including a conductor that allows less oxygen to pass therethrough. For example, when the conductor that allows less oxygen to pass therethrough is formed as an upper layer, an increase in the electric resistance value due to oxidation of the conductors 416b1 and 416b2 can be prevented. Note that the electric resistance values of the conductors can be measured by a two-terminal method or the like.

The barrier films 417b1 and 417b2 have a function of blocking oxygen and impurities such as hydrogen. The barrier film 417b1 is located over the conductor 416b1 and prevents the diffusion of oxygen into the conductor 416b1. The barrier film 417b2 is located over the conductor 416b2 and prevents the diffusion of oxygen into the conductor 416b2.

As illustrated in FIG. 2B, the transistor 200 includes a region in which the oxide 406_3b is in contact with the side surfaces of the conductors 416b1 and 416b2. In the transistor 200, the resistance of the oxide 406_3b can be controlled by a potential applied to the conductor 404b. That is, conduction or non-conduction between the conductors 416b1 and 416b2 can be controlled by the potential applied to the conductor 404b.

Since the channel is formed in the oxide 406_3b in the transistor 200, the transistor 200 has different characteristics from the transistor 100.

The conductors 310c and 311c function as a second gate electrode. The conductor 311c functions as a conductive barrier film. Since the conductor 311c is provided so as to cover the conductor 310c, it can prevent oxidation of the conductor 310c.

Figure 10A:
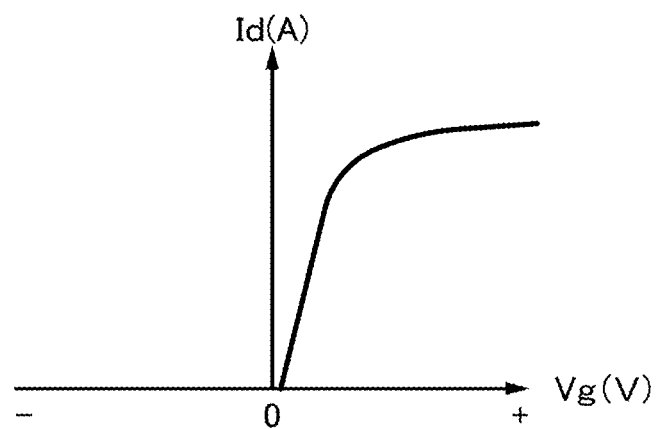
FIGS. 10A and 10B show electrical characteristics of transistors in one embodiment of the present invention.
Figure 10B:
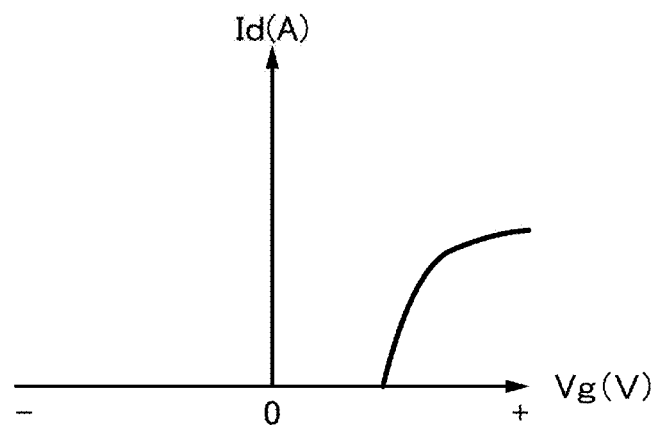

FIGS. 10A and 10B each show a $V_g$-$I_d$ curve, which is one of the electrical characteristics of a transistor. In FIGS. 10A and 10B showing the $V_g$-$I_d$ curves, the horizontal axis represents a voltage ($V_g$) between the gate and the source of a transistor. Furthermore, the vertical axis represents current flowing to a drain ($I_d$) of the transistor on a logarithmic scale.

The transistors 100 and 200 are each a transistor including a back gate. FIG. 10A shows the $V_g$-$I_d$ curve of the transistor 100 which is obtained when the back gate is set to the same potential as the source or the gate. FIG. 10B shows the $V_g$-$I_d$ curve of the transistor 200 which is obtained when the back gate is set to the same potential as the source or the gate. As shown in FIGS. 10A and 10B, the transistors 100 and 200 have different transistor characteristics. The $V_g$ in the $V_g$-$I_d$ curve of the transistor 200 is shifted in the positive direction compared with that in the $V_g$-$I_d$ curve of the transistor 100. In other words, the transistor 200 has higher $V_{th}$ than the transistor 100.

<Substrate>

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 that is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

<Insulator>

Note that the transistor is surrounded by an insulator which has a function of blocking oxygen and impurities such as hydrogen, whereby the transistor can have stable electrical characteristics. For example, an insulator with a function of blocking oxygen and impurities such as hydrogen may be used as each of the insulators 401, 408a, 408b, and 415.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulators 401, 408a, 408b, and 415 may be each formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulators 401, 408a, 408b, and 415 each preferably include aluminum oxide.

For example, when the insulator 415 is formed using plasma including oxygen, oxygen can be added to the insulator 410 serving as a base layer. The added oxygen serves as excess oxygen in the insulator 410, and is added to the oxides 406_1a, 406_2a, 406_3a, and 406_3b through the insulator 410 by heat treatment or the like, so that oxygen defects in the oxides 406_1a, 406_2a, 406_3a, and 406_3b can be repaired.

When the insulators 401, 408a, 408b, and 415 include aluminum oxide, entry of impurities such as hydrogen into the oxides 406_1a, 406_2a, 406_3a, and 406_3b can be prevented. Furthermore, for example, when the insulators 401, 408a, 408b, 415 include aluminum oxide, outward diffusion of the above-described excess oxygen added to the oxides 406_1a, 406_2a, 406_3a, and 406_3b can be reduced.

The insulators 301, 402, 412a, and 412b can each be formed to have a single-layer structure or a stacked-layered structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 301, 402, 412a, and 412b preferably contain silicon oxide or silicon oxynitride.

Note that the insulators 402, 412a, and 412b preferably include an insulator with a high dielectric constant. For example, the insulators 402, 412a, and 412b each preferably contain gallium oxide, hafnium oxide, oxide containing aluminum and hafnium, oxynitride containing aluminum and hafnium, oxide containing silicon and hafnium, oxynitride containing silicon and hafnium, or the like. Alternatively, the insulators 402, 412a, and 412b each preferably have a stacked-layered structure of silicon oxide or silicon oxynitride and an insulator with a high dielectric constant. Because silicon oxide and silicon oxynitride have thermal stability, combination of silicon oxide or silicon oxynitride with an insulator with a high dielectric constant allows the stacked-layer structure to be thermally stable and have a high dielectric constant. For example, when aluminum oxide, gallium oxide, or hafnium oxide is on the oxide 406_3a side, entry of silicon included in the silicon oxide or the silicon oxynitride into the oxide 406_2a can be inhibited. When silicon oxide or silicon oxynitride is positioned on the oxide 406_3a side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 410 preferably includes an insulator with low relative dielectric constant. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

An insulator having a function of blocking oxygen and impurities such as hydrogen may be used as each of the barrier films 417a1, 417a2, 417b1, and 417b2. The barrier films 417a1, 417a2, 417b1, and 417b2 can prevent excess oxygen included in the insulator 410 from diffusing to the conductors 416a1, 416a2, 416b1, and 416b2.

The barrier films 417a1, 417a2, 417b1, and 417b2 can be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride, for example. Note that the barrier film 417a1, the barrier film 417a2, the barrier film 417b1, and the barrier film 417b2 preferably include aluminum oxide.

<Conductor>

The conductors 404a, 404b, 310a, 310b, 310c, 416a1, 416a2, 416b1, 416b2, 429a, 429b, 431a, 431b, 433a, 437a, 437b, 430a, 430b, 432a, 432b, 434a, 438a, and 438b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like. Alternatively, a semiconductor having a high electric conductivity typified by polycrystalline silicon including an impurity element such as phosphorus, or silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used.

A stack of a plurality of conductive layers formed with the above materials may be used. For example, a stacked-layered structure formed using a combination of a material including any of the metal elements listed above and a conductive material including oxygen may be used. Alternatively, a stacked-layered structure formed using a combination of a material including any of the metal elements listed above and a conductive material including nitrogen may be used. Alternatively, a stacked-layered structure formed using a combination of a material including any of the metal elements listed above, a conductive material including oxygen, and a conductive material including nitrogen may be used.

When an oxide semiconductor is used for the channel formation region of the transistor, a stacked-layer structure formed using a material containing the above-described metal element and a conductive material containing oxygen is preferably used for the gate electrode. In that case, the conductive material containing oxygen is preferably formed on the channel formation region side. When the conductive material containing oxygen is formed on the channel formation region side, oxygen released from the conductive material is likely to be supplied to the channel formation region.

The conductors 429a, 429b, 431a, 431b, 433a, 437a, and 437b may be formed using, for example, a conductive material with high embeddability, such as tungsten or polysilicon. A conductive material with high embeddability and a conductive barrier film such as a titanium layer, a titanium nitride layer, or a tantalum nitride layer may be used in combination.

As the oxides 406_1a, 406_2a, 406_3a, and 406_3b, an oxide semiconductor is preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

<Oxide>

An oxide that can be used as the oxides 406_1a, 406_2a, 406_3a, 406_3b, and the like is described.

The oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide semiconductor according to the present invention are described with reference to FIGS. 16A to 16C. Note that the proportion of oxygen atoms is not illustrated in FIGS. 16A to 16C. The terms of the atomic ratio of indium, the element M, and zinc contained in the oxide are denoted by [In], [M], and [Zn], respectively.

Figure 16A:
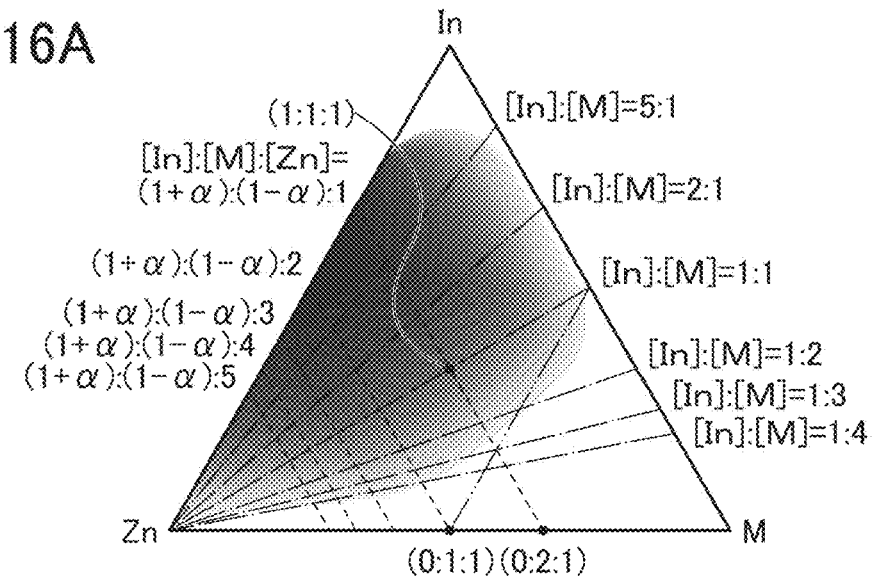
FIGS. 16A to 16C each show the range of the atomic ratio of an oxide semiconductor of one embodiment of the present invention.
Figure 16B:
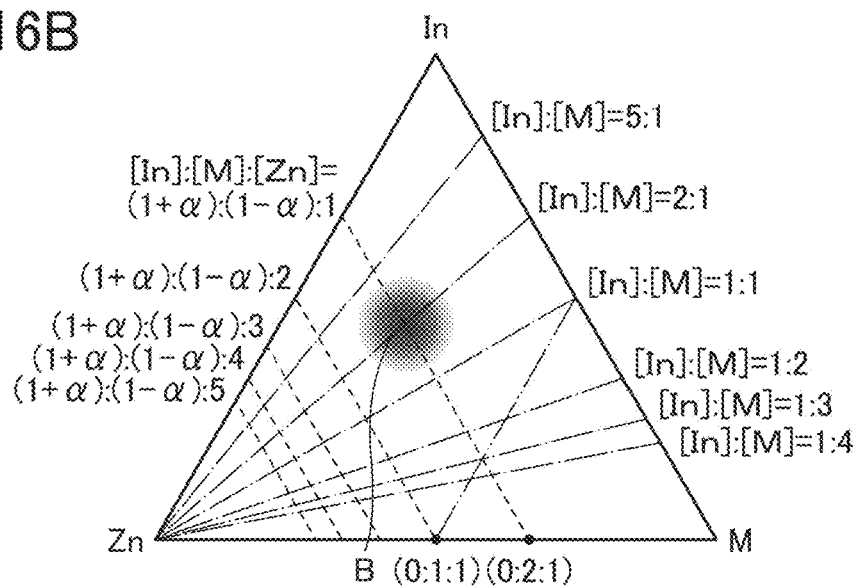
Figure 16C:
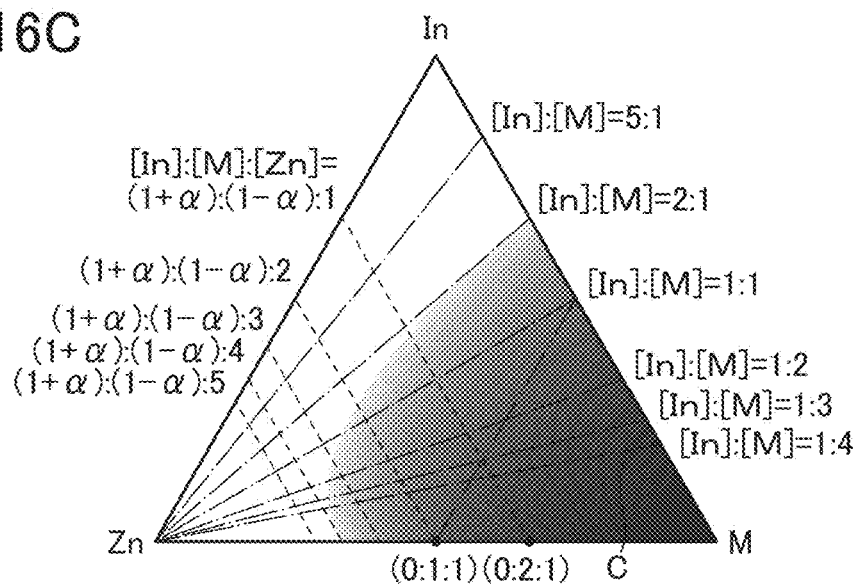

In FIGS. 16A to 16C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

The oxides shown in FIGS. 16A to 16C with an atomic ratio of [In]:[M]:[Zn]=0:2:1 and the vicinity thereof are likely to have a spinel crystal structure.

FIGS. 16A and 16B show examples of the preferred ranges of the atomic ratio of indium, the element M, and zinc contained in an oxide in one embodiment of the present invention.

Figure 17:
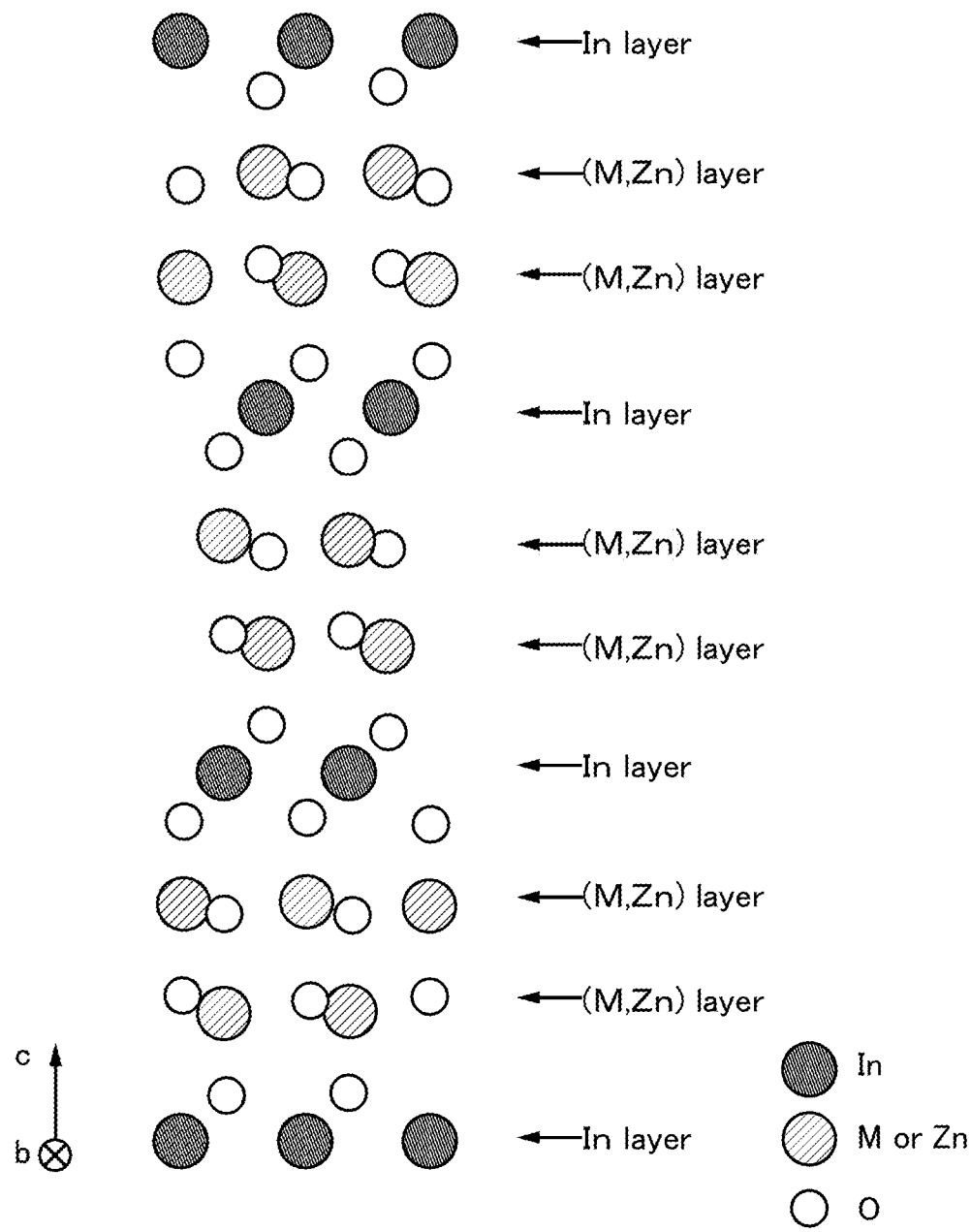
FIG. 17 illustrates a crystal of $InMZnO_4$.

FIG. 17 illustrates an example of the crystal structure of InMZnO$_4$ whose atomic ratio [In]:[M]:[Zn] is 1:1:1. The crystal structure illustrated in FIG. 17 is InMZnO$_4$ observed from a direction parallel to a b-axis. Note that a metal element in a layer that contains M, Zn, and oxygen (hereinafter, this layer is referred to as an "(M,Zn) layer") in FIG. 17 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 17.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio [In]:[M]:[Zn] is 1:1:2 has a layered structure that includes one In layer for every three (M,Zn) layers. In other words, if [Zn] is larger than [In] and [M], the proportion of the (M,Zn) layer to the In layer becomes higher when the oxide is crystallized.

Note that in the case where the number of (M,Zn) layers with respect to one In layer is not an integer in the oxide, the oxide might have a plurality of kinds of layered structures where the number of (M,Zn) layers with respect to one In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have a higher carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has a higher carrier mobility than an oxide having a low content of indium.

In contrast, carrier mobility decreases as the indium content and the zinc content in an oxide become lower. Thus, with an atomic ratio of [In]:[M]:[Zn]=0:1:0 and the vicinity thereof (e.g., a region C in FIG. 16C), insulation performance becomes better.

Accordingly, an oxide of one embodiment of the present invention preferably has an atomic ratio represented by the region A in FIG. 16A. With the atomic ratio, a layered structure with high carrier mobility and a few grain boundaries is easily obtained.

A region B in FIG. 16B represents an atomic ratio of [In]:[M]:[Zn]=4:2:3 to 4:2:4.1 and the vicinity thereof. The vicinity includes an atomic ratio of [In]:[M]:[Zn]=5:3:4. An oxide with an atomic ratio represented by the region B is an excellent oxide that has particularly high crystallinity and high carrier mobility.

Note that the condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with a low carrier density is preferably used for the transistor. For example, an oxide whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. As examples of the impurities, hydrogen, nitrogen, alkali metal, alkaline earth metal, iron, nickel, silicon, and the like are given.

Here, the influence of impurities in the oxide is described. When silicon or carbon that is a Group 14 element is contained in the oxide, defect states are formed. Thus, the concentration of silicon or carbon (measured by secondary ion mass spectrometry (SIMS)) is set to be lower than or equal to $2\times10^{18}$ atoms/cm$^3$, preferably lower than or equal to $2\times10^{17}$ atoms/cm$^3$ in the oxide or around an interface with the oxide.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal measured by SIMS is set to be lower than or equal to $1\times10^{18}$ atoms/cm$^3$, preferably lower than or equal to $2\times10^{16}$ atoms/cm$^3$.

When containing nitrogen, the oxide easily becomes n-type by generation of electrons serving as carriers and an increase of carrier density. Thus, a transistor whose semiconductor includes an oxide containing nitrogen is likely to be normally-on. For this reason, nitrogen in the oxide is preferably reduced as much as possible; for example, the concentration of nitrogen in the oxide measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, hydrogen in the oxide is preferably reduced as much as possible. Specifically, the concentration of hydrogen in the oxide measured by SIMS is set to be lower than $1\times10^{20}$ atoms/cm$^3$, preferably lower than $1\times10^{19}$ atoms/cm$^3$, more preferably lower than $5\times10^{18}$ atoms/cm$^3$, and still more preferably lower than $1\times10^{18}$ atoms/cm$^3$.

When an oxide with sufficiently reduced impurity concentration is used for a channel formation region in a transistor, the transistor can have stable electrical characteristics.

Next, the case where the oxide has a two-layer structure or a three-layer structure is described. A band diagram of a stacked-layer structure of an oxide S1, an oxide S2, and an oxide S3 and insulators that are in contact with the stacked-layer structure and a band diagram of a stacked-layer structure of the oxides S2 and S3 and insulators that are in contact with the stacked-layer structure are described with reference to FIGS. 18A and 18B.

Figure 18A:
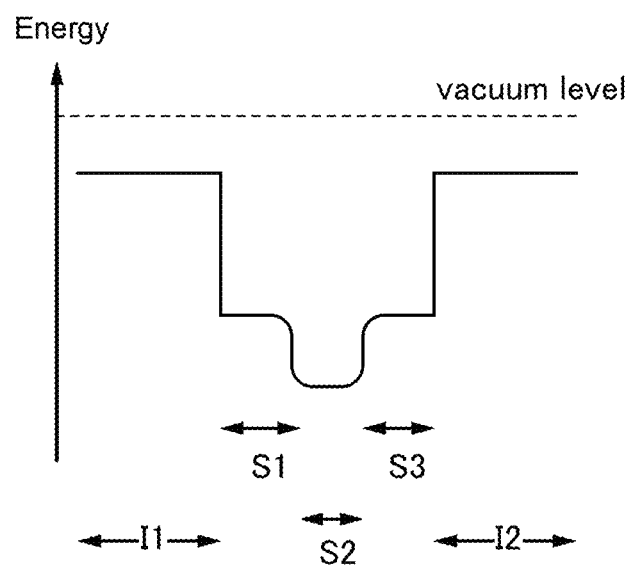
FIGS. 18A and 18B are each a band diagram of a stacked-layer structure of an oxide semiconductor.
Figure 18B:
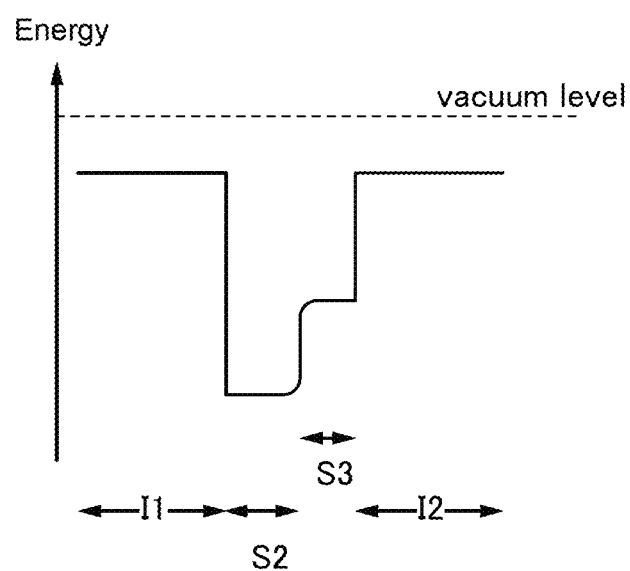

FIG. 18A is an example of a band diagram of a stacked-layered structure including an insulator I1, the oxide S1, the oxide S2, the oxide S3, and an insulator I2 in a thickness direction. FIG. 18B is an example of a band diagram of a stacked-layered structure including the insulator I1, the oxide S2, the oxide S3, and the insulator I2 in a thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in the energy level between the conduction band minimum of the oxide S2 and the conduction band minimum of each of the oxides S1 and S3 is preferably greater than or equal to 0.15 eV or greater than or equal to 0.5 eV, and less than or equal to 2 eV or less than or equal to 1 eV. That is, it is preferable that the electron affinity of the oxide S2 be higher than the electron affinity of each of the oxides S1 and S3, and the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As illustrated in FIGS. 18A and 18B, the conduction band minimum of each of the oxides S1 to S3 is gradually varied. In other words, the energy level of the conduction band minimum is continuously varied or continuously connected. In order to obtain such a band diagram, the density of defect states in a mixed layer formed at the interface between the oxides S1 and S2 or the interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 16C can be used as the oxides S1 and S3. Note that the region C in FIG. 16C represents the atomic ratio of [In]:[M]:[Zn]=0:1:0 and the vicinity thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

<Transistor Structure 2>

Here, a transistor 100A and a transistor 200A whose structures are different from those of FIGS. 1A to 1C and FIGS. 2A to 2C are described.

FIGS. 3A to 3C are a top view and cross-sectional views illustrating the transistor 100A of one embodiment of the present invention. FIG. 3A is the top view. FIG. 3B is a cross-sectional view taken along dashed-dotted line A1-A2 illustrated in FIG. 3A. FIG. 3C is a cross-sectional view taken along dashed-dotted line A3-A4 illustrated in FIG. 3A. Note that for simplification of the drawing, some components are not illustrated in the top view in FIG. 3A.

The transistor 100A illustrated in FIGS. 3A to 3C is different from the transistor 100 illustrated in FIGS. 1A to 1C in the shape of the oxide 406_3a. In the transistor 100, an edge portion of the insulator 408a is aligned with an edge portion of the oxide 406_3a, whereas in the transistor 100A, the edge portion of the oxide 406_3a is provided on an inner side than the edge portion of insulator 408a in FIG. 3C, although the edge portion of the insulator 408a is aligned with the edge portion of the oxide 406_3a in FIG. 3B. The above difference is caused by a difference in formation steps of the oxide 406_3a and the insulator 408a in the manufacturing process of the transistor, and the manufacture process of the transistor 100A is advantageous in that the oxide 406_3a can be shaped freely. The formation process of the transistor will be described later. For the other components, refer to the structure of the transistor 100.

Figure 4A:
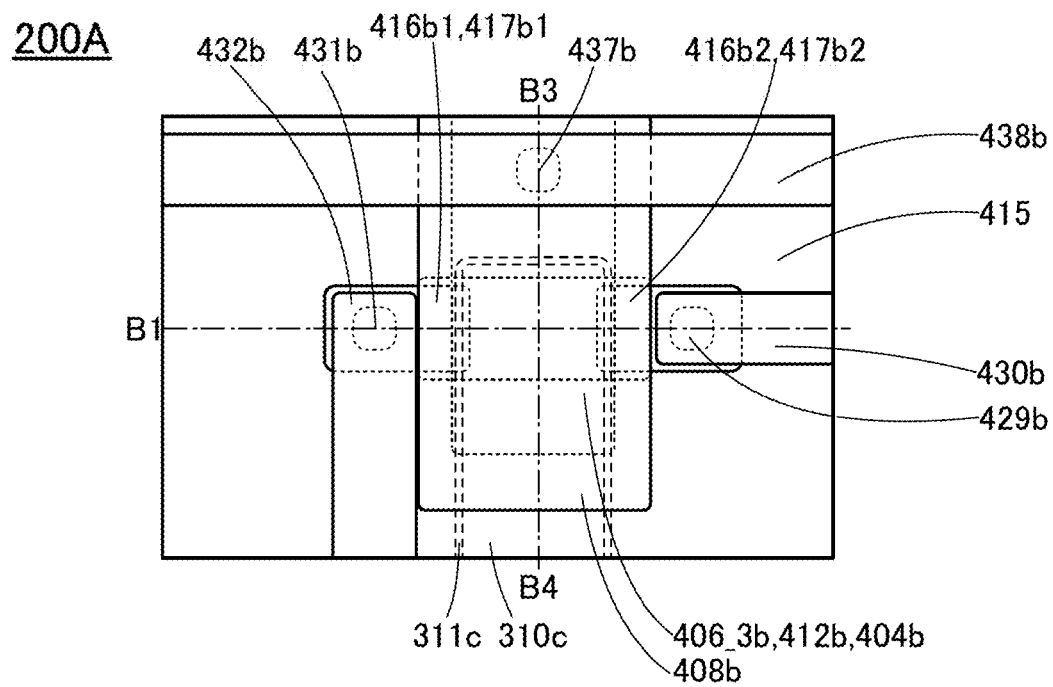
FIGS. 4A to 4C illustrate a cross-sectional structure of a semiconductor device of one embodiment of the present invention.
Figure 4B:
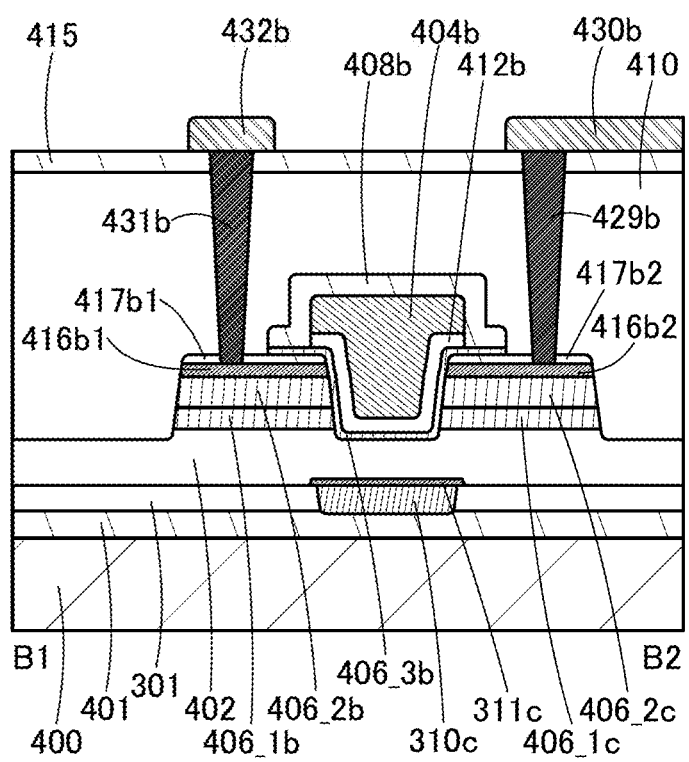
Figure 4C:
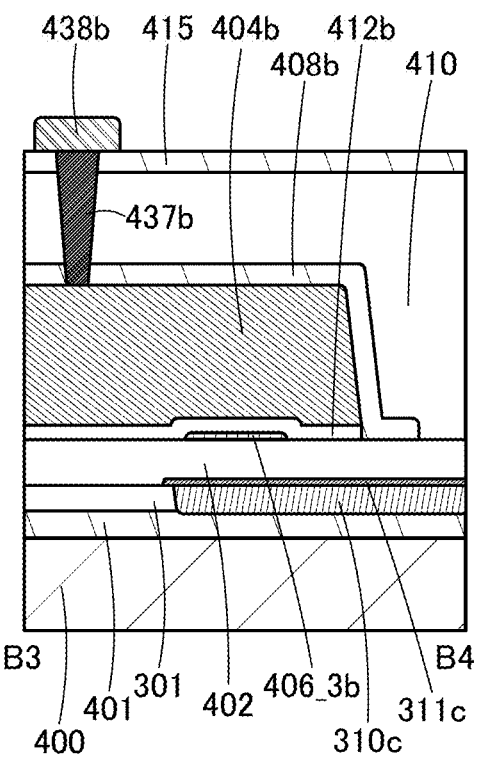

FIGS. 4A to 4C are a top view and cross-sectional views illustrating the transistor 200A of one embodiment of the present invention. FIG. 4A is the top view. FIG. 4B is a cross-sectional view taken along dashed-dotted line A1-A2 illustrated in FIG. 4A. FIG. 4C is a cross-sectional view taken along dashed-dotted line A3-A4 illustrated in FIG. 4A. Note that for simplification of the drawing, some components are not illustrated in the top view in FIG. 4A.

The transistor 200A illustrated in FIGS. 4A to 4C is different from the transistor 200 illustrated in FIGS. 2A to 2C in the shape of the oxide 406_3b. In the transistor 200, an edge portion of the insulator 408b is aligned with an edge portion of the oxide 406_3b, whereas in the transistor 200A, the edge portion of the oxide 406_3b is provided on an inner side than the edge portion of insulator 408b in FIG. 4C, although the edge portion of the insulator 408b is aligned with the edge portion of the oxide 406_3b in FIG. 4B. The above difference is caused by a difference in formation steps of the oxide 406_3b and the insulator 408b in the manufacturing process of the transistor, and the manufacture process of the transistor 200A is advantageous in that the oxide 406_3b can be shaped freely. The formation process of the transistor will be described later. For the other components, refer to the structure of the transistor 200.

<Transistor Structure 3>

Here, a transistor 100B and a transistor 200B whose structures are different from those of FIGS. 1A to 1C and FIGS. 2A to 2C are described. FIGS. 5A to 5C are a top view and cross-sectional views illustrating the transistor 100B of one embodiment of the present invention. FIG. 5A is the top view. FIG. 5B is a cross-sectional view taken along dashed-dotted line A1-A2 illustrated in FIG. 5A. FIG. 5C is a cross-sectional view taken along dashed-dotted line A3-A4 illustrated in FIG. 5A. Note that for simplification of the drawing, some components are not illustrated in the top view in FIG. 5A.

The transistor 100B illustrated in FIGS. 5A to 5C is different from the transistor 100 illustrated in FIGS. 1A to 1C in that the oxide 406_3a, the insulator 412a, and the insulator 408a cover edge portions of the oxides 406_1a and 406_2a. For the other components, refer to the structure of the transistor 100.

Figure 6A:
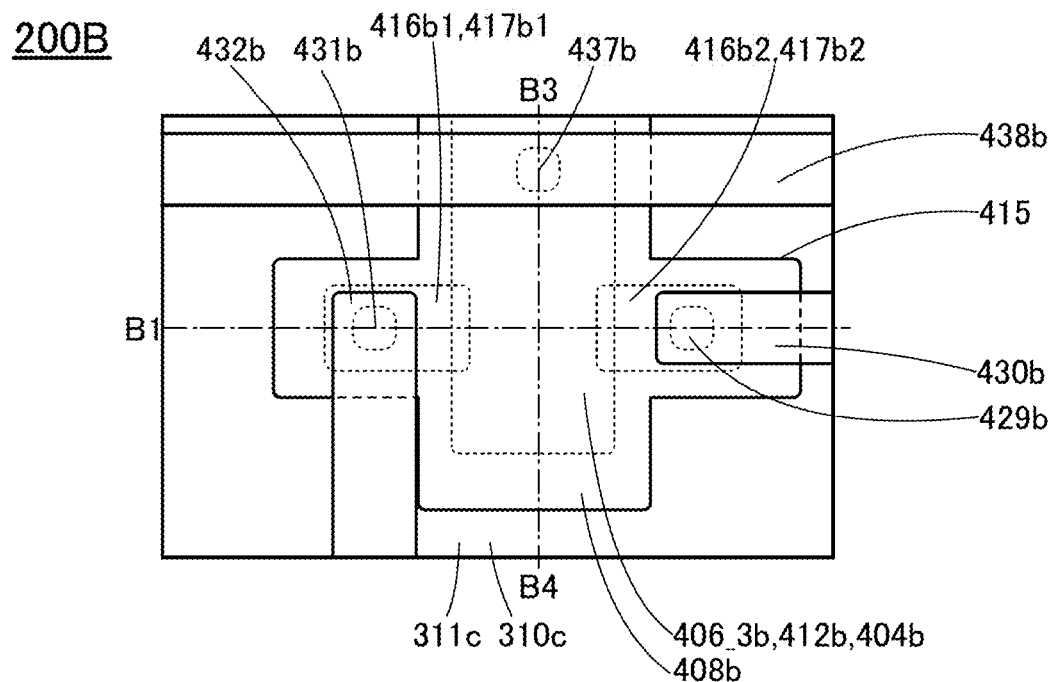
FIGS. 6A to 6C illustrate a cross-sectional structure of a semiconductor device of one embodiment of the present invention.
Figure 6B:
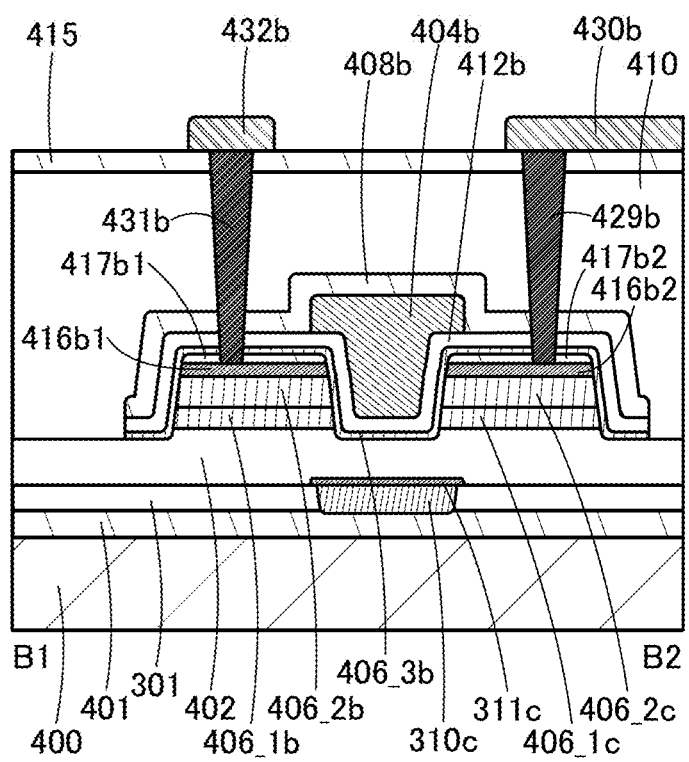
Figure 6C:
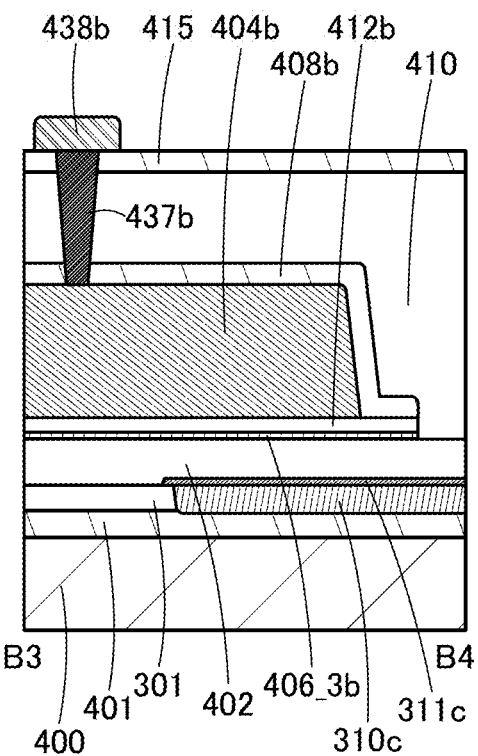

FIGS. 6A to 6C are a top view and cross-sectional views illustrating the transistor 200B of one embodiment of the present invention. FIG. 6A is the top view. FIG. 6B is a cross-sectional view taken along dashed-dotted line A1-A2 illustrated in FIG. 6A. FIG. 6C is a cross-sectional view taken along dashed-dotted line A3-A4 illustrated in FIG. 6A. Note that for simplification of the drawing, some components are not illustrated in the top view in FIG. 6A.

The transistor 200B illustrated in FIGS. 6A to 6C is different from the transistor 200 illustrated in FIGS. 2A to 2C in that the oxide 406_3b, the insulator 412b, and the insulator 408b are provided so as to cover edge portions of the oxides 406_1b, 406_2b, 406_1c, and 406_2c. For the other components, refer to the structure the transistor 200.

<Transistor Structure 4>

Here, a transistor 100C and a transistor 200C whose structures are different from those of FIGS. 1A to 1C and FIGS. 2A to 2C are described.

FIGS. 7A to 7C are a top view and cross-sectional views illustrating the transistor 100C of one embodiment of the present invention. FIG. 7A is the top view. FIG. 7B is a cross-sectional view taken along dashed-dotted line A1-A2 illustrated in FIG. 7A. FIG. 7C is a cross-sectional view taken along dashed-dotted line A3-A4 illustrated in FIG. 7A. Note that for simplification of the drawing, some components are not illustrated in the top view in FIG. 7A.

The structure of the transistor 100C illustrated in FIGS. 7A to 7C is different from that of the transistor 100 illustrated in FIGS. 1A to 1C in that an insulator 409a is provided.

An insulator with a function of blocking oxygen and impurities such as hydrogen may be used as the insulator 409a in a manner similar to that of the insulator 408a.

The insulator 409a includes a region in contact with the insulator 408a and part of the top surface of the insulator 402. In addition, the insulator 409a includes a region in contact with the side surfaces of the oxides 406_1a and 406_2a and is provided so as to cover the source and drain electrodes, the barrier films, and the gate electrode of the transistor 100C. In such a structure, impurities such as hydrogen can be prevented from entering the oxide 406_2a including the channel formation region and the like from the outside of the insulator 409a, resulting in improvement in the electrical characteristics and the reliability of the transistor 100C. For the other components, refer to the structure of the transistor 100.

Figure 8A:
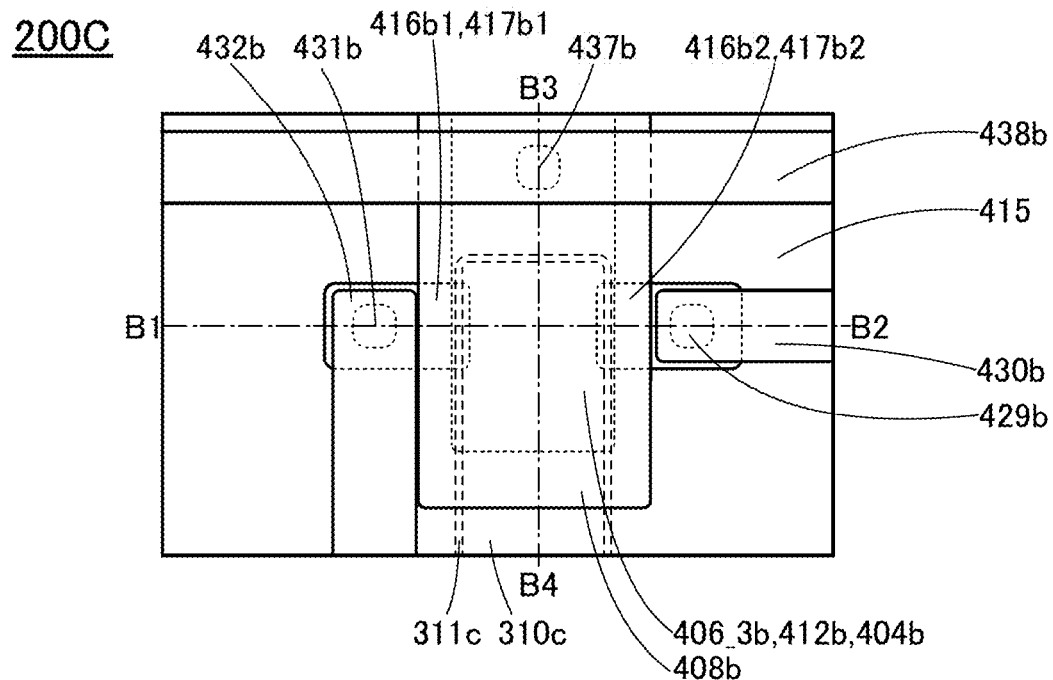
FIGS. 8A to 8C illustrate a cross-sectional structure of a semiconductor device of one embodiment of the present invention.
Figure 8B:
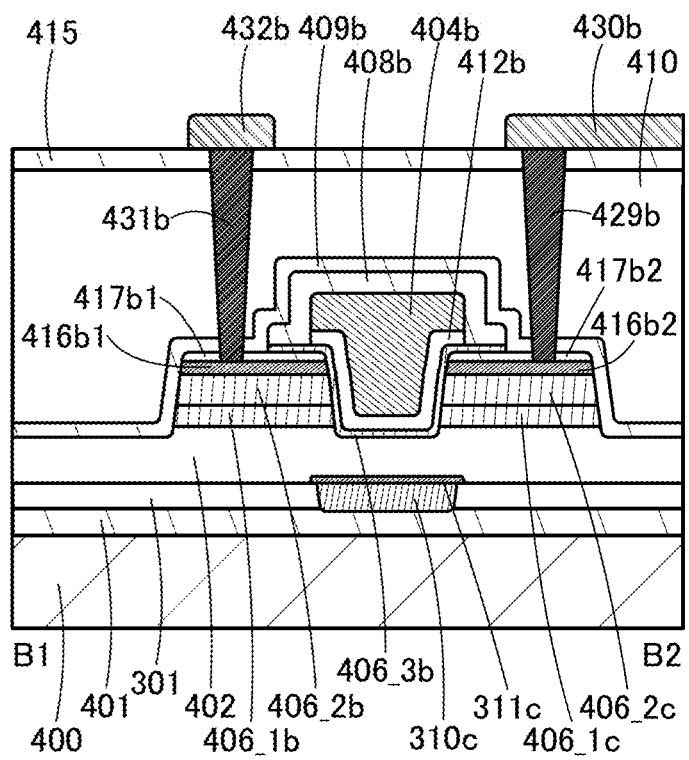
Figure 8C:
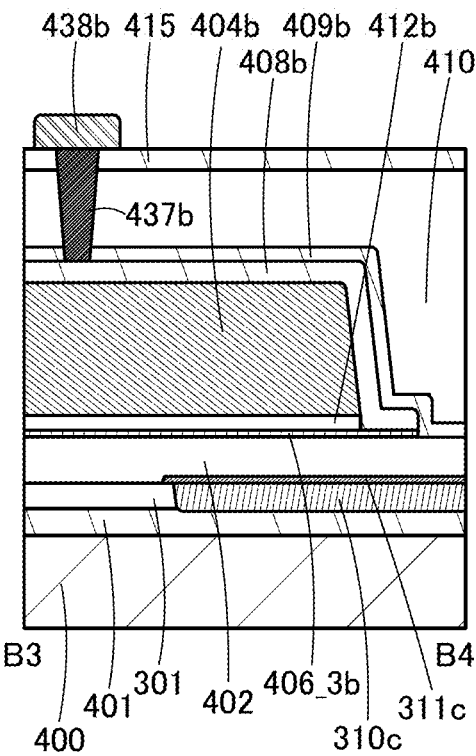

FIGS. 8A to 8C are a top view and cross-sectional views illustrating the transistor 200C of one embodiment of the present invention. FIG. 8A is the top view. FIG. 8B is a cross-sectional view taken along dashed-dotted line A1-A2 illustrated in FIG. 8A. FIG. 8C is a cross-sectional view taken along dashed-dotted line A3-A4 illustrated in FIG. 8A. Note that for simplification of the drawing, some components are not illustrated in the top view in FIG. 8A.

The structure of the transistor 200C illustrated in FIGS. 8A to 8C is different from that of the transistor 100 illustrated in FIGS. 2A to 2C in that an insulator 409b is provided.

An insulator with a function of blocking oxygen and impurities such as hydrogen may be used as the insulator 409b in a manner similar to that of the insulator 408b.

The insulator 409b includes a region in contact with the insulator 408b and part of the top surface of the insulator 402. Furthermore, the insulator 409b includes a region in contact with the side surfaces of the oxides 406_1b and 406_2b and a region in contact with the oxides 406_1c and 406_2c. In addition, the insulator 409b is provided to cover the source and drain electrodes, the barrier films, and the gate electrode of the transistor 200C. In such a structure, impurities such as hydrogen can be prevented from entering the oxide 406_3b including the channel formation region and the like from the outside of the insulator 409b, resulting in improvement in the electrical characteristics and the reliability of the transistor 200C. For the other components, refer to the structure of the transistor 200.

<Transistor Structure 5>

Here, a transistor 200D whose structure is different from that of FIGS. 2A to 2C is described.

Figure 9A:
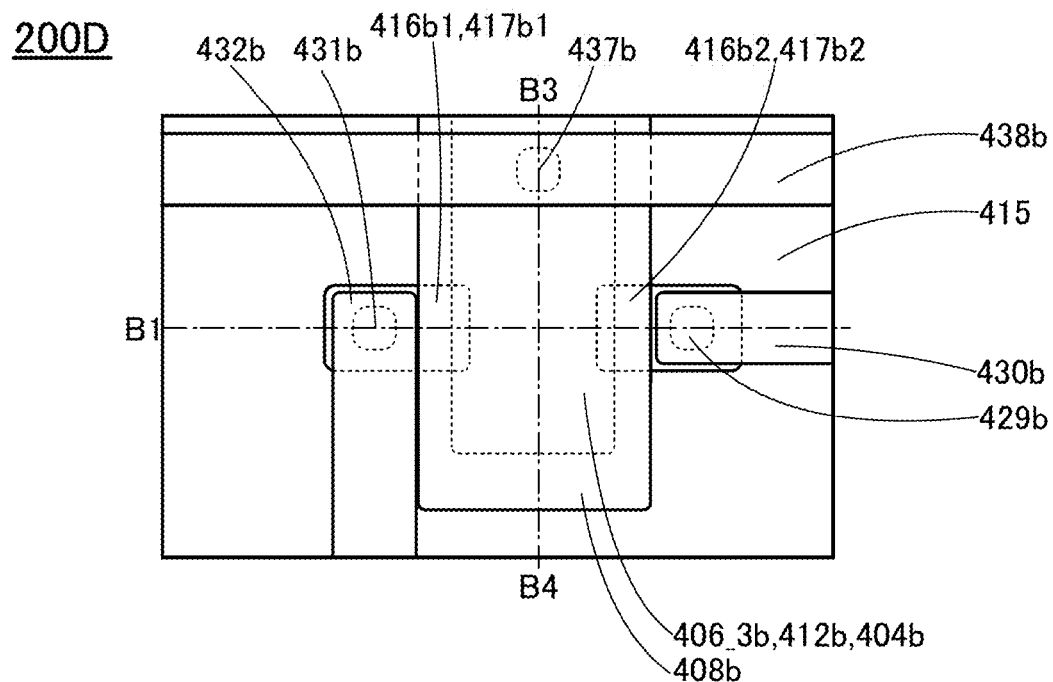
FIGS. 9A to 9C illustrate a cross-sectional structure of a semiconductor device of one embodiment of the present invention.
Figure 9B:
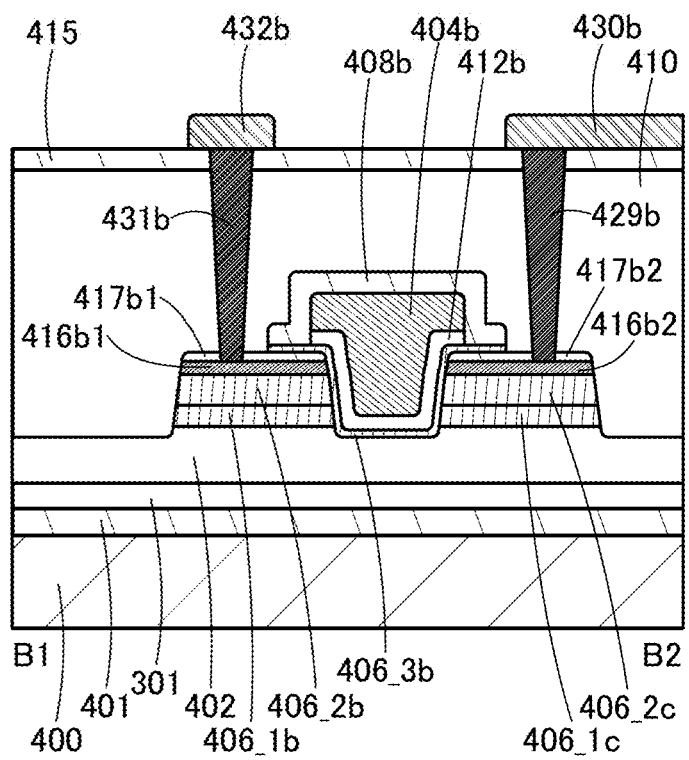
Figure 9C:
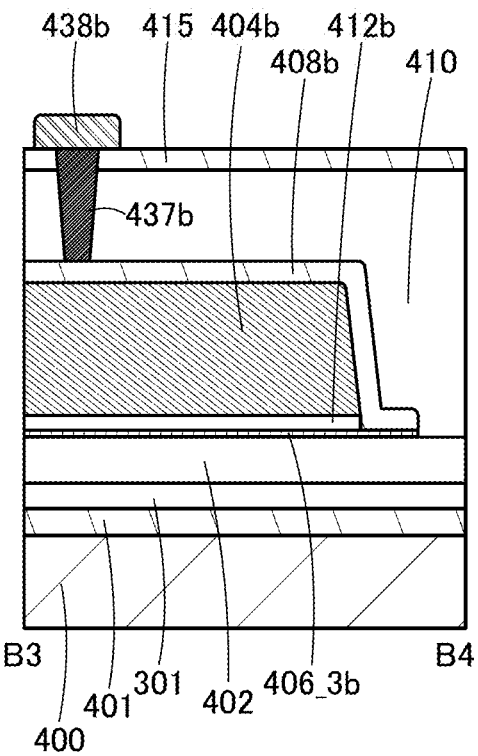

FIGS. 9A to 9C are a top view and cross-sectional views illustrating the transistor 200D of one embodiment of the present invention. FIG. 9A is the top view. FIG. 9B is a cross-sectional view taken along dashed-dotted line A1-A2 illustrated in FIG. 9A. FIG. 9C is a cross-sectional view taken along dashed-dotted line A3-A4 illustrated in FIG. 9A. Note that for simplification of the drawing, some components are not illustrated in the top view in FIG. 9A.

The transistor 200D illustrated in FIGS. 9A to 9C is different from the transistor 200 illustrated in FIGS. 2A to 2C in that a conductor functioning as a second gate electrode is not provided. For the other components, refer to the structure of the transistor 200.

Embodiment 2

In this embodiment, an oxide semiconductor included in the transistor described in the above embodiment will be described below with reference to FIGS. 11A to 11E, FIGS. 12A to 12E, FIGS. 13A to 13D, FIGS. 14A and 14B, and FIG. 15.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 11A:
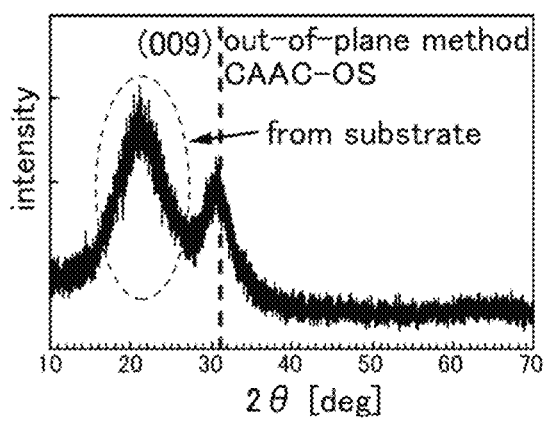
FIGS. 11A to 11E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal, which is classified into the space group R-3m, is analyzed by an out-of-plane method, a peak appears at a diffraction angle (2θ) of around 310 as shown in FIG. 11A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 310. The peak at a 2θ of around 36° is derived from a crystal structure classified into the space group Fd-3m. Therefore, it is preferred that the CAAC-OS do not show the peak at a 2θ of around 36°.

Figure 11B:
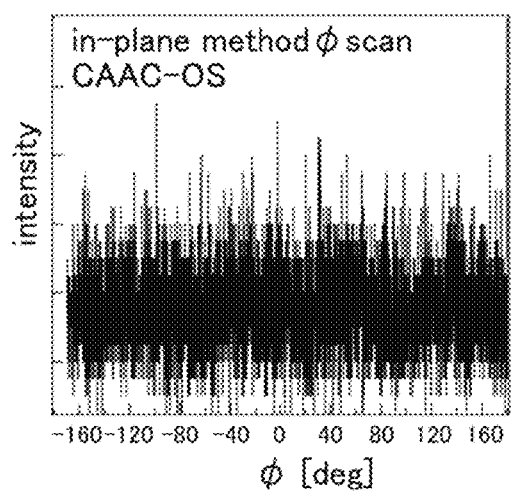
Figure 11C:
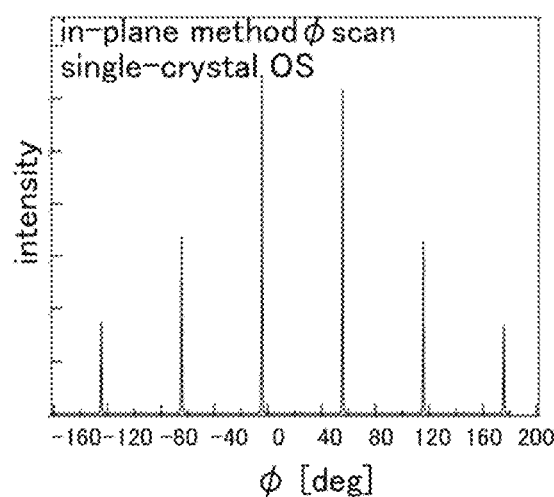
Figure 11D:
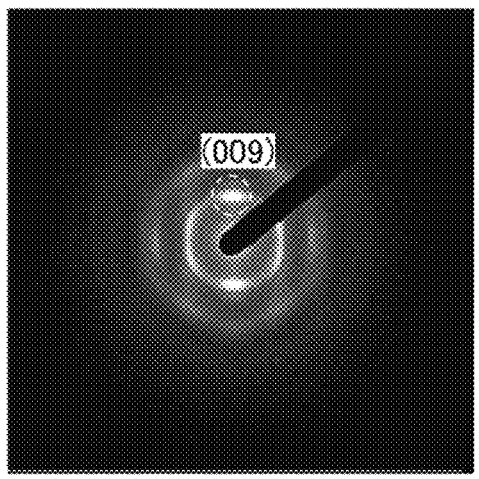

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° while the sample is rotated around a normal vector to the sample surface as an axis (0 axis), as shown in FIG. 11B, a peak is not clearly observed. In contrast, in the case where single crystal $InGaZnO_4$ is subjected to φ scan with 2θ fixed at around 56°, as shown in FIG. 11C, six peaks which are derived from crystal planes equivalent to the (110) plane are observed. Accordingly, the structural analysis using XRD shows that the directions of a-axes and b-axes are irregularly oriented in the CAAC-OS.

Figure 11E:
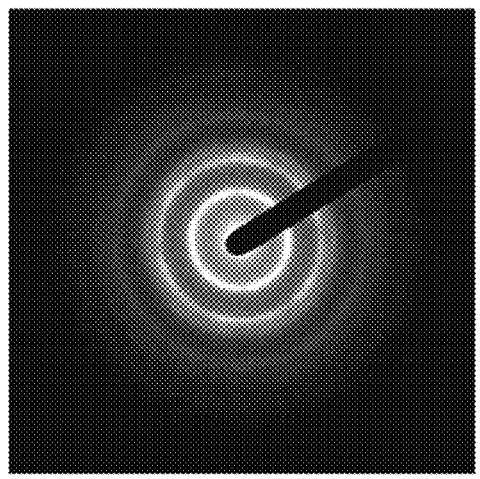

Next, a CAAC-OS analyzed by electron diffraction will be described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 11D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 11E shows a diffraction pattern obtained in such a manner that an electron beam with a probe diameter of 300 nm is incident on the same sample in a direction perpendicular to the sample surface. As shown in FIG. 11E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 11E is considered to be derived from the (010) plane, the (100) plane, and the like of the $InGaZnO_4$ crystal. The second ring in FIG. 11E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 12A:
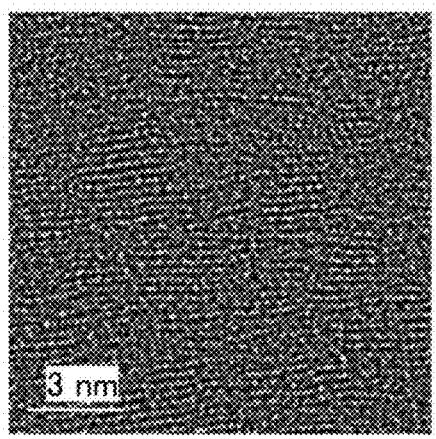
FIGS. 12A to 12E show a cross-sectional TEM image and plan-view TEM images of a CAAC-OS and images obtained through analysis thereof.

FIG. 12A shows an example of a high-resolution TEM image of a cross section of the CAAC-OS which is obtained from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 12A shows pellets in which metal atoms are arranged in a layered manner. FIG. 12A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 12B:
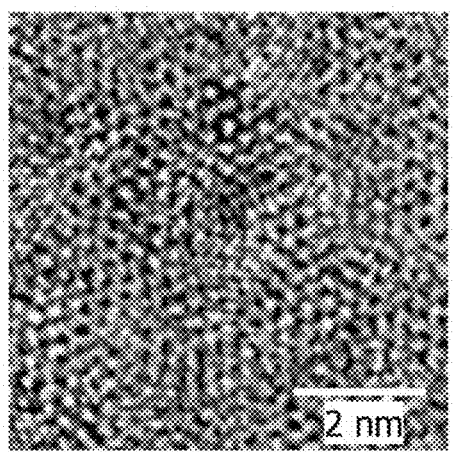
Figure 12C:
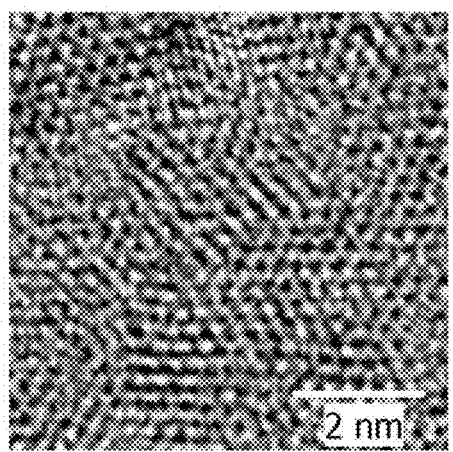
Figure 12D:
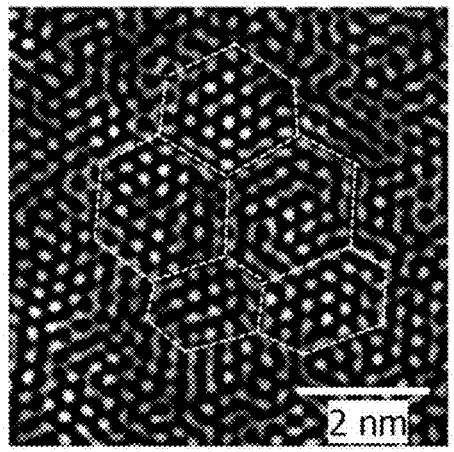
Figure 12E:
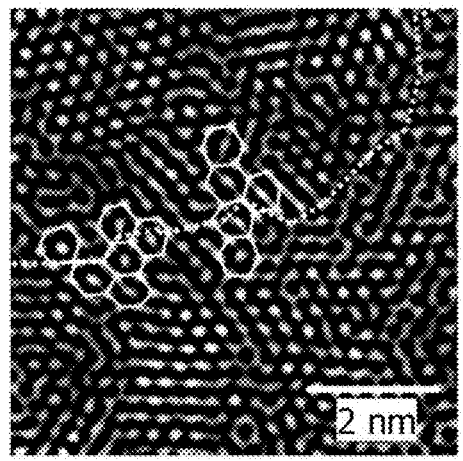

FIGS. 12B and 12C show Cs-corrected high-resolution TEM images of a plane of the CAAC-OS observed in the direction substantially perpendicular to the sample surface. FIGS. 12D and 12E are images obtained by image processing of FIGS. 12B and 12C. The method of image processing is as follows. The image in FIG. 12B is subjected to fast Fourier transform (FFT) to obtain an FFT image. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 12D, a portion in which the lattice arrangement is broken is shown by dashed lines. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 12E, a dotted line denotes a portion where the direction of a lattice arrangement changes between a region with a uniform lattice arrangement and another region with a uniform lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of arrangement of oxygen atoms in the a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 13A:
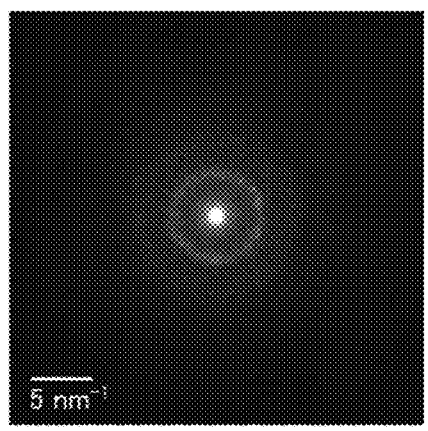
FIGS. 13A to 13D show electron diffraction patterns and a cross-sectional TEM image of an nc-OS.
Figure 13B:
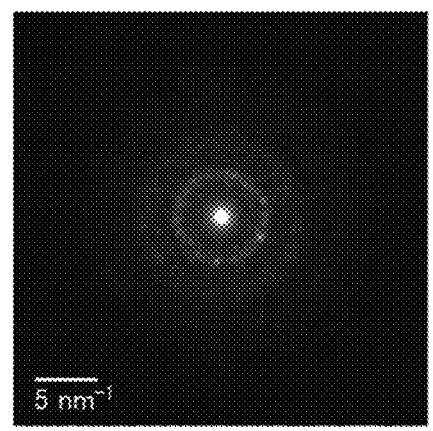

For example, when an electron beam with a probe diameter of 50 nm is incident on a 34-nm-thick region of a thinned nc-OS including an $InGaZnO_4$ crystal in a direction parallel to the formation surface, a ring-like diffraction pattern (nanobeam electron diffraction pattern) shown in FIG. 13A is observed. FIG. 13B shows a diffraction pattern obtained when an electron beam with a probe diameter of 1 nm is incident on the same sample. As shown in FIG. 13B, a plurality of spots are observed in a ring-like region. In other words, ordering in an nc-OS is not observed with an electron beam with a probe diameter of 50 nm but is observed with an electron beam with a probe diameter of 1 nm.

Figure 13C:
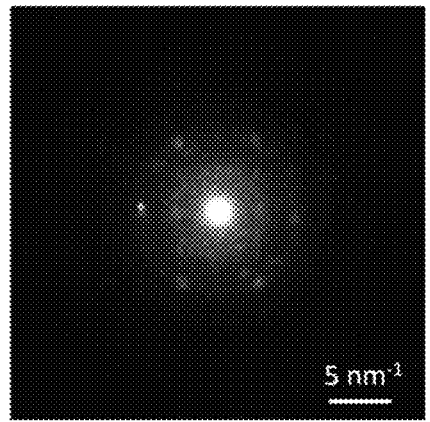

When an electron beam with a probe diameter of 1 nm is incident on a region with a thickness less than 10 nm, an electron diffraction pattern in which spots are arranged in an approximately regular hexagonal shape as shown in FIG. 13C is observed in some cases. This means that an nc-OS has a well-ordered region, i.e., a crystal, in the range of less than 10 nm in thickness. Note that an electron diffraction pattern having regularity is not observed in some regions because crystals are aligned in various directions.

Figure 13D:
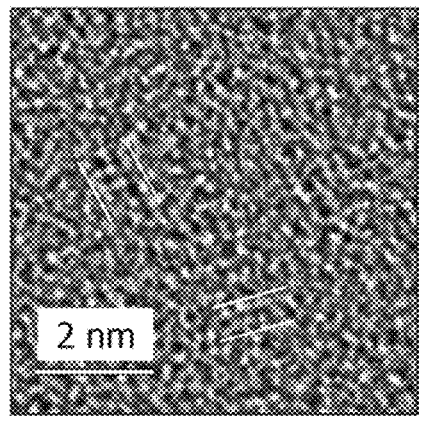

FIG. 13D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 13D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a crystal grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 14A:
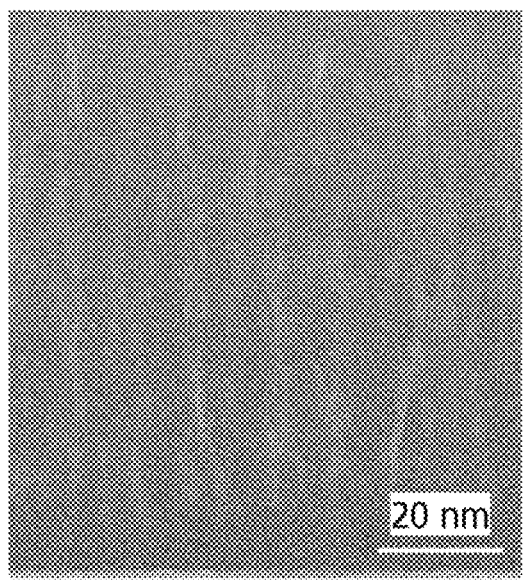
FIGS. 14A and 14B are cross-sectional TEM images of an a-like OS.
Figure 14B:
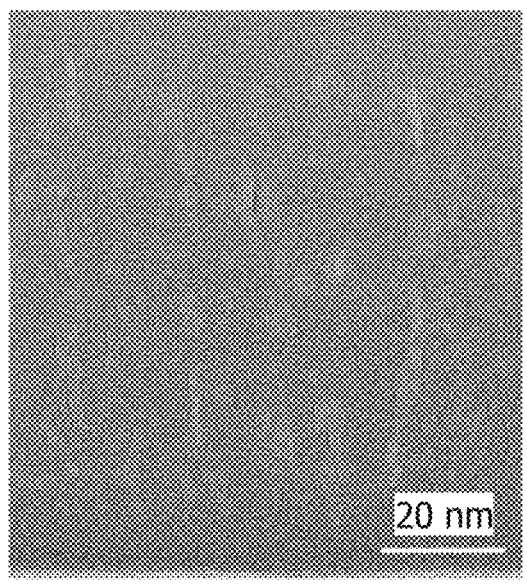

FIGS. 14A and 14B are high-resolution cross-sectional TEM images of an a-like OS. FIG. 14A is the high-resolution cross-sectional TEM image of the a-like OS at the start of the electron irradiation. FIG. 14B is the high-resolution cross-sectional TEM image of a-like OS after the electron ($e^-$) irradiation at $4.3 \times 10^8$ $e^-/nm^2$. FIGS. 14A and 14B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it includes a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 15:
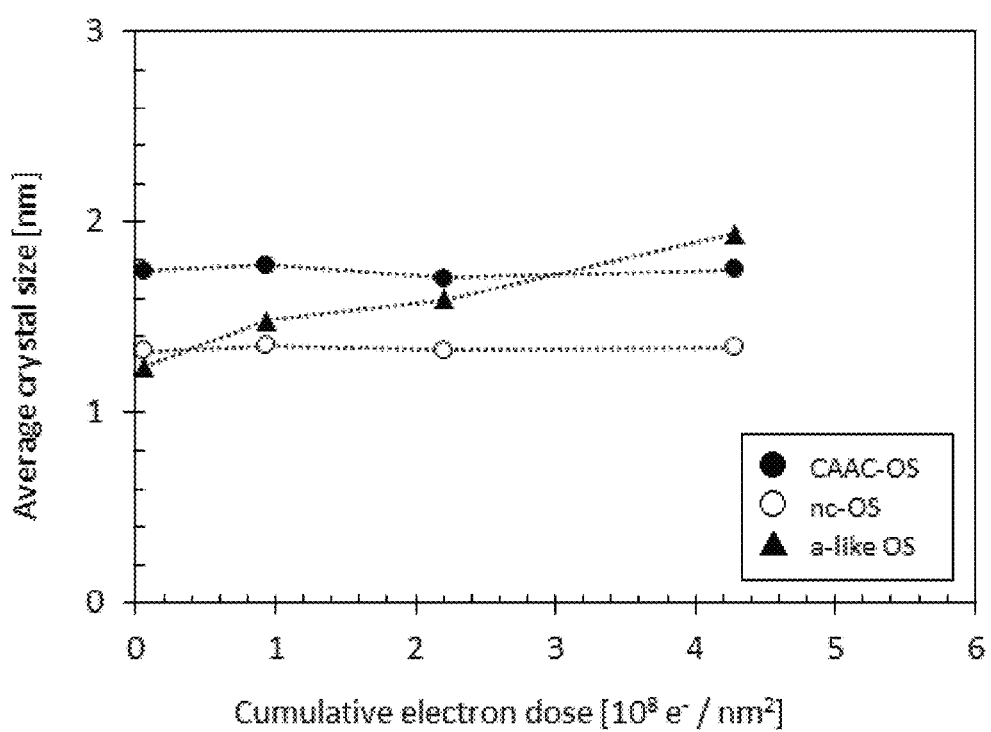
FIG. 15 shows a change of crystal parts of an In—Ga—Zn oxide due to electron irradiation.

FIG. 15 shows changes in the average size of crystal parts (at 22 points to 30 points) in each sample. Note that the crystal part size corresponds to the length of a lattice fringe. FIG. 15 indicates that the crystal part size in the a-like OS increases with an increase in the cumulative electron dose in obtaining TEM images, for example.

As shown in FIG. 15, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 15, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ e$^-$/(nm$^2$·s); and the diameter of the irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (V$_O$) and impurities in the oxide semiconductor.

As the amount of oxygen vacancy in the oxide semiconductor increases, the density of defect states increases when hydrogen is bonded to the oxygen vacancy (this state is also referred to as V$_O$H). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the I$_d$-V$_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has a slightly n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^3$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

The structure described in this embodiment can be used in appropriate combination with the structure described in any of the other embodiments.

Embodiment 3

<Method 1 for Manufacturing Transistors>

Figure 19A:
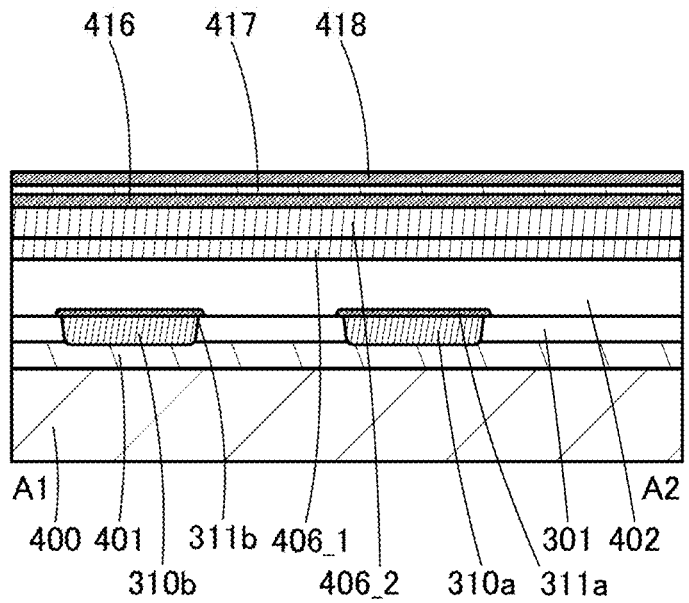
FIGS. 19A to 19D illustrate a method for manufacturing a transistor of one embodiment of the present invention.
Figure 19B:
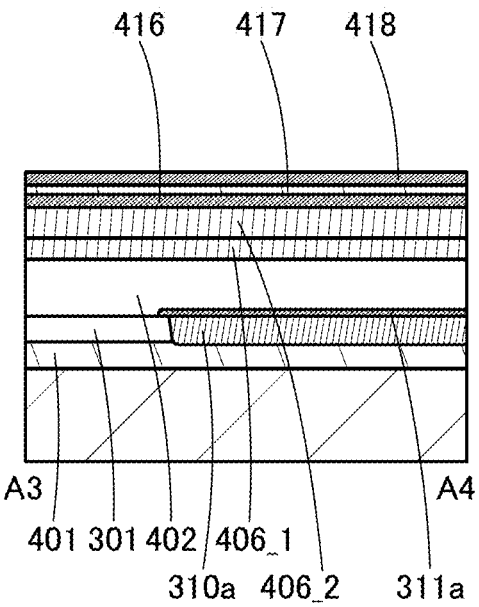
Figure 19C:
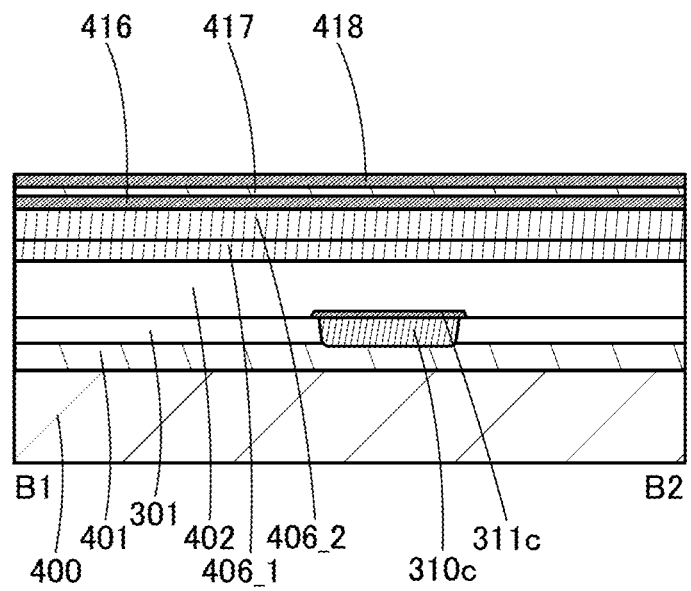
Figure 19D:
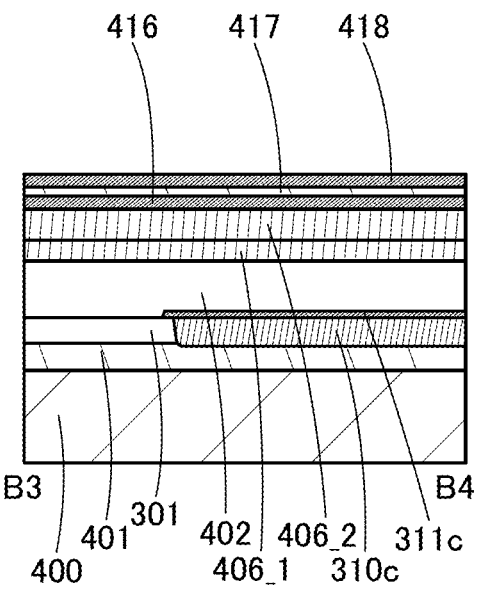
Figure 20A:
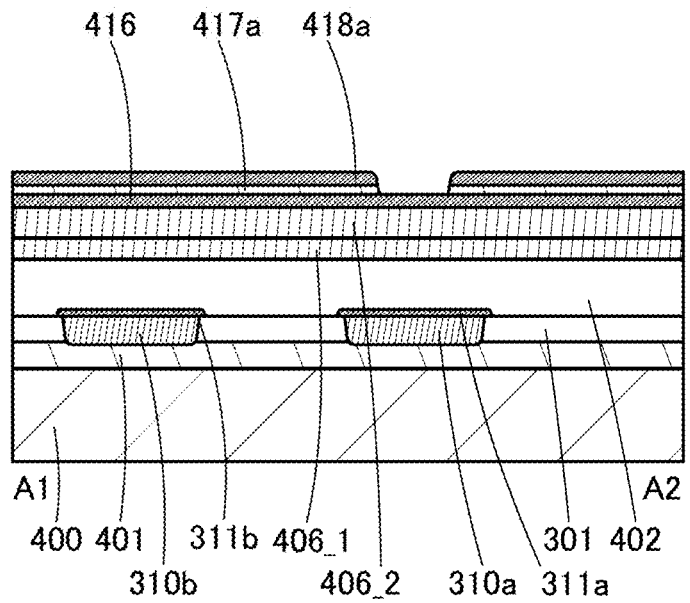
FIGS. 20A to 20D illustrate a method for manufacturing a transistor of one embodiment of the present invention.
Figure 20B:
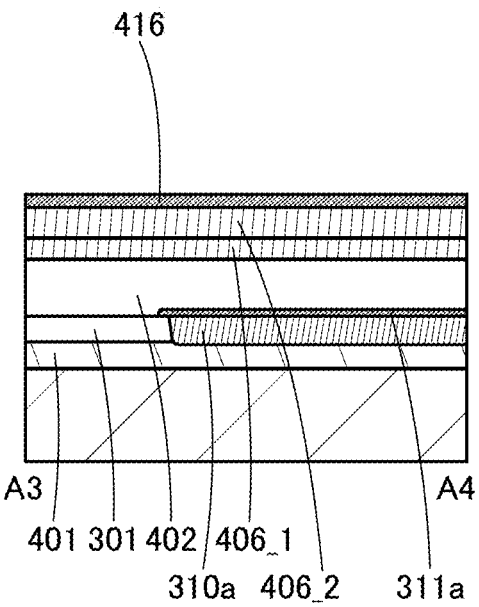
Figure 20C:
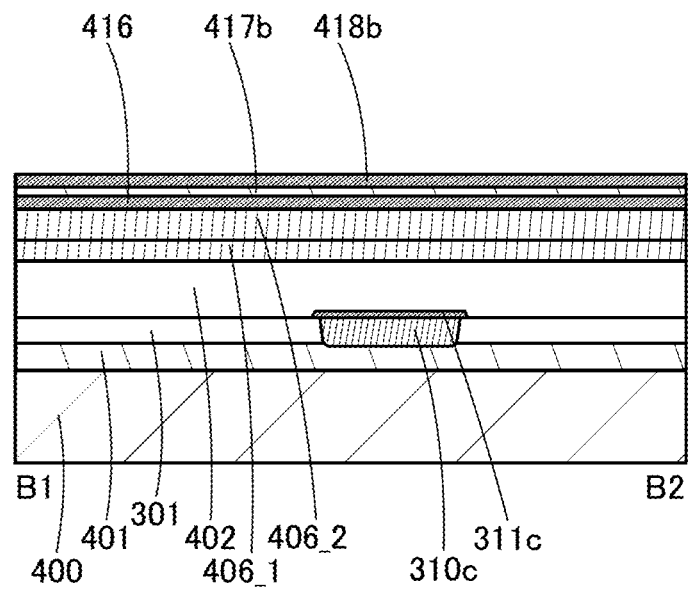
Figure 20D:
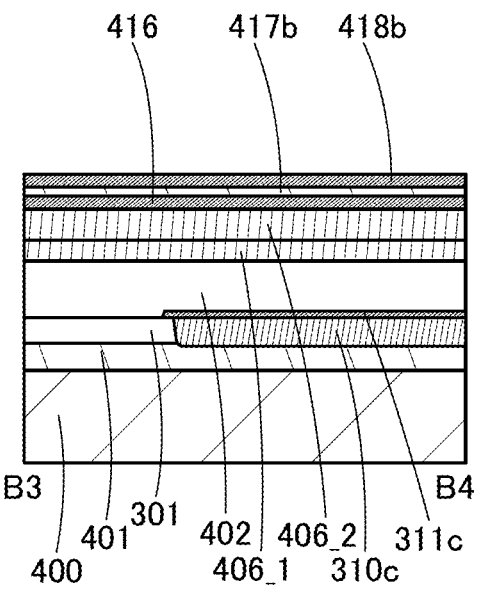
Figure 21A:
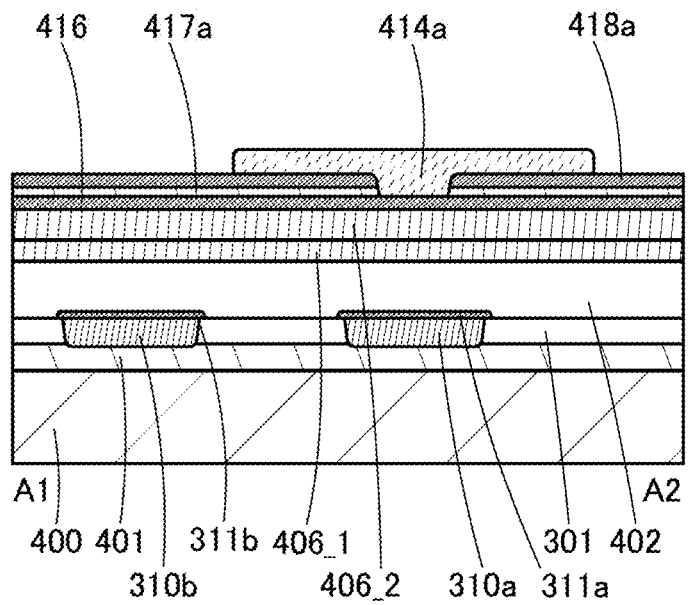
FIGS. 21A to 21D illustrate a method for manufacturing a transistor of one embodiment of the present invention.
Figure 21B:
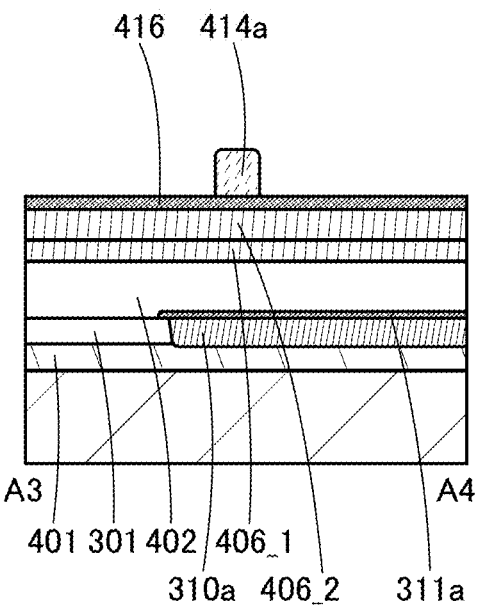
Figure 21C:
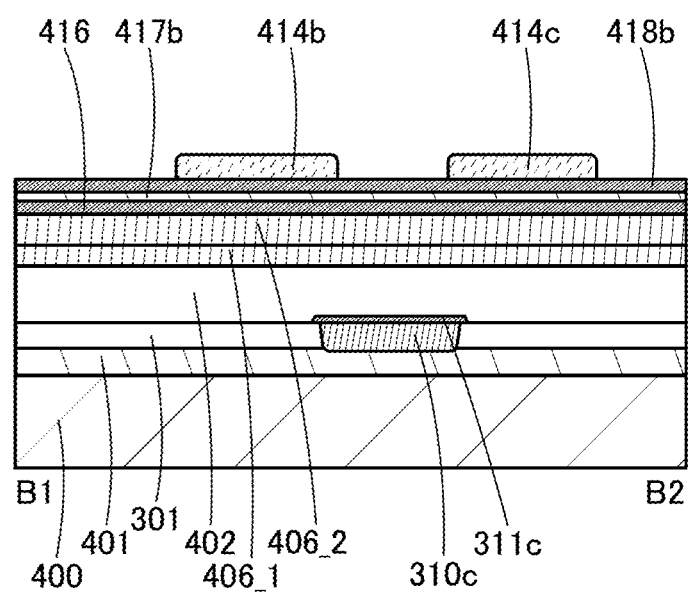
Figure 21D:
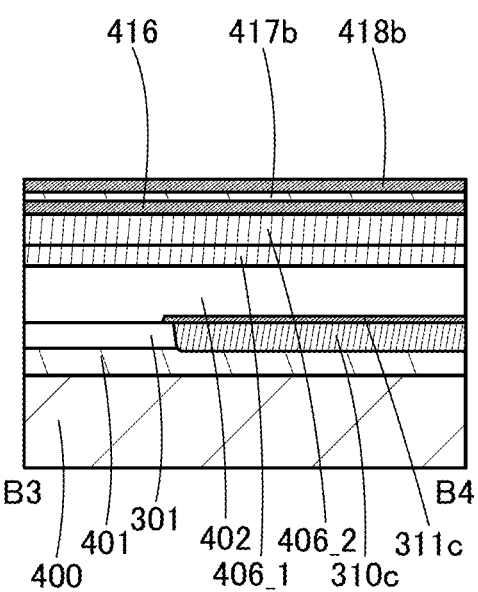

A method for manufacturing the transistor 100 in FIGS. 1A to 1C and the transistor 200 in FIGS. 2A to 2C according to the present invention is described with reference to FIGS. 19A to 19D, FIGS. 20A to 20D, FIGS. 21A to 21D, FIGS. 22A to 22D, FIGS. 23A to 23D, FIGS. 24A to 24D, FIGS. 25A to 25D, FIGS. 26A to 26D, FIGS. 27A to 27D, and FIGS. 28A to 28D. FIG. 19A, FIG. 20A, FIG. 21A, FIG. 22A, FIG. 23A, FIG. 24A, FIG. 25A, FIG. 26A, FIG. 27A, and FIG. 28A are each a cross-sectional view taken along the dashed-dotted line A1-A2 in FIG. 1A. FIG. 19B, FIG. 20B, FIG. 21B, FIG. 22B, FIG. 23B, FIG. 24B, FIG. 25B, FIG. 26B, FIG. 27B, and FIG. 28B are each a cross-sectional view taken along the dashed-dotted line A3-A4 in FIG. 1A. FIG. 19C, FIG. 20C, FIG. 21C, FIG. 22C, FIG. 23C, FIG. 24C, FIG. 25C, FIG. 26C, FIG. 27C, and FIG. 28C are each a cross-sectional view taken along the dashed-dotted line B1-B2 in FIG. 2A. FIG. 19D, FIG. 20D, FIG. 21D, FIG.

22D, FIG. 23D, FIG. 24D, FIG. 25D, FIG. 26D, FIG. 27D, and FIG. 28D are each a cross-sectional view taken along the dashed-dotted line B3-B4 in FIG. 2A.

First, the substrate 400 is prepared.

Next, the insulator 401 is formed. The insulator 401 can be formed by a sputtering method, a chemical vapor deposition (CVD) method, a molecular beam epitaxy (MBE) method, a pulsed laser deposition (PLD) method, an atomic layer deposition (ALD) method, or the like.

The CVD method can include a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of semiconductor devices can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Next, the insulator 301 is formed over the insulator 401. The insulator 301 can be formed by a sputtering method, a CVD method, an MBE method, a PLD method, an ALD method, or the like.

Then, grooves are formed in the insulator 301 so as to reach the insulator 401. Examples of the grooves include holes and openings. In forming the grooves, wet etching may be employed; however, dry etching is preferably employed in terms of microfabrication. The insulator 401 is preferably an insulator that serves as an etching stopper film used in forming the grooves by etching the insulator 301. For example, in the case where a silicon oxide film is used as the insulator 301 in which the grooves are to be formed, the insulator 401 is preferably formed using a silicon nitride film, an aluminum oxide film, or a hafnium oxide film.

After the formation of the grooves, a conductor to be the conductors 310*a*, 310*b*, and 310*c* is formed. The conductor to be the conductors 310*a*, 310*b*, and 310*c* desirably includes a conductor that allows less oxygen to pass therethrough. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductors 310*a*, 310*b*, and 310*c* can be formed by a sputtering method, a CVD method, an MBE method, a PLD method, an ALD method, or the like.

Next, chemical mechanical polishing (CMP) is performed to remove part of the conductor to be the conductors 310*a*, 310*b*, and 310*c* which is located over the insulator 301. Consequently, the conductors 310*a*, 310*b*, and 310*c* remain only in the grooves, whereby a wiring layer with a flat top surface can be formed.

Next, the insulator 402 is formed over the insulator 301 and the conductors 310*a*, 310*b*, and 310*c*. The insulator 402 can be formed by a sputtering method, a CVD method, an MBE method, a PLD method, an ALD method, or the like. Next, treatment for adding oxygen to the insulator 402 may be performed. An ion implantation method, a plasma treatment method, or the like can be used for the treatment for adding oxygen. Note that oxygen added to the insulator 402 serves as excess oxygen.

Next, an oxide 406_1 is formed over the insulator 402. The oxide 406_1 can be formed by a sputtering method, a CVD method, an MBE method, a PLD method, an ALD method, or the like.

Next, treatment for adding oxygen to the oxide 406_1 may be performed. An ion implantation method, a plasma treatment method, or the like can be used for the treatment for adding oxygen. Note that oxygen added to the oxide 406_1 serves as excess oxygen. Next, an oxide 406_2 is formed over the oxide 406_1.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, the crystallinity of the oxide 406_2 can be increased and impurities such as hydrogen and water can be removed from the oxide 406_2. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a power source for applying a radio frequency (RF) to the substrate side may be provided. The use of high-density plasma enables high-density oxygen radicals to be produced, and application of the RF to the substrate side allows oxygen radicals generated by the high-density plasma to be efficiently introduced into the oxide 406_2. Alternatively, after plasma treatment using an inert gas with the apparatus, plasma treatment using oxygen in order to compensate released oxygen may be performed. Note that first heat treatment is not necessarily performed in some cases.

Next, a conductor 416 is formed over the oxide 406_2. The conductor 416 can be formed by a sputtering method, a CVD method, an MBE method, a PLD method, an ALD method, or the like. Then, a barrier film 417 is formed over the conductor 416. The barrier film 417 can be formed by a sputtering method, a CVD method, an MBE method, a PLD method, an ALD method, or the like. Subsequently, a conductor 418 is formed over the barrier film 417. The conductor 418 can be formed by a sputtering method, a CVD method, an MBE method, a PLD method, an ALD method, or the like (see FIGS. 19A to 19D).

Next, the conductor 418 and the barrier film 417 are processed by a lithography method to form a conductor 418a, a conductor 418b, a barrier film 417a, and a barrier film 417b (see FIGS. 20A to 20D).

Then, a resist mask 414a and resist masks 414b and 414c are formed over the conductor 418a and the conductor 418b, respectively, by a lithography method (see FIGS. 21A to 21D).

Subsequently, part of the conductor 416, part of the barrier film 417a, and part of the conductor 418a are etched using the resist mask 414a as an etching mask, whereby a multilayer film including a conductor 416a, the barrier film 417a1, the barrier film 417a2, a conductor 418a1, and a conductor 418a2 is formed (see FIGS. 22A and 22B).

Figures 22A, 22B, 22C, 22D:
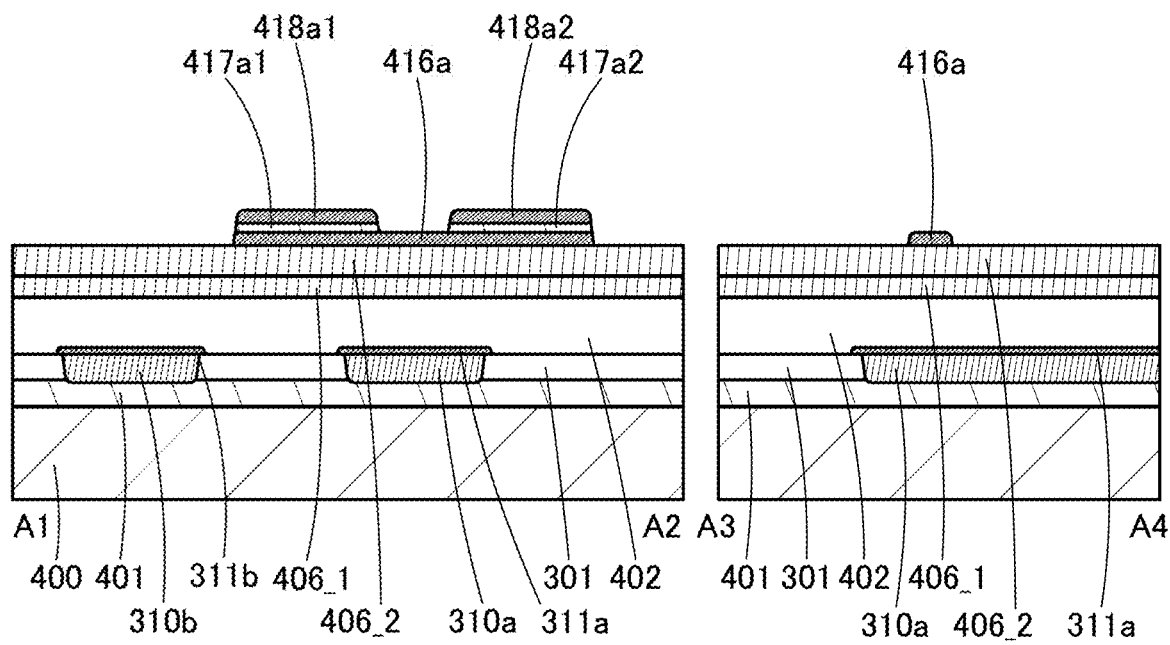
FIGS. 22A to 22D illustrate a method for manufacturing a transistor of one embodiment of the present invention.
Figure 25A:
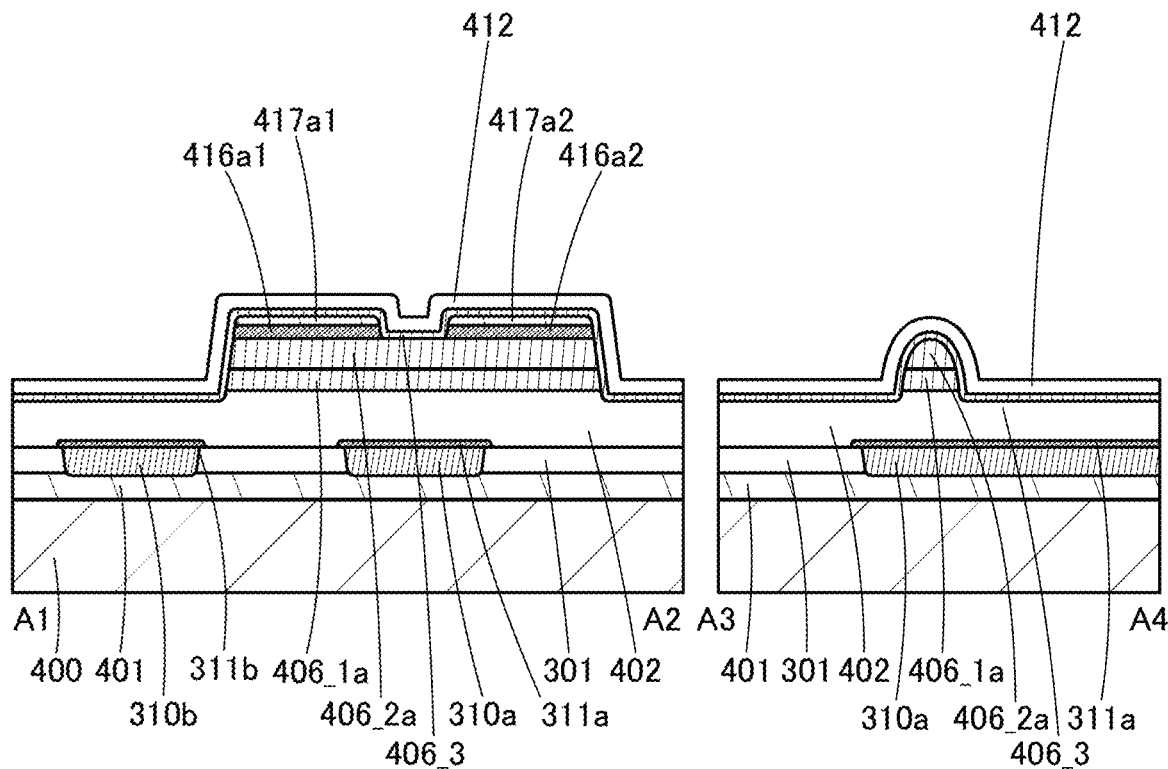
FIGS. 25A to 25D illustrate a method for manufacturing a transistor of one embodiment of the present invention.
Figure 25B:
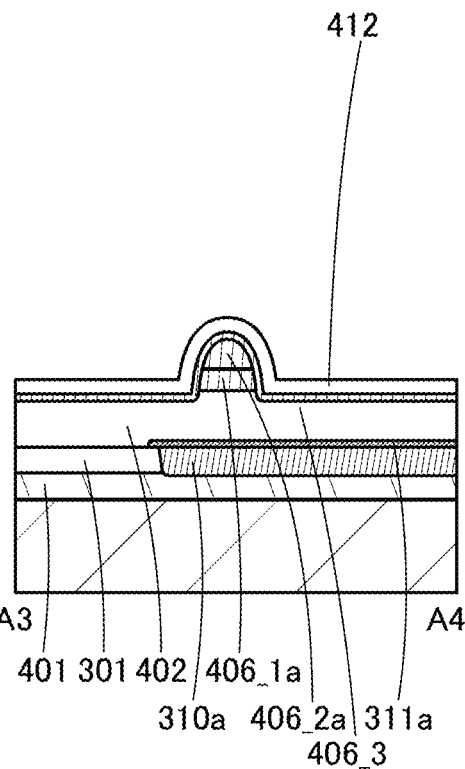
Figure 25C:
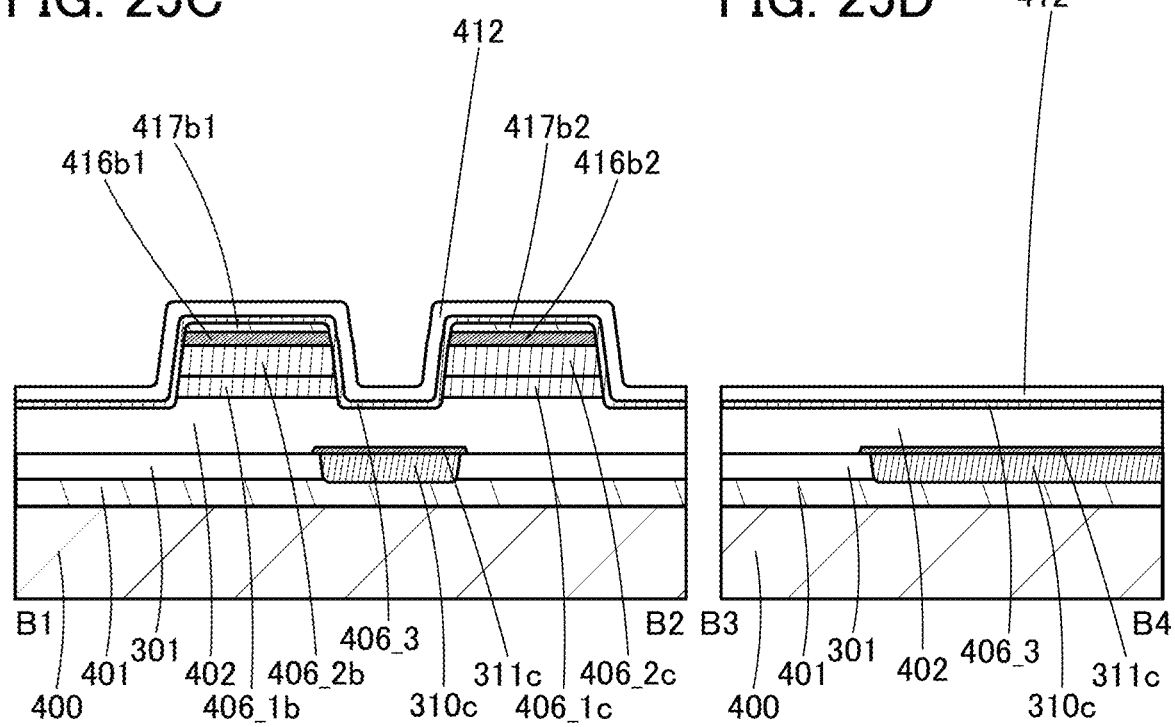
Figure 25D:
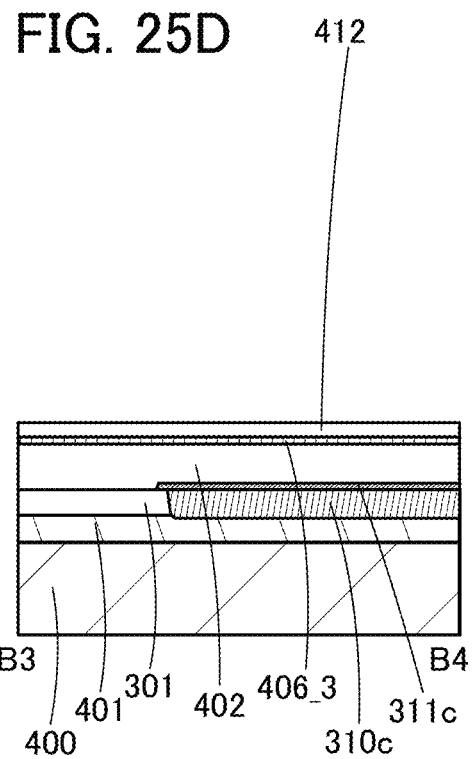
Figure 26A:
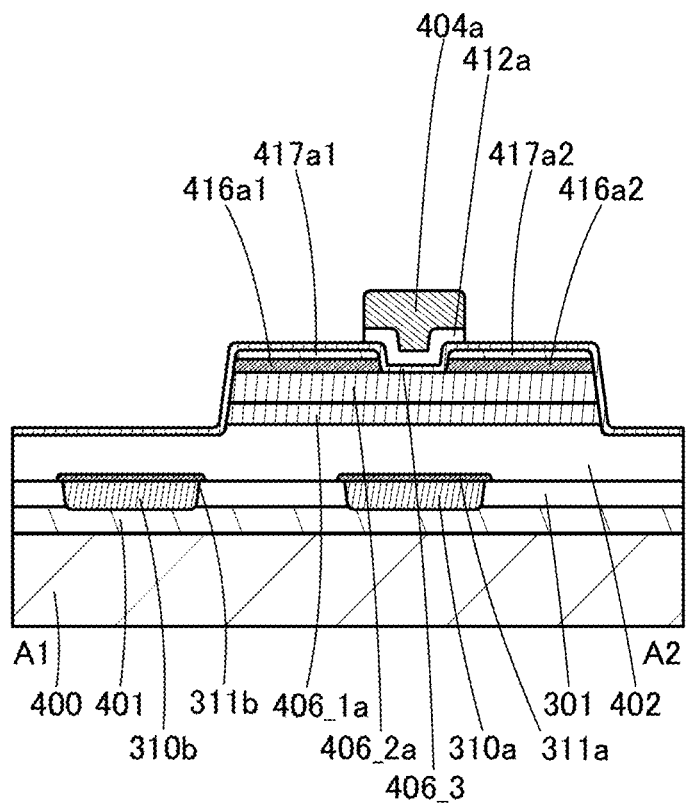
FIGS. 26A to 26D illustrate a method for manufacturing a transistor of one embodiment of the present invention.
Figure 26B:
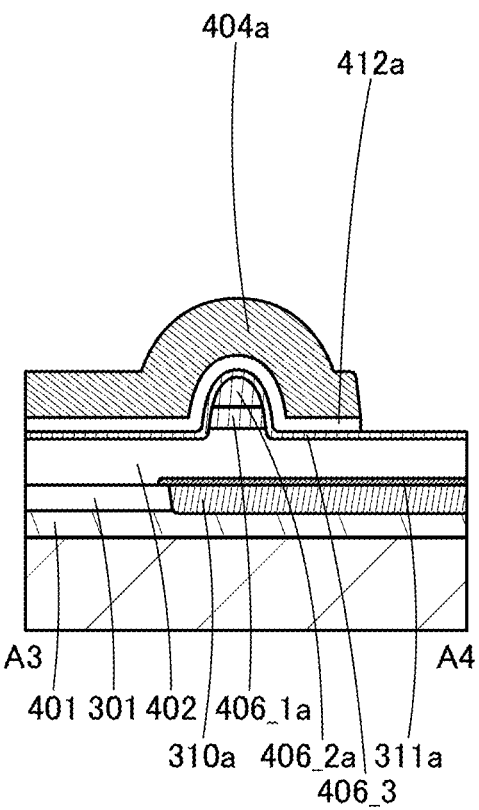
Figure 26C:
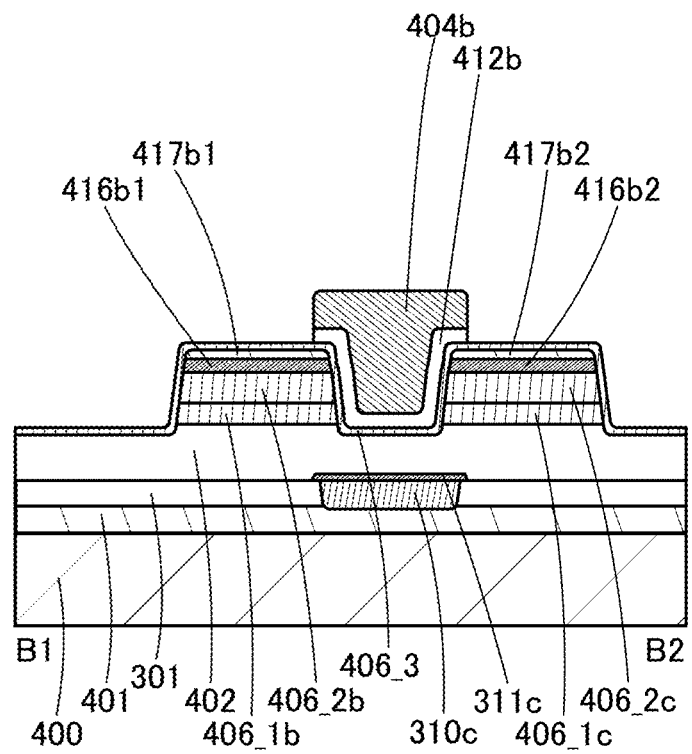
Figure 26D:
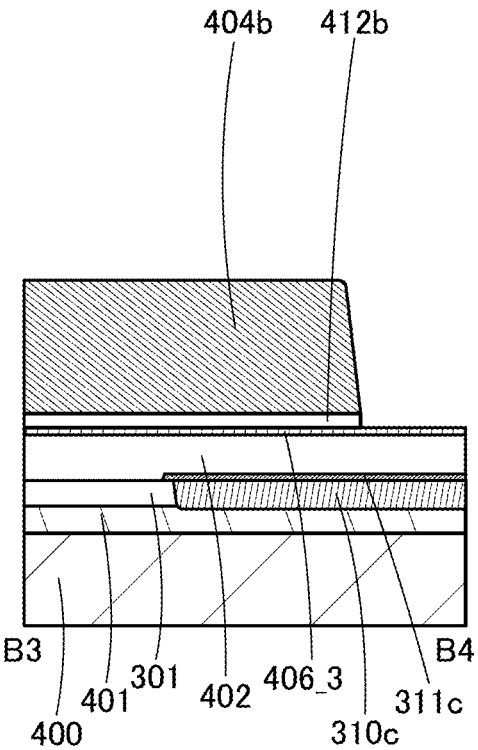
Figure 27A:
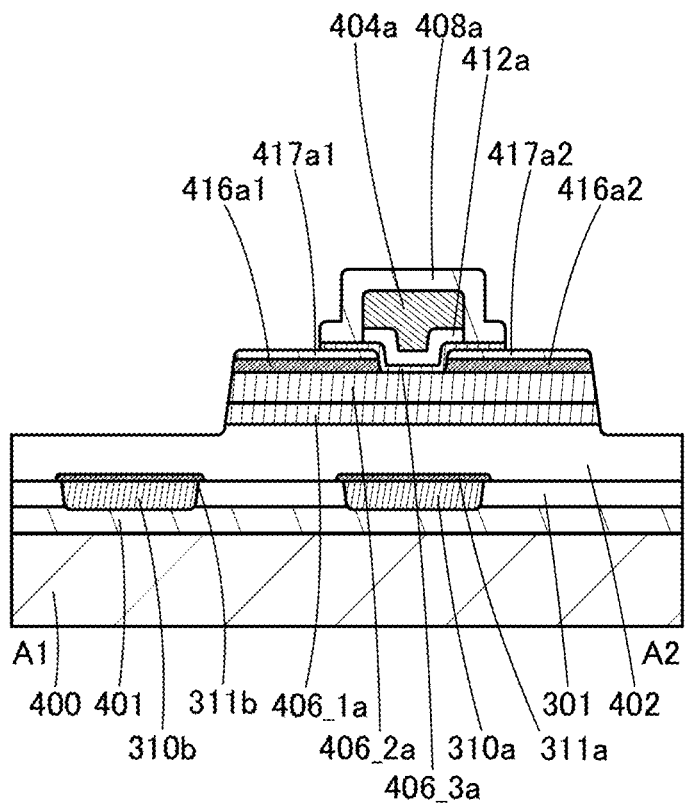
FIGS. 27A to 27D illustrate a method for manufacturing a transistor of one embodiment of the present invention.
Figure 27B:
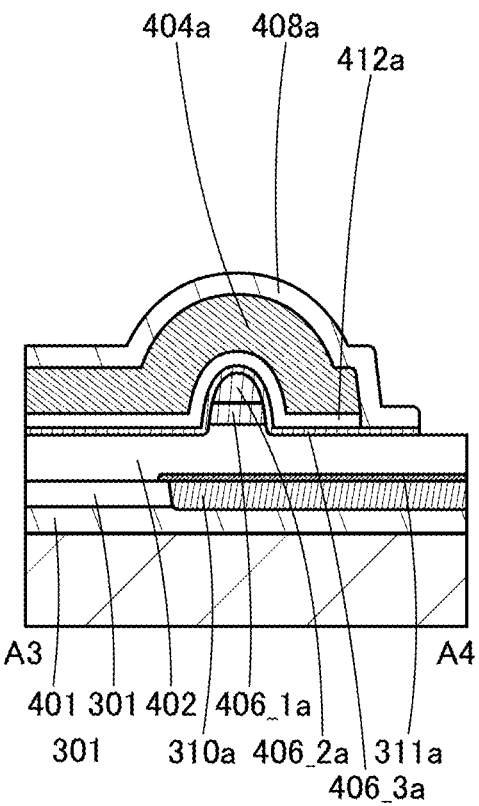
Figure 27C:
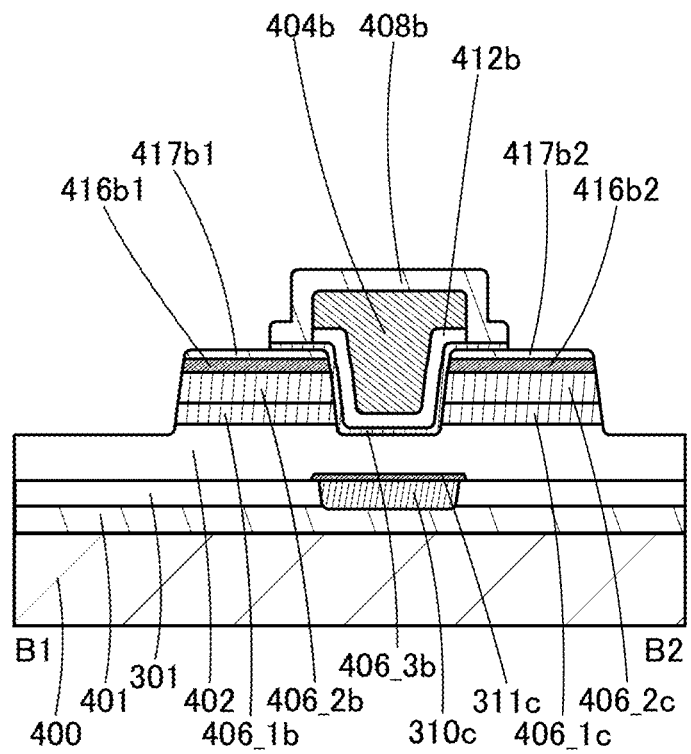
Figure 27D:
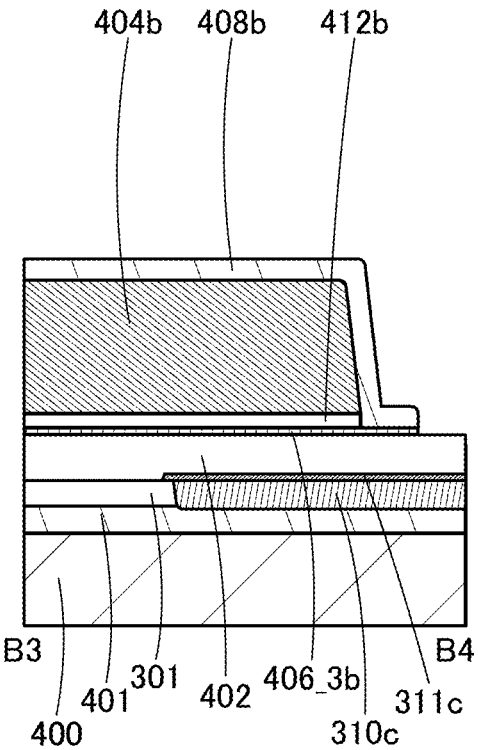
Figure 28A:
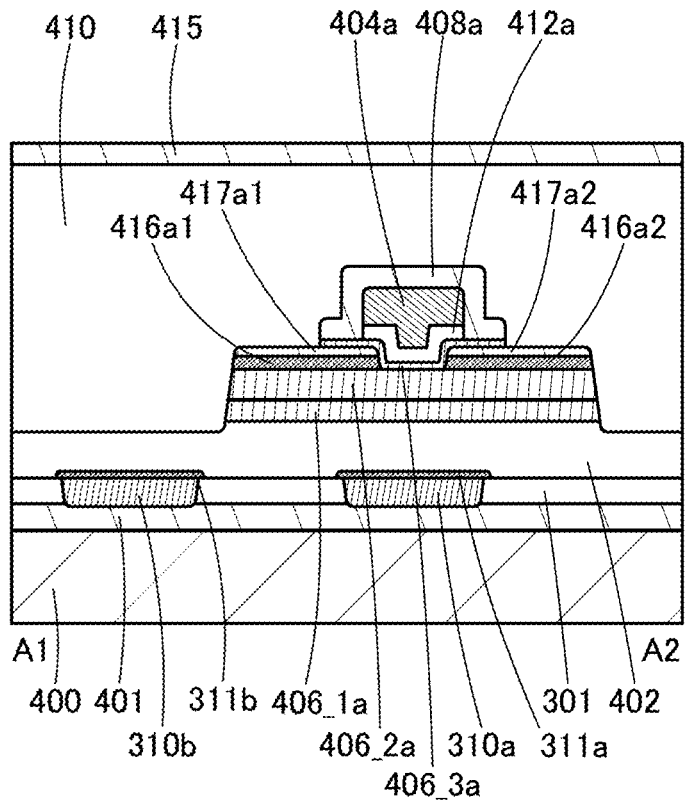
FIGS. 28A to 28D illustrate a method for manufacturing a transistor of one embodiment of the present invention.
Figure 28B:
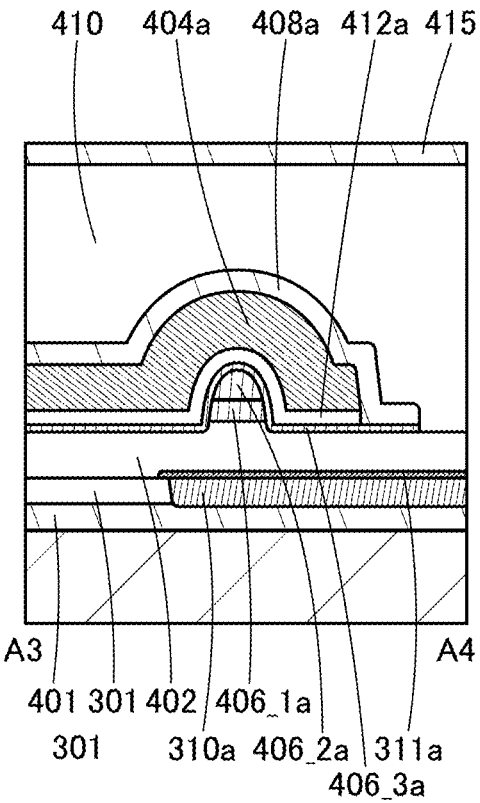
Figure 28C:
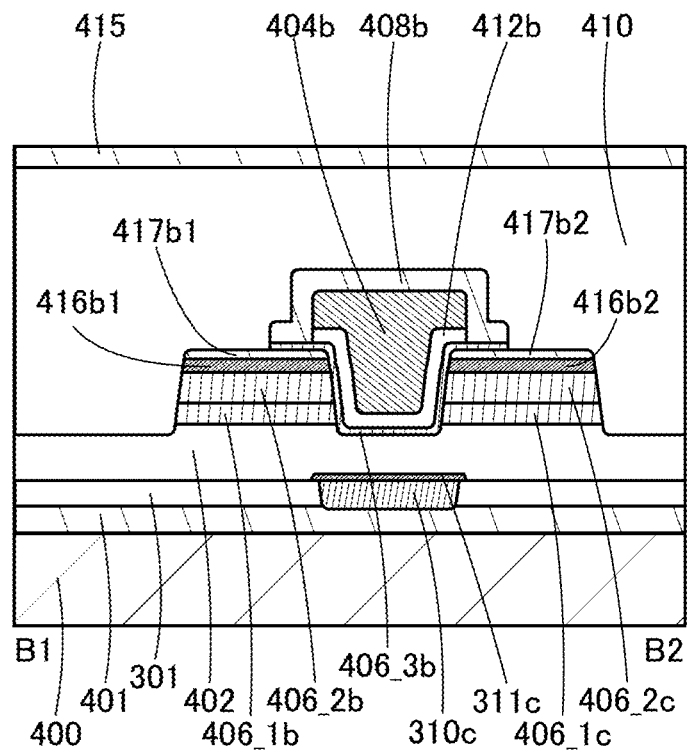
Figure 28D:
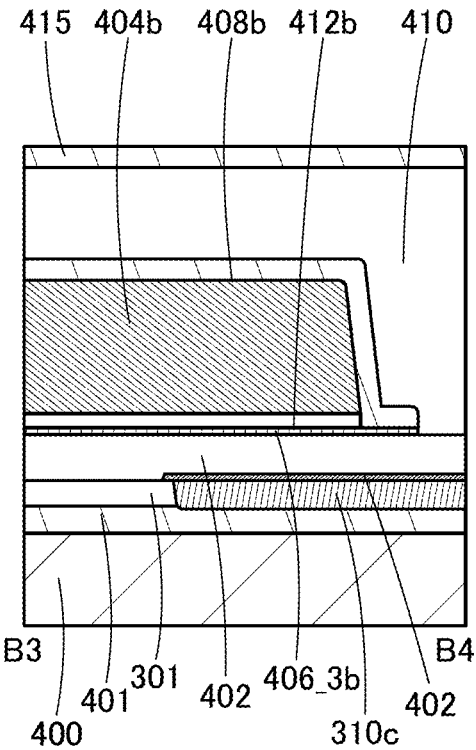
Figure 30A:
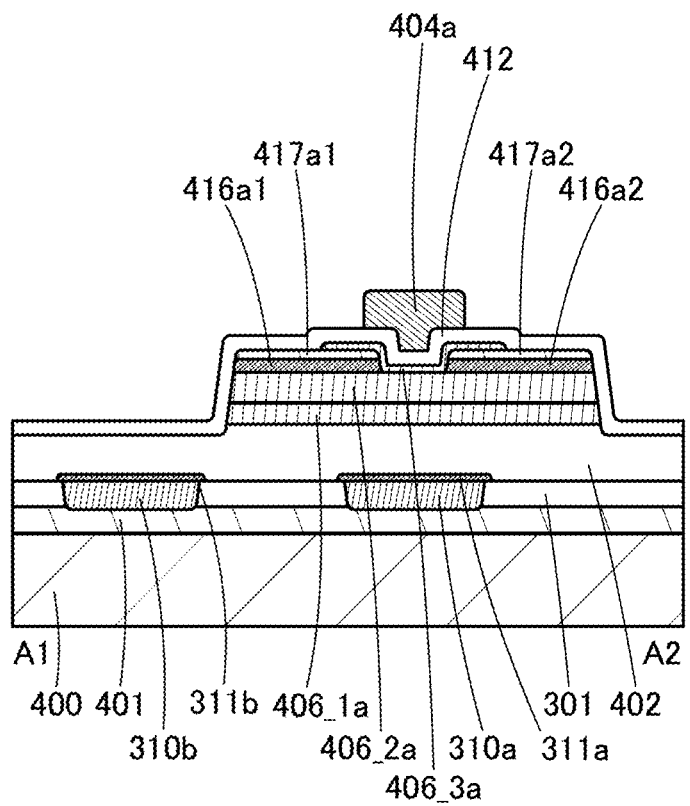
FIGS. 30A to 30D illustrate a method for manufacturing a transistor of one embodiment of the present invention.
Figure 30B:
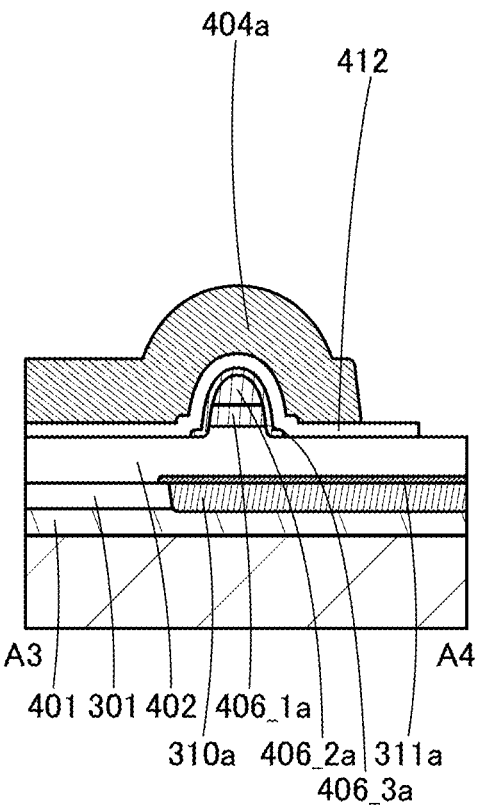
Figure 30C:
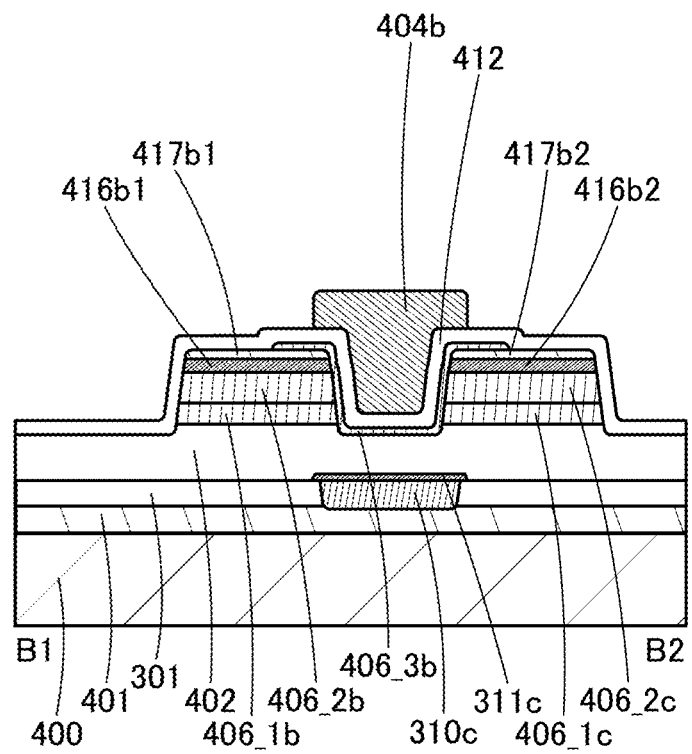
Figure 30D:
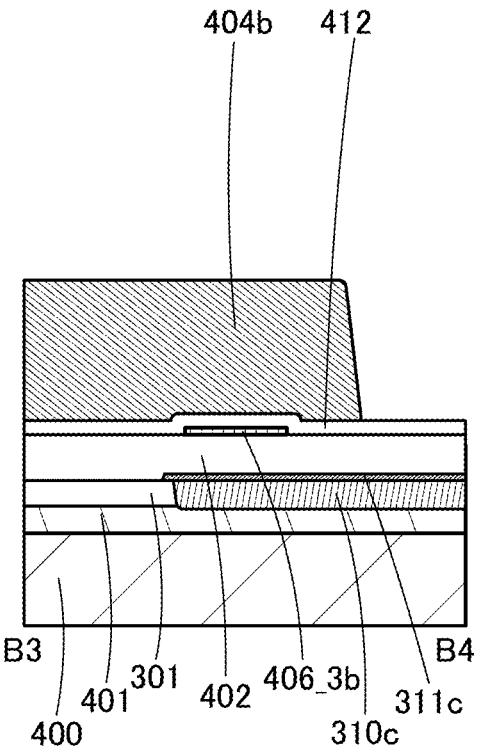
Figure 31A:
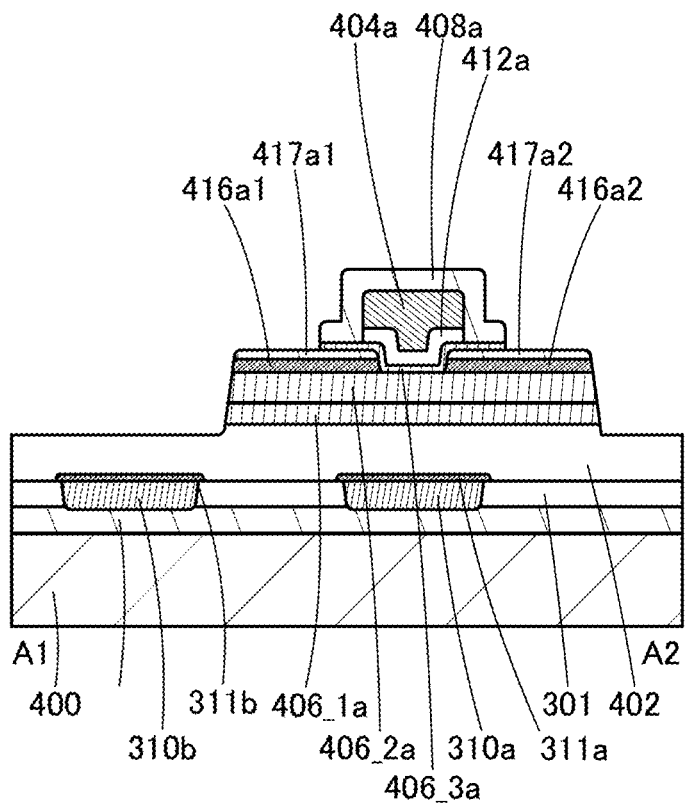
FIGS. 31A to 31D illustrate a method for manufacturing a transistor of one embodiment of the present invention.
Figure 31B:
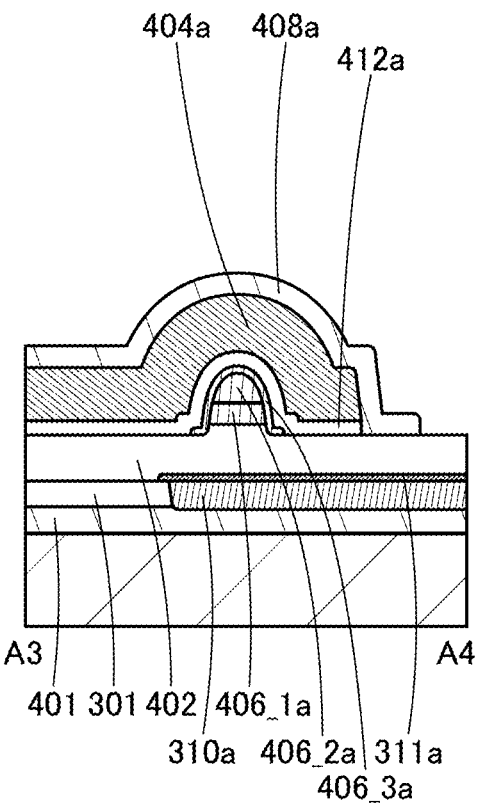
Figure 31C:
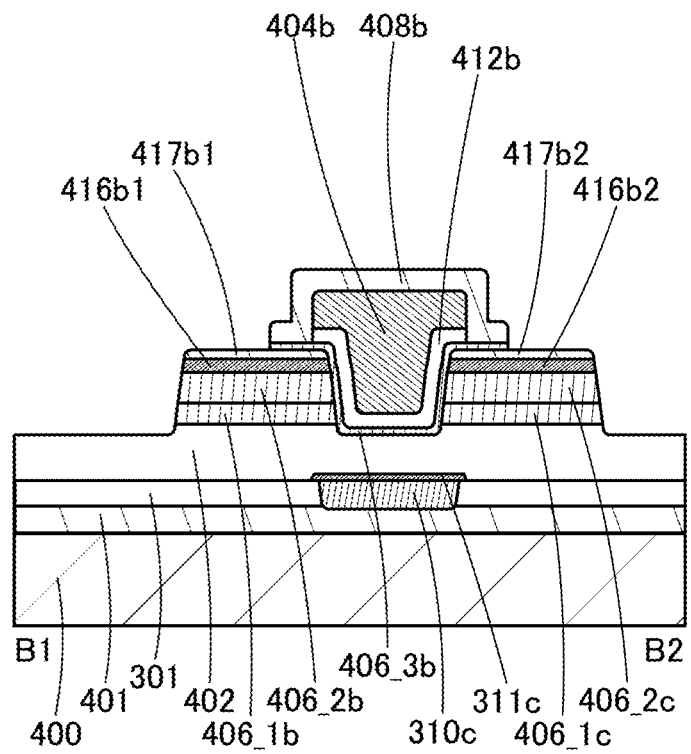
Figure 31D:
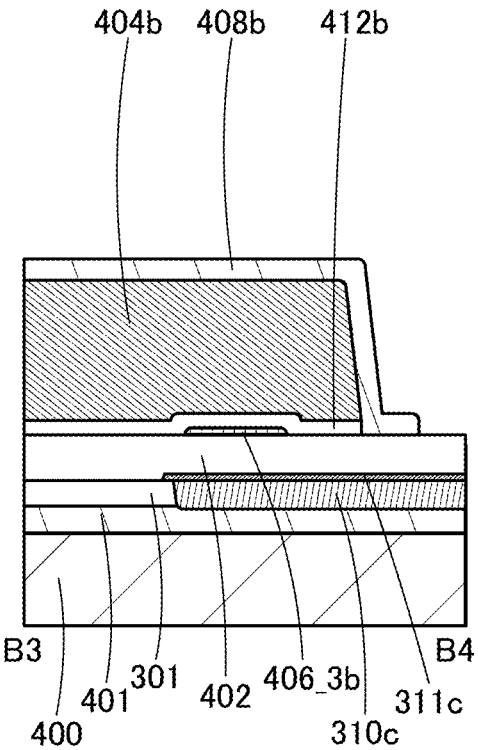
Figure 32A:
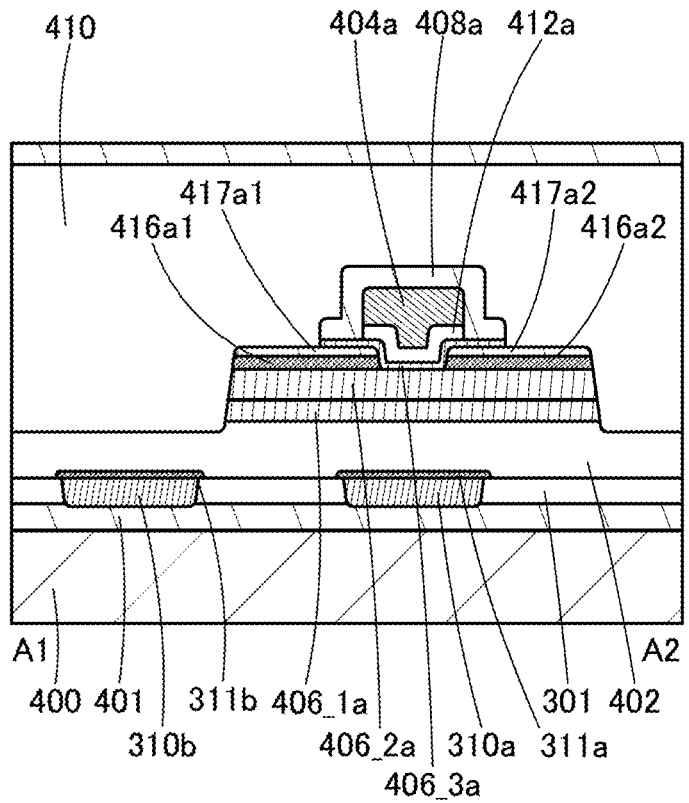
FIGS. 32A to 32D illustrate a method for manufacturing a transistor of one embodiment of the present invention.
Figure 32B:
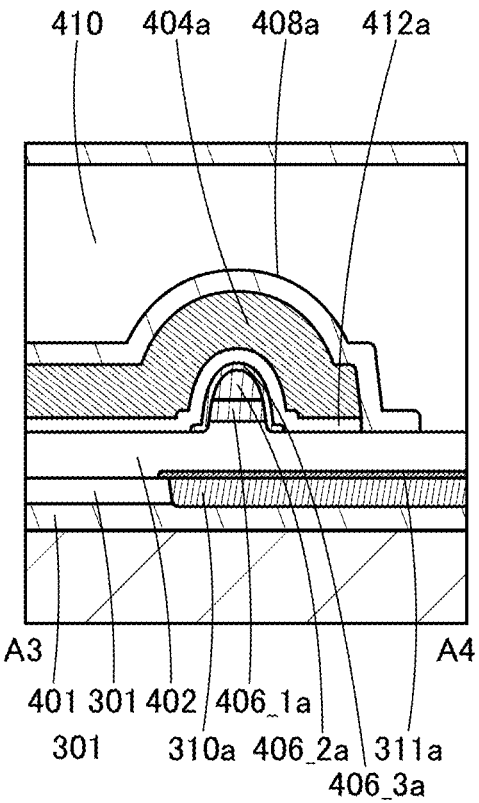
Figure 32C:
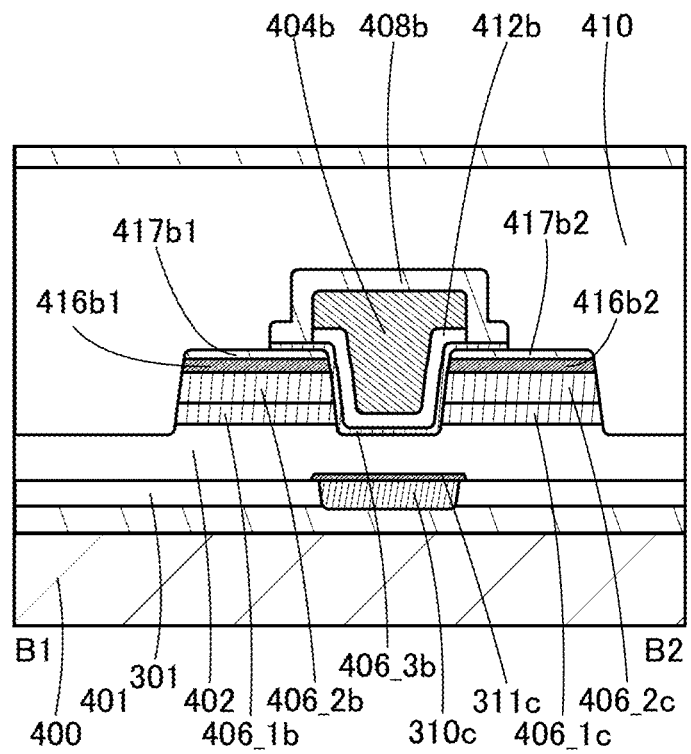
Figure 32D:
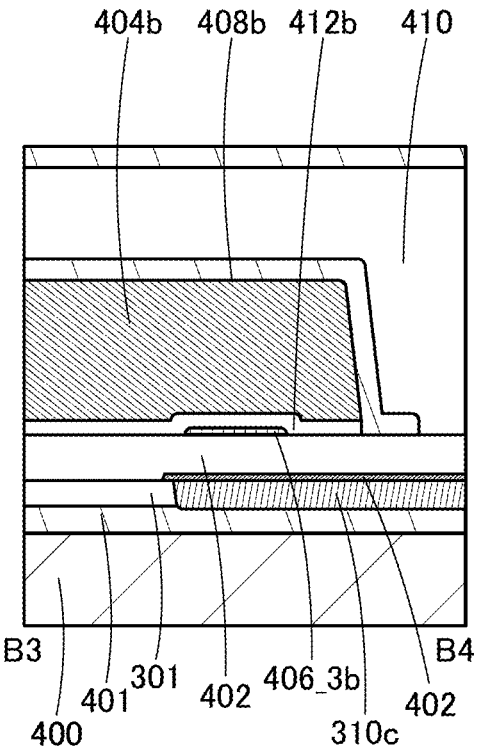

Concurrently, part of the conductor 416, part of the barrier film 417b, and part of the conductor 418b are etched using the resist masks 414b and 414c as etching masks, whereby a multilayer film including the conductor 416b1, the barrier film 417b1, and a conductor 418b1 and a multilayer film including the conductor 416b2, the barrier film 417b2, and a conductor 418b2 are formed (see FIGS. 22C and 22D).

Then, part of the oxide 406_1 and part of the oxide 406_2 are etched using the multilayer film including the conductor 416a, the barrier film 417a1, the barrier film 417a2, the conductor 418a1, and the conductor 418a2 as a hard mask, whereby a multilayer film including the oxide 406_1a and the oxide 406_2a is formed (see FIGS. 23A and 23B).

Concurrently, part of the oxide 406_1 and part of the oxide 406_2 are etched using the multilayer film including the conductor 416b1, the barrier film 417b1, and the conductor 418b1 and the multilayer film including the conductor 416b2, the barrier film 417b2, and the conductor 418b2 as hard masks, whereby a multilayer film including the oxide 406_1b and the oxide 406_2b and a multilayer film including the oxide 406_1c and the oxide 406_2c are formed (see FIGS. 23C and 23D).

In the lithography method, first, a resist is exposed to light through a mask. Next, a region exposed to light is removed or left using a developing solution, so that a resist mask is formed. Then, etching is conducted with the resist mask. As a result, the conductor, the semiconductor, the insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that dry etching treatment such as ashing or wet etching treatment can be used for removal of the resist mask. Alternatively, wet etching treatment can be performed after dry etching treatment. Still alternatively, dry etching treatment can be performed after wet etching treatment.

As a dry etching apparatus, a capacitively coupled plasma (CCP) etching apparatus including parallel plate type electrodes can be used. The capacitively coupled plasma etching apparatus including parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, the conductors 418a1, 418a2, 418b1, and 418b2 are etched. Concurrently, part of the conductor 416a is etched, whereby the conductors 416a1 and 416a2 are formed (see FIGS. 24A to 24D). The etching is preferably performed by dry etching. The use of dry etching enables minute processing. As a dry etching apparatus, the above-mentioned apparatus can be used.

Here, the conductors 418a1, 418a2, 418b1, and 418b2 are preferably formed using a conductor similar to that of the conductor 416a. It is preferable that the conductors 418a1, 418a2, 418b1, and 418b2 and the conductor 416a be formed using similar conductors because they can be etched under the same etching conditions, and accordingly they can be etched at the same time, resulting in improved productivity.

As for the etching conditions, the etching rate of the insulator 402 is preferably lower than the etching rates of the conductors 418a1, 418a2, 418b1, 418b2, and 416a. Owing to the low etching rate of the insulator 402, reduction in the thickness of part of the insulator 402 which none of the oxides 406_1a, 406_1b, and 406_1c overlap can be suppressed. Specifically, when the etching rate of the insulator 402 is regarded as 1, the etching rate of each of the conductors 418a1, 418a2, 418b1, 418b2, and 416a is higher than or equal to 5, preferably higher than or equal to 30.

Then, cleaning treatment is performed using an aqueous solution in which hydrofluoric acid is diluted with pure water (diluted hydrogen fluoride solution). A diluted hydrogen fluoride solution refers to a solution in which hydrofluoric acid is mixed into pure water at a concentration of approximately 70 ppm. Next, heat treatment is performed. For the heat treatment, the conditions for the first heat treatment can be used.

Plasma treatment may be performed in addition to or instead of the cleaning treatment. One or more kinds of gases such as oxygen, nitrogen, argon, dinitrogen monoxide, and nitrogen dioxide can be selected to be used as a gas used in the plasma treatment as appropriate. Alternatively, the cleaning treatment, the heat treatment, and the plasma treatment may be used in combination as appropriate.

Through the above-mentioned dry etching, impurities derived from the etching gas might be attached to surfaces of the oxides 406_1a, 406_2a, 406_1b, 406_2b, 406_1c, and 406_2c or diffused into the oxides. Examples of the impurities include fluorine and chlorine.

The above treatment can reduce the impurity concentrations of the oxides. Furthermore, the above treatment can reduce the moisture concentration and the hydrogen concentration in the oxides 406_1a, 406_2a, 406_1b, 406_2b, 406_1c, and 406_2c.

Next, an oxide 406_3 is formed. The oxide 406_3 can be formed by a sputtering method, a CVD method, an MBE method, a PLD method, an ALD method, or the like. A sputtering method is especially preferred for the deposition.

Furthermore, sputtering conditions are as follows: a mixed gas of oxygen and argon is used; the oxygen partial pressure is preferably high, more preferably 100%; and the deposition temperature is room temperature or higher than or equal to 100° C. and lower than or equal to 200° C.

The oxide 406_3 is preferably formed under the above conditions, in which case excess oxygen can be introduced into the oxides 406_2a and the insulator 402.

Then, an insulator 412 is formed over the oxide 406_3. The insulator 412 can be formed by a sputtering method, a CVD method, an MBE method, a PLD method, an ALD method, or the like (see FIGS. 25A to 25D).

Here, heat treatment can be performed. For the heat treatment, the conditions for the first heat treatment can be used. The heat treatment is preferably performed at 400° C. in a nitrogen atmosphere for one hour. The heat treatment can reduce the moisture concentration and the hydrogen concentration in the insulator 412.

Next, a conductor which is to be the conductors 404a and 404b is formed. The conductor to be the conductors 404a and 404b can be formed by a sputtering method, a CVD method, an MBE method, a PLD method, an ALD method, or the like.

The conductor to be the conductors 404a and 404b may be a multilayer film. For example, an oxide is formed under conditions similar to those for forming the oxide 406_3 so that oxygen can be added to the insulator 412. Oxygen added to the insulator 412 serves as excess oxygen.

Next, heat treatment is performed. For the heat treatment, the conditions for the first heat treatment can be used. The heat treatment is preferably performed at 400° C. in a nitrogen atmosphere for one hour. The moisture concentration and the hydrogen concentration in the insulator 412 can be reduced by the heat treatment. In addition, the excess oxygen in the insulator 412 can be injected to the oxides 406_2a, 406_2b, and 406_2c.

Then, a conductor is formed over the oxide by a sputtering method, whereby the electric resistivity of the oxide can be decreased.

The conductor to be the conductors 404a and 404b and the insulator 412 are processed by a lithography method or the like to form the conductor 404a, the conductor 404b, the insulator 412a, and the insulator 412b (see FIGS. 26A to 26D).

After that, an insulator to be the insulators 408a and 408b is formed. The insulator to be the insulators 408a and 408b can be formed by a sputtering method, a CVD method, an MBE method, a PLD method, an ALD method, or the like.

In the case where aluminum oxide is deposited as the insulator to be the insulators 408a and 408b by an ALD method, the insulator to be the insulators 408a and 408b can be formed on the top and side surfaces of the conductors 404a and 404b to have an even thickness and few pin holes, resulting in prevention of oxidation of the conductors 404a and 404b.

Then, the insulator to be the insulators 408a and 408b is processed by a lithography method to form the insulators 408a and 408b. In addition, the oxide 406_3 may be processed through the same lithography step to form the oxides 406_3a and 406_3b. In this manner, when the insulator to be the insulators 408a and 408b and the oxide 406_3 are processed by the same lithography step, the process can be shortened. Alternatively, the insulator to be the insulators 408a and 408b and the oxide 406_3 may be processed by different lithography steps. It is sometimes preferable to process the insulator to be the insulators 408a and 408b and the oxide 406_3 separately, in which case they can be processed into desired shapes (see FIGS. 27A to 27D).

When the oxide 406_3 is etched by dry etching, part of the oxide 406_3 might remain as a residue to be attached to the side surfaces of the oxides 406_1a, 406_2a, 406_1b, 406_2b, 406_1c, and 406_2c. In that case, the residue can be removed by using a chemical solution which can etch the oxide 406_3. As the chemical solution that can etch the oxide 406_3, for example, diluted hydrofluoric acid or a phosphoric acid solution can be used.

The residue is preferably removed, in which case excess oxygen can be injected from the side surfaces of the oxides 406_1a, 406_2a, 406_1b, 406_2b, 406_1c, and 406_2c efficiently.

Then, the insulator 410 is formed over the insulators 408a and 408b. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

For the formation of the insulator 410, a CVD method is preferably employed. More preferably, a plasma CVD method is employed. In the case of formation by a plasma CVD method, a step 1 of depositing an insulator and a step 2 of performing treatment using plasma containing oxygen may be repeatedly conducted. By conducting the step 1 and the step 2 more than once, the insulator 410 including excess oxygen can be formed.

The insulator 410 may be formed to have a flat top surface. For example, the top surface of the insulator 410 may have flatness immediately after the formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. However, the top surface of the insulator 410 is not necessarily flat.

Next, heat treatment may be performed. For the heat treatment, the conditions for the first heat treatment can be used. The heat treatment is preferably performed at 400° C. in a nitrogen atmosphere for one hour. The moisture concentration and the hydrogen concentration in the insulator 410 can be reduced by the heat treatment.

Then, the insulator 415 is formed over the insulator 410. The insulator 415 can be formed by a sputtering method, a CVD method, an MBE method, a PLD method, an ALD method, or the like. A sputtering method is preferably used in formation of the insulator 415. The insulator 415 is formed by a sputtering method successively after heat treatment in vacuum or reverse sputtering is performed.

When the insulator 415 is formed by a sputtering method with the use of plasma containing oxygen, oxygen can be added to the insulator 410 serving as a base layer. The added oxygen serves as excess oxygen in the insulator 410 and is added to the oxides 406_1a, 406_2a, 406_3a, and 406_3b by heat treatment or the like, so that oxygen vacancies in the oxides 406_1a, 406_2a, 406_3a, and 406_3b can be repaired. In addition, the moisture concentration and the hydrogen concentration in the insulator 410 can be reduced.

For example, when the insulator 415 includes aluminum oxide, impurities such as hydrogen can be prevented from entering the oxides 406_1a, 406_2a, 406_3a, 406_3b. In addition, for example, when the insulators 401, 408a, 408b, and 415 each include aluminum oxide, outward diffusion of the excess oxygen that has been added to the oxides 406_1a, 406_2a, 406_3a, and 406_3b can be reduced (see FIGS. 28A to 28D).

Next, an opening which passes through the insulators 415, 410, and 402 and reaches the conductor 311b; an opening which passes through the insulators 415 and 410 and the barrier film 417a1 and reaches the conductor 416a1; an opening which passes through the insulators 415 and 410 and the barrier film 417a2 and reaches the conductor 416a2; an opening which passes through the insulators 415, 410, and 408a and reaches the conductor 404a; an opening which passes through the insulators 415 and 410 and the barrier film 417b1 and reaches the conductor 416b1; an opening which passes through the insulators 415 and 410 and the barrier film 417b2 and reaches the conductor 416b2; and an opening which passes through the insulators 415, 410, and 408b and reaches the conductor 404b are formed by a lithography method.

As another method for forming the openings, the following steps may be employed: a conductor is formed over the insulator 415, an insulator is formed over the conductor, and the conductor and the insulator are processed by a lithography method to form a hard mask including the conductor and the insulator, and etching is performed with use of the hard mask as an etching mask whereby openings are formed. When the hard mask is used as the etching mask, the openings can be prevented from extending laterally or deformation. Note that the hard mask may be a single layer of the insulator or the conductor.

The openings can be formed at once by a lithograph step. Alternatively, the openings may be formed separately by performance of lithography steps a plurality of times.

Next, the conductor 429a, the conductor 431a, the conductor 433a, the conductor 437a, the conductor 429b, the conductor 431b, and the conductor 437b are embedded in the openings.

Next, a conductor is formed over the insulator 415, the conductor 429a, the conductor 431a, the conductor 433a, the conductor 437a, the conductor 429b, the conductor 431b, and the conductor 437b. Then, the conductor is processed by a lithography method or the like to form the conductor 430a, the conductor 432a, the conductor 434a, the conductor 438a, the conductor 430b, the conductor 432b, and the conductor 438b. Through the above steps, the transistor 100 illustrated in FIGS. 1A to 1C and the transistor 200 illustrated in FIGS. 2A to 2C can be manufactured (see FIGS. 1A to 1C and FIGS. 2A to 2C).

<Method 2 for Manufacturing Transistors>

A method for manufacturing the transistor 100A illustrated in FIGS. 3A to 3C and the transistor 200A illustrated in FIGS. 4A to 4C according to the present invention is described with reference to FIGS. 29A to 29D, FIGS. 30A to 30D, FIGS. 31A to 31D, and FIGS. 32A to 32D. FIG. 29A, FIG. 30A, FIG. 31A, and FIG. 32A are each a cross-sectional view taken along the dashed-dotted line A1-A2 in FIG. 3A. FIG. 29B, FIG. 30B, FIG. 31B, and FIG. 32B are each a cross-sectional view taken along the dashed-dotted line A3-A4 in FIG. 3A. FIG. 29C, FIG. 30C, FIG. 31C, and FIG. 32C are each a cross-sectional view taken along the dashed-dotted line B1-B2 in FIG. 4A. FIG. 29D, FIG. 30D, FIG. 31D, and FIG. 32D are each a cross-sectional view taken along the dashed-dotted line B3-B4 in FIG. 4A.

The steps up to FIGS. 24A to 24D are performed in a manner similar to those described in Method 1 for manufacturing transistors. Next, the oxide 406_3 is formed. The oxide 406_3 can be formed by a sputtering method, a CVD method, an MBE method, a PLD method, an ALD method, or the like. A sputtering method is especially preferred for the deposition. Furthermore, sputtering conditions are as follows: a mixed gas of oxygen and argon is used; the oxygen partial pressure is preferably high, more preferably 100%; and the deposition temperature is room temperature or higher than or equal to 100° C. and lower than or equal to 200° C.

Subsequently, the oxide 406_3 is processed by a lithography method to form the oxide 406_3a and the oxide 406_3b. When the oxide 406_3a and the oxide 406_3b are formed by a lithography method, they can be processed into any shape (see FIGS. 29A to 29D).

When the oxide 406_3 is etched by dry etching, part of the oxide 406_3 might remain as a residue to be attached to the side surfaces of the oxides 406_1a, 406_2a, 406_1b, 406_2b, 406_1c, and 406_2c. In that case, the residue can be removed by using a chemical solution which can etch the oxide 406_3. As the chemical solution that can etch the oxide 406_3, for example, diluted hydrofluoric acid or a phosphoric acid solution can be used.

The residue is preferably removed, in which case excess oxygen can be injected from the side surfaces of the oxides 406_1a, 406_2a, 406_1b, 406_2b, 406_1c, and 406_2c efficiently.

Then, the insulator 412 is formed. The insulator 412 can be formed by a sputtering method, a CVD method, an MBE method, a PLD method, an ALD method, or the like (see FIGS. 30A to 30D).

Here, heat treatment can be performed. For the heat treatment, the conditions for the first heat treatment can be used. The heat treatment is preferably performed at 400° C. in a nitrogen atmosphere for one hour. The heat treatment can reduce the moisture concentration and the hydrogen concentration in the insulator 412.

Next, a conductor which is to be the conductors 404a and 404b is formed. The conductor to be the conductors 404a and 404b can be formed by a sputtering method, a CVD method, an MBE method, a PLD method, an ALD method, or the like.

The conductor to be the conductors 404a and 404b may be a multilayer film. For example, an oxide is formed under conditions similar to those for forming the oxide 406_3 so that oxygen can be added to the insulator 412. Oxygen added to the insulator 412 serves as excess oxygen.

Next, heat treatment is performed. For the heat treatment, the conditions for the first heat treatment can be used. The heat treatment is preferably performed at 400° C. in a nitrogen atmosphere for one hour. The moisture concentration and the hydrogen concentration in the insulator 412 can be reduced by the heat treatment. In addition, the excess oxygen in the insulator 412 can be injected to the oxides 406_2a, 406_2b, and 406_2c.

Then, a conductor is formed over the oxide by a sputtering method, whereby the electric resistivity of the oxide can be decreased.

The conductor to be the conductors 404a and 404b and the insulator 412 are processed by a lithography method or the like to form the conductor 404a, the conductor 404b, the insulator 412a, and the insulator 412b.

After that, an insulator to be the insulators 408a and 408b is formed. The insulator to be the insulators 408a and 408b can be formed by a sputtering method, a CVD method, an MBE method, a PLD method, an ALD method, or the like. In the case where aluminum oxide is deposited as the insulator to be the insulators 408a and 408b by an ALD method, the insulator to be the insulators 408a and 408b can be formed on the top and side surfaces of the conductors 404a and 404b to have an even thickness and few pin holes, resulting in prevention of oxidation of the conductors 404a and 404b.

Then, the insulator to be the insulators 408a and 408b is processed by a lithography method to form the insulators 408a and 408b (see FIGS. 31A to 31D).

Then, the insulator 410 is formed over the insulators 408a and 408b. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

For the formation of the insulator 410, a CVD method is preferably employed. More preferably, a plasma CVD method is employed. In the case of formation by a plasma CVD method, a step 1 of depositing an insulator and a step 2 of performing treatment using plasma containing oxygen may be repeatedly conducted. By conducting the step 1 and the step 2 more than once, the insulator 410 including excess oxygen can be formed.

The insulator 410 may be formed to have a flat top surface. For example, the top surface of the insulator 410 may have flatness immediately after the formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. However, the top surface of the insulator 410 is not necessarily flat.

Next, heat treatment may be performed. For the heat treatment, the conditions for the first heat treatment can be used. The heat treatment is preferably performed at 400° C. in a nitrogen atmosphere for one hour. The moisture concentration and the hydrogen concentration in the insulator 410 can be reduced by the heat treatment.

Then, the insulator 415 is formed over the insulator 410. The insulator 415 can be formed by a sputtering method, a CVD method, an MBE method, a PLD method, an ALD method, or the like. A sputtering method is preferably used in formation of the insulator 415. The insulator 415 is formed by a sputtering method successively after heat treatment in vacuum or reverse sputtering is performed.

When the insulator 415 is formed by a sputtering method with the use of plasma containing oxygen, oxygen can be added to the insulator 410 serving as a base layer. The added oxygen serves as excess oxygen in the insulator 410 and is added to the oxides 406_1a, 406_2a, 406_3a, and 406_3b by heat treatment or the like, so that oxygen vacancies in the oxides 406_1a, 406_2a, 406_3a, and 406_3b can be repaired. In addition, the moisture concentration and the hydrogen concentration in the insulator 410 can be reduced.

For example, when the insulator 415 includes aluminum oxide, impurities such as hydrogen can be prevented from entering the oxides 406_1a, 4062a, 406_3a, 406_3b. In addition, for example, when the insulators 401, 408a, 408b, and 415 each include aluminum oxide, outward diffusion of the excess oxygen that has been added to the oxides 406_1a, 406_2a, 406_3a, and 406_3b can be reduced (see FIGS. 32A to 32D).

Next, an opening which passes through the insulators 415, 410, and 402 and reaches the conductor 311b; an opening which passes through the insulators 415 and 410 and the barrier film 417a1 and reaches the conductor 416a1; an opening which passes through the insulators 415 and 410 and the barrier film 417a2 and reaches the conductor 416a2; an opening which passes through the insulators 415, 410, and 408a and reaches the conductor 404a; an opening which passes through the insulators 415 and 410 and the barrier film 417b1 and reaches the conductor 416b1; an opening which passes through the insulators 415 and 410 and the barrier film 417b2 and reaches the conductor 416b2; and an opening which passes through the insulators 415, 410, and 408b and reaches the conductor 404b are formed by a lithography method.

As another method for forming the openings, the following steps may be employed: a conductor is formed over the insulator 415, an insulator is formed over the conductor, and the conductor and the insulator are processed by a lithography method to form a hard mask including the conductor and the insulator, and etching is performed with use of the hard mask as an etching mask whereby openings are formed. When the hard mask is used as the etching mask, the openings can be prevented from extending laterally or deformation. Note that the hard mask may be a single layer of the insulator or the conductor.

The openings can be formed at once by a lithograph step. Alternatively, the openings may be formed separately by performance of lithography steps a plurality of times.

Next, the conductor 429a, the conductor 431a, the conductor 433a, the conductor 437a, the conductor 429b, the conductor 431b, and the conductor 437b are embedded in the openings.

Next, a conductor is formed over the insulator 415, the conductor 429a, the conductor 431a, the conductor 433a, the conductor 437a, the conductor 429b, the conductor 431b, and the conductor 437b. Then, the conductor is processed by a lithography method or the like to form the conductor 430a, the conductor 432a, the conductor 434a, the conductor 438a, the conductor 430b, the conductor 432b, and the conductor 438b. Through the above steps, the transistor 100A illustrated in FIGS. 3A to 3C and the transistor 200A illustrated in FIGS. 4A to 4C can be manufactured (see FIGS. 3A to 3C and FIGS. 4A to 4C).

As described above, the structures, methods, and the like described in this embodiment can be combined with any of the structures, methods, and the like described in the other embodiments as appropriate.

Embodiment 4

In this embodiment, one mode of a semiconductor device is described with reference to FIGS. 33A and 33B, FIG. 34, and FIG. 35.

Structure Examples

Figure 33A:
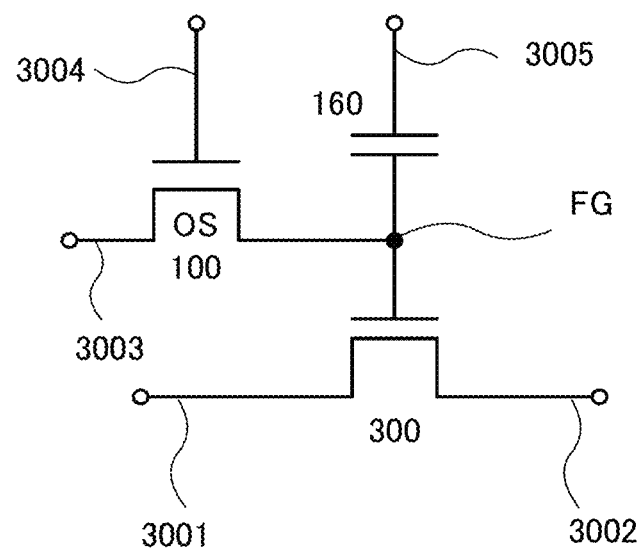
FIGS. 33A and 33B are each a circuit diagram of a semiconductor device of one embodiment of the present invention.

Examples of a semiconductor device (memory device) including a capacitor of one embodiment of the present invention are illustrated in FIGS. 33A and 33B, FIG. 34, and FIG. 35. Note that FIG. 33A is a circuit diagram corresponding to each of FIG. 34 and FIG. 35.
<Circuit Configuration 1 of Semiconductor Device>

Figure 34:
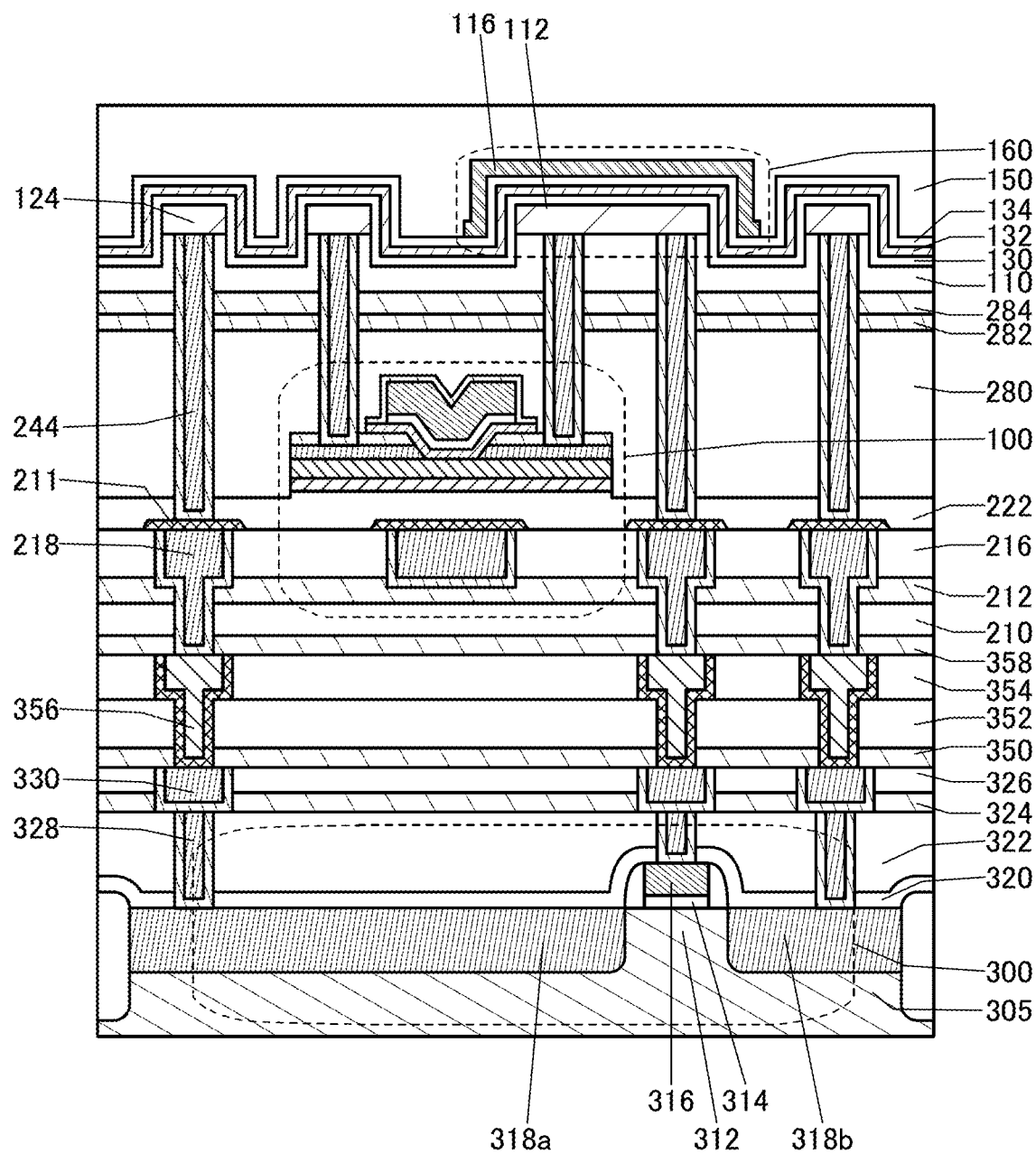
FIG. 34 illustrates a cross-sectional structure of a semiconductor device of one embodiment of the present invention.
Figure 35:
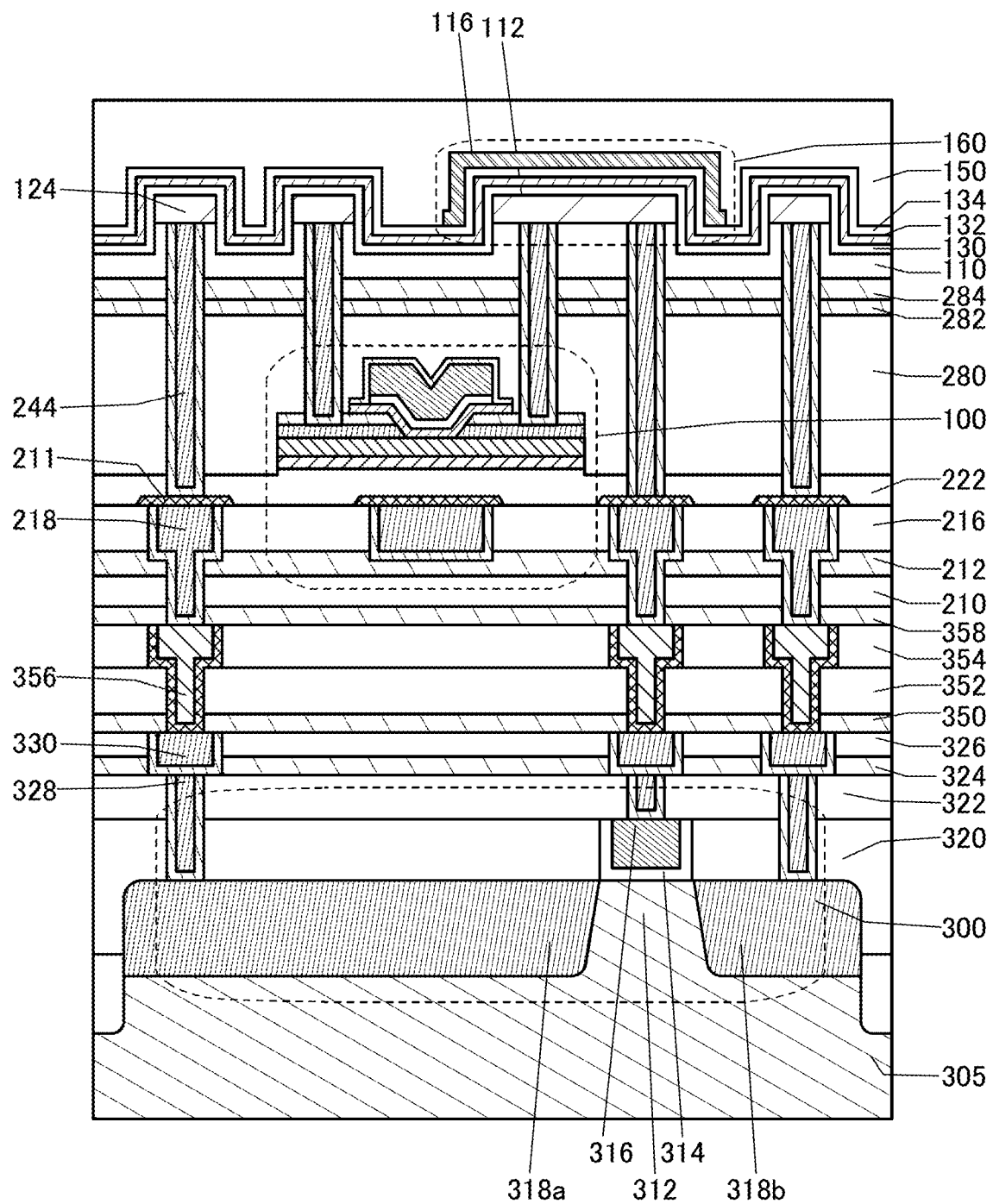
FIG. 35 illustrates a cross-sectional structure of a semiconductor device of one embodiment of the present invention.

Semiconductor devices illustrated in FIG. 33A, FIG. 34, and FIG. 35 each include a transistor 300, a transistor 100, and a capacitor 160.

The transistor 100 is a transistor in which a channel is formed in a semiconductor layer including an oxide semiconductor. Since the off-state current of the transistor 100 is small, by using the transistor 100 in a semiconductor device (memory device), stored data can be retained for a long time. In other words, it is possible to obtain a semiconductor device (memory device) which does not require refresh operation or has an extremely low frequency of the refresh operation, which leads to a sufficient reduction in power consumption.

In FIG. 33A, a wiring 3001 is electrically connected to a source of the transistor 300. A wiring 3002 is electrically connected to a drain of the transistor 300. A wiring 3003 is electrically connected to one of a source and a drain of the transistor 100. A wiring 3004 is electrically connected to a gate of the transistor 100. A gate of the transistor 300 and the other of the source and the drain of the transistor 100 are electrically connected to one electrode of the capacitor 160. A wiring 3005 is electrically connected to the other electrode of the capacitor 160.

The semiconductor device in FIG. 33A has a feature that the potential of the gate of the transistor 300 can be retained, and thus enables writing, retaining, and reading of data as follows.

Writing and retaining of data will be described. First, the potential of the wiring 3004 is set to a potential at which the transistor 100 is turned on, so that the transistor 100 is turned on. Accordingly, the potential of the wiring 3003 is supplied to a node FG where the gate of the transistor 300 and the one electrode of the capacitor 160 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 100 is turned off, so that the transistor 100 is turned off. Thus, the charge is retained at the node FG (retaining).

In the case where the off-state current of the transistor 100 is low, the electric charge of the node FG is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when the high-level electric charge is given to the gate of the transistor 300 is lower than an apparent threshold voltage $V_{th\_L}$ at the time when the low-level electric charge is given to the gate of the transistor 300. Here, an apparent threshold voltage refers to the potential of the wiring 3005 which is needed to make the transistor 300 be in an on state. Thus, the potential of the wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the wiring 3005 is $V_0(>V_{th\_H})$, the transistor 300 is brought into an on state. On the other hand, in the case where the low-level charge is supplied to the node FG in writing, even when the potential of the wiring 3005 is $V_0(<V_{th\_L})$, the transistor 300 remains in the off state. Thus, the data retained in the node FG can be read by determining the potential of the wiring 3002.

By arranging semiconductor devices each having the structure illustrated in FIG. 33A in a matrix, a memory device (memory cell array) can be formed.

Note that in the case where memory cells are arrayed, it is necessary that data of a desired memory cell is read in read operation. A configuration in which only data of a desired memory cell can be read by supplying a potential at which the transistor 300 is turned off regardless of the charge supplied to the node FG, that is, a potential lower than $V_{th\_H}$ is supplied to the wiring 3005 of memory cells from which data is not read may be employed. Alternatively, a configuration in which only data of a desired memory cell can be read by supplying a potential at which the transistor 300 is turned on regardless of the charge supplied to the node FG, that is, a potential higher than $V_{th\_L}$ is supplied to the wiring 3005 of memory cells from which data is not read may be employed.
<Circuit Configuration 2 of Semiconductor Device>

Figure 33B:
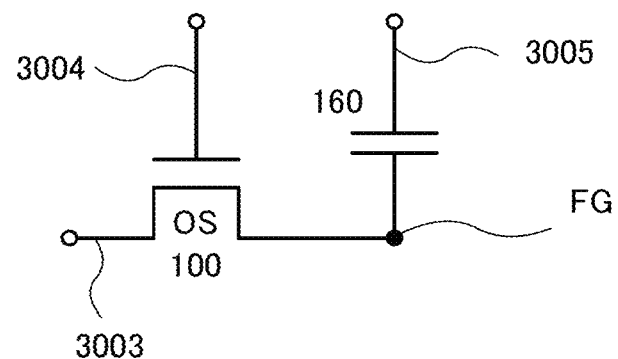

A semiconductor device in FIG. 33B is different from the semiconductor device in FIG. 33A in that the transistor 300 is not provided. Also in this case, data can be written and retained in a manner similar to that of the semiconductor device in FIG. 33A.

Reading of data in the semiconductor device in FIG. 33B is described. When the transistor 100 is brought into an on state, the wiring 3003 which is in a floating state and the capacitor 160 are brought into conduction, and the electric charge is redistributed between the wiring 3003 and the capacitor 160. As a result, the potential of the wiring 3003 changes. The amount of change in the potential of the wiring 3003 varies depending on the potential of the one electrode of the capacitor 160 (or the electric charge accumulated in the capacitor 160).

For example, the potential of the wiring 3003 after the charge redistribution is $(C_B \times V_{B0} + C \times V)/(C_B + C)$, where V is the potential of the one electrode of the capacitor 160, C is the capacitance of the capacitor 160, $C_B$ is the capacitance component of the wiring 3003, and $V_{B0}$ is the potential of the wiring 3003 before the charge redistribution. Thus, it can be found that, assuming that the memory cell is in either of two states in which the potential of the one electrode of the capacitor 160 is $V_1$ and $V_0(V_1>V_0)$, the potential of the wiring 3003 in the case of retaining the potential $V_1$ (=$(C_B \times V_{B0} + C \times V_1)/(C_B + C)$) is higher than the potential of the wiring 3003 in the case of retaining the potential $V_0$(=$(C_B \times V_{B0} + C \times V_0)/(C_B + C)$).

Then, by comparing the potential of the wiring 3003 with a predetermined potential, data can be read.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device of one embodiment of the present invention does not have a limit on the number of times data can be rewritten, and the reliability thereof is drastically improved. Furthermore, data is written depending on the state of the transistor (on or off), whereby high-speed operation can be easily achieved.

<Structure 1 of Semiconductor Device>

The semiconductor device of one embodiment of the present invention includes the transistor 300, the transistor 100, and the capacitor 160 as shown in FIG. 34. The transistor 100 is provided over the transistor 300, and the capacitor 160 is provided over the transistor 300 and the transistor 100.

The transistor 300 is provided on a substrate 305 and includes a conductor 316, an insulator 314, a semiconductor region 312 that is a part of the substrate 305, and low-resistance regions 318a and 318b functioning as a source region and a drain region.

The transistor 300 may be a p-channel transistor or an n-channel transistor.

It is preferable that a region of the semiconductor region 312 where a channel is formed, a region in the vicinity thereof, the low-resistance regions 318a and 318b functioning as a source region and a drain region, and the like contain a semiconductor such as a silicon-based semiconductor, more preferably single crystal silicon.

Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs or the like.

The low-resistance regions 318a and 318b contain an element which imparts n-type conductivity, such as arsenic or phosphorus, or an element which imparts p-type conductivity, such as boron, in addition to a semiconductor material used for the semiconductor region 312.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

In the transistor 300 shown in FIG. 34, the semiconductor region 312 (part of the substrate 305) in which a channel is formed includes a protruding portion. Furthermore, the conductor 316 is provided to cover side and top surfaces of the semiconductor region 312 with the insulator 314 positioned therebetween. Note that the conductor 316 may be formed using a material for adjusting the work function. The transistor 300 having such a structure is also referred to as a FIN-type transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

Note that the transistor 300 shown in FIG. 34 is just an example and is not limited to the structure shown therein; an appropriate transistor may be used in accordance with a circuit configuration or a driving method. For example, the transistor 300 may be a planar transistor. In the case of using the circuit configuration shown in FIG. 33B, the transistor 300 may be omitted.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 functions as a planarization film for eliminating a level difference caused by the transistor 300 or the like underlying the insulator 322. A top surface of the insulator 322 may be planarized by planarization treatment using a CMP method or the like to increase the level of planarity.

The insulator 324 is preferably formed using, for example, a film having a barrier property that prevents hydrogen or impurities from diffusing from the substrate 305, the transistor 300, or the like into a region where the transistor 100 is formed.

As an example of the film having a barrier property against hydrogen, silicon nitride formed by a CVD method can be given. Diffusion of hydrogen into a semiconductor element including an oxide semiconductor, such as the transistor 100, degrades the characteristics of the semiconductor element in some cases. Therefore, a film that prevents hydrogen diffusion is preferably provided between the transistor 100 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in TDS analysis in the range of 50° C. to 500° C., for example.

Note that the relative dielectric constant of the insulator 326 is preferably lower than that of the insulator 324. For example, the relative dielectric constant of the insulator 326 is preferably lower than 4, more preferably lower than 3. For example, the relative dielectric constant of the insulator 326 is preferably 0.7 times or less that of the insulator 324, more preferably 0.6 times or less that of the insulator 324. In the case where a material with a low relative dielectric constant is used as an interlayer film, the parasitic capacitance between wirings can be reduced.

A conductor 328, a conductor 330, and the like that are electrically connected to the capacitor 160 or the transistor 100 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 34, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

Note that for example, the insulator 350 is preferably formed using an insulator having a barrier property with respect to hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. In such a structure, the transistor 300 and the transistor 100 can be separated by a barrier film, so that diffusion of hydrogen from the transistor 300 to the transistor 100 can be prevented.

Note that as the conductor having a barrier property against hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

An insulator 358, an insulator 210, an insulator 212, and an insulator 216 are stacked sequentially over the insulator 354. A material having a barrier property against oxygen and hydrogen is preferably used for one or all of the insulator 358, the insulator 210, the insulator 212, and the insulator 216.

The insulator 358 and the insulator 212 are preferably formed using, for example, a film having a barrier property that prevents hydrogen and impurities from diffusing from a region where the substrate 305 or the transistor 300 is formed or the like into a region where the transistor 100 is formed. Therefore, the insulators 358 and 212 can be formed using a material similar to that used for forming the insulator 324.

As an example of the film having a barrier property against hydrogen, silicon nitride formed by a CVD method can be given. Diffusion of hydrogen into a semiconductor element including an oxide semiconductor, such as the transistor 100, degrades the characteristics of the semiconductor element in some cases. Therefore, a film that prevents hydrogen diffusion is preferably provided between the transistor 100 and the transistor 300. Specifically, the film that prevents hydrogen diffusion is a film from which hydrogen is less likely to be released.

For example, the insulators 210 and 216 can be formed using a material similar to that used for forming the insulator 320. For example, a silicon oxide film, a silicon oxynitride film, or the like can be used as the insulator 216.

A conductor 218, a conductor forming the transistor 100, and the like are embedded in the insulators 358, 210, 212, and 216. Note that the conductor 218 functions as a plug or a wiring that is electrically connected to the capacitor 160 or the transistor 300. The conductor 218 can be formed using a material similar to that used for forming the conductor 328 and the conductor 330.

In particular, part of the conductor 218 which is in contact with the insulators 358 and 212 is preferably a conductor with a barrier property against oxygen, hydrogen, and water. When the conductor 211 with a barrier property against oxygen, hydrogen, and water is provided to cover the conductor 218, the transistors 300 and 100 can be completely separated by the layer with a barrier property against oxygen, hydrogen, and water. As a result, diffusion of hydrogen from the transistor 300 to the transistor 100 can be prevented.

An insulator 222 is provided over the conductor 211 and the insulator 216. The insulator 222 functions as a gate insulator of the transistor 100. Although the insulator 222 contains excess oxygen in some cases, the excess oxygen is blocked by the conductor 211 with a barrier property against oxygen, hydrogen, and water; therefore, the excess oxygen can be prevented from diffusing to the conductor 218, so that oxidation of the conductor 218 can be prevented.

The transistor 100 is provided over the insulator 216. Note that, for example, the structure of the transistor in FIGS. 1A to 1C described in the above embodiment can be used as the structure of the transistor 100. Note that the transistor 100 in FIG. 34 are just an example and is not limited to the structure shown therein; an appropriate transistor may be used in accordance with a circuit structure or a driving method.

An insulator 280 is provided over the transistor 100. The insulator 280 preferably includes oxide containing oxygen in excess of that in the stoichiometric composition. That is, in the insulator 280, a region containing oxygen in excess of that in the stoichiometric composition (hereinafter also referred to as an oxygen-excess region) is preferably formed. In particular, in the case where an oxide semiconductor is used in the transistor 100, when an insulator including an oxygen-excess region is provided in an interlayer film or the like in the vicinity of the transistor 100, oxygen vacancies in the transistor 100 are reduced, whereby the reliability can be improved.

As the insulator including the oxygen-excess region, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor 100 may function as a planarization film that covers a roughness thereunder. An insulator 282, an insulator 284, and an insulator 110 are stacked sequentially over the insulator 280.

A material having a barrier property against oxygen or hydrogen is preferably used for one or all of the insulator 282, the insulator 284, and the insulator 110. Thus, the insulator 282 can be formed using a material similar to that used for forming the insulator 212. The insulator 284 can be formed using an insulator similar to that used for forming the insulator 212. The insulator 110 can be formed using a material similar to that used for forming the insulator 216.

In the structure illustrated in FIG. 34, the conductor 244 is formed after formation of the insulators 280, 282, 284, and 110, for example. Therefore, the conductor 124 can be formed concurrently with the conductor 112 serving as one electrode of the capacitor 160. This enables production with a smaller number of processes, which can reduce production cost and increase the productivity.

For example, when the conductor 244 is formed to have a stacked-layer structure, the conductor 244 preferably includes a conductor with high oxidation resistance. In particular, a conductor with high oxidation resistance is preferably provided in a region in contact with the insulator 280 including the oxygen-excess region. Such a structure can prevent the conductor 244 from absorbing excess oxygen from the insulator 280. Furthermore, the conductor 244 preferably includes a conductor having a barrier property against hydrogen. In particular, a conductor having a barrier property against an impurity such as hydrogen is provided in a region in contact with the insulator 280 including the oxygen-excess region, whereby diffusion of the impurity of the conductor 244, diffusion of part of the conductor 244, and diffusion of an impurity from the outside through the conductor 244 can be prevented.

An conductor 116 is provided over the conductor 112 with insulators 130, 132, and 134 positioned therebetween. Note that the conductor 116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 116 is formed concurrently with another component such as a conductor, Cu (copper), Al (aluminum), or the like which is a low-resistance metal material may be used.

As illustrated in FIG. 34, the conductor 116 is provided to cover the top and side surfaces of the conductor 112 with the insulators 130, 132, and 134 positioned therebetween. That is, a capacitance is formed also on the side surface of the conductor 112, so that a capacitance per projected area of a capacitor can be increased. Thus, the semiconductor device can be reduced in area, highly integrated, and miniaturized.

An insulator 150 is provided over the conductor 116 and the insulator 134. The insulator 150 can be formed using a material similar to that used for forming the insulator 320. The insulator 150 covering the capacitor 160 may function as a planarization film that covers a roughness thereunder.

Note that in this structure, when the conductor 112 is formed, it is preferable to remove the top surface of the insulator 110 so that the depth of the removed part is greater than the total thickness of the insulators 130, 132, and 134. For example, by performing over-etching treatment, part of the insulator 110 can be removed concurrently. Furthermore, by forming the conductor 112 or the like by over-etching treatment, etching can be performed without leaving an etching residue.

By changing the kind of etching gas in the etching treatment, part of the insulator 110 can be removed efficiently.

After the conductor 112 and the conductor 124 are formed, part of the insulator 110 may be removed using the conductor 112 as a hard mask, for example.

After the conductor 112 is formed, a surface of the conductor 112 may be subjected to cleaning treatment. By the cleaning treatment, an etching residue or the like can be removed.

In this structure, the transistor 100 and the insulator 280 including the oxygen-excess region can be positioned between the insulator 212 and a stacked-layer structure of the insulators 282 and 284. The insulators 212, 282, and 284 have a barrier property that prevents diffusion of oxygen or impurities such as hydrogen and water.

Thus, oxygen released from the insulator 280 and the transistor 100 can be prevented from diffusing into the capacitor 160 or the layer where the transistor 300 is formed. Furthermore, impurities such as hydrogen and water can be prevented from diffusing from the layer over the insulator 282 and the layer under the insulator 212 into the transistor 100.

That is, oxygen can be efficiently supplied from the oxygen-excess region of the insulator 280 to the oxide where the channel is formed in the transistor 100, so that oxygen vacancies can be reduced. Moreover, oxygen vacancies can be prevented from being formed by impurities in the oxide where the channel is formed in the transistor 100. Thus, the oxide where a channel is formed in the transistor 100 can be an oxide semiconductor with a low density of defect states and stable characteristics. That is, a change in electrical characteristics of the transistor 100 can be prevented and the reliability can be improved.

In such a structure, the transistor 100 and the insulator 280 can be enclosed tightly. Thus, the oxide where the channel is formed in the transistor 100 can be an oxide semiconductor with a low density of defect states and stable characteristics. That is, a change in electrical characteristics of the transistor 100 can be prevented and the reliability can be improved.

Modification Example

FIG. 35 illustrates a modification example of this embodiment. FIG. 35 is different from FIG. 34 in the structures of the transistor 300 and the transistor 100.

In the transistor 300 illustrated in FIG. 35, the semiconductor region 312 (part of the substrate 305) in which the channel is formed has a protruding portion. Furthermore, the conductor 316 is provided to cover the top and side surfaces of the semiconductor region 312 with the insulator 314 positioned therebetween. Note that the conductor 316 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

The above is the description of the structure example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

Embodiment 5

In this embodiment, examples of CPUs including semiconductor devices such as the transistor of one embodiment of the present invention and the above-described memory device are described.

<Configuration of CPU>

Figure 36:
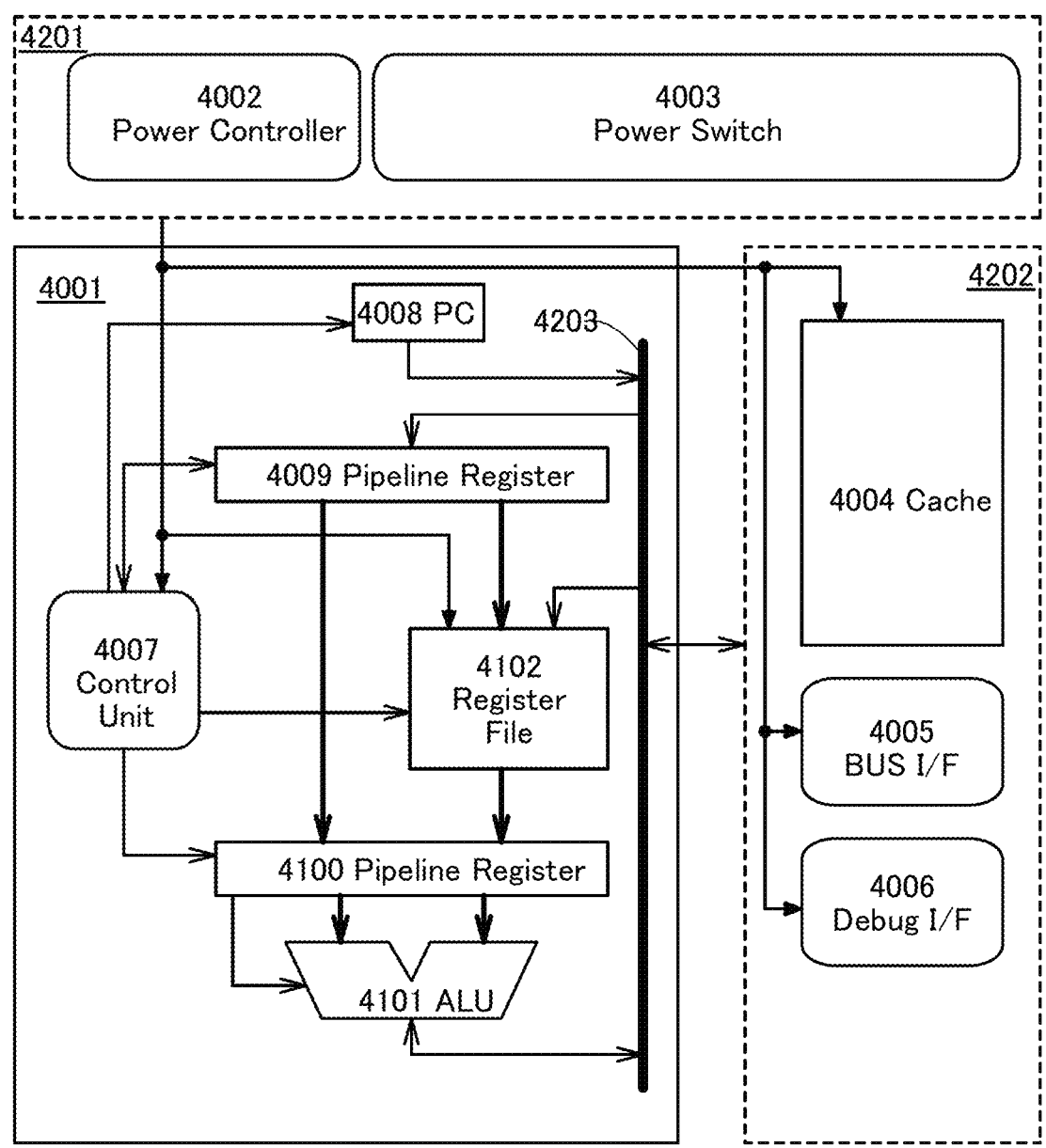
FIG. 36 is a block diagram illustrating a semiconductor device of one embodiment of the present invention.

A semiconductor device 4000 shown in FIG. 36 includes a CPU core 4001, a power management unit 4201, and a peripheral circuit 4202. The power management unit 4201 includes a power controller 4002 and a power switch 4003. The peripheral circuit 4202 includes a cache 4004 including cache memory, a bus interface (BUS I/F) 4005, and a debug interface (Debug I/F) 4006. The CPU core 4001 includes a data bus 4203, a control unit 4007, a PC (program counter) 4008, a pipeline register 4009, a pipeline register 4100, an ALU (arithmetic logic unit) 4101, and a register file 4102. Data is transmitted between the CPU core 4001 and the peripheral circuit 4202 such as the cache 4004 via the data bus 4203.

The semiconductor device (cell) can be used for many logic circuits typified by the power controller 4002 and the control unit 4007, particularly to all logic circuits that can be constituted using standard cells. Accordingly, the semiconductor device 4000 can be small. The semiconductor device 4000 can have reduced power consumption. The semiconductor device 4000 can have a higher operating speed. The semiconductor device 4000 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 4000, the semiconductor device 4000 can be small. The semiconductor device 4000 can have reduced power consumption. The semiconductor device 4000 can have a higher operating speed. Particularly when the Si transistors are only p-channel ones, the manufacturing cost can be reduced.

The control unit 4007 has functions of totally controlling operations of the PC 4008, the pipeline register 4009, the pipeline register 4100, the ALU 4101, the register file 4102, the cache 4004, the bus interface 4005, the debug interface 4006, and the power controller 4002 to decode and execute instructions contained in a program such as input applications.

The ALU 4101 has a function of performing a variety of arithmetic operations such as four arithmetic operations and logic operations.

The cache 4004 has a function of temporarily storing frequently-used data. The PC 4008 is a register having a function of storing an address of an instruction to be executed next. Note that although not shown in FIG. 36, the cache 4004 is provided with a cache controller for controlling the operation of the cache memory.

The pipeline register 4009 has a function of temporarily storing instruction data.

The register file 4102 includes a plurality of registers including a general purpose register and can store data that is read from the main memory, data obtained as a result of arithmetic operations in the ALU 4101, or the like.

The pipeline register 4100 has a function of temporarily storing data used for arithmetic operations of the ALU 4101, data obtained as a result of arithmetic operations of the ALU 4101, or the like.

The bus interface 4005 has a function as a path for data between the semiconductor device 4000 and various devices outside the semiconductor device 4000. The debug interface 4006 has a function as a path of a signal for inputting an instruction to control debugging to the semiconductor device 4000.

The power switch 4003 has a function of controlling supply of a power source voltage to various circuits included in the semiconductor device 4000 other than the power controller 4002. The above various circuits belong to several different power domains. The power switch 4003 controls whether the power supply voltage is supplied to the various circuits in the same power domain. In addition, the power controller 4002 has a function of controlling the operation of the power switch 4003.

The semiconductor device 4000 having the above structure is capable of performing power gating. A description will be given of an example of the power gating operation sequence.

First, by the CPU core 4001, timing for stopping the supply of the power supply voltage is set in a register of the power controller 4002. Then, an instruction of starting power gating is sent from the CPU core 4001 to the power controller 4002. Then, various registers and the cache 4004 included in the semiconductor device 4000 start data saving. Then, the power switch 4003 stops the supply of a power supply voltage to the various circuits other than the power controller 4002 included in the semiconductor device 4000. Then, an interrupt signal is input to the power controller 4002, whereby the supply of the power supply voltage to the various circuits included in the semiconductor device 4000 is started. Note that a counter may be provided in the power controller 4002 to be used to determine the timing of starting the supply of the power supply voltage regardless of input of an interrupt signal. Next, the various registers and the cache 4004 start data restoration. Then, the instruction is resumed in the control unit 4007.

Such power gating can be performed in the whole processor or one or a plurality of logic circuits forming the processor. Furthermore, power supply can be stopped even for a short time. Consequently, power consumption can be reduced finely in terms of a space or time.

In performing power gating, data held by the CPU core 4001 or the peripheral circuit 4202 is preferably saved in a short time. In that case, the power can be turned on or off in a short time, and an effect of saving power becomes significant.

In order that the data held by the CPU core 4001 or the peripheral circuit 4202 be saved in a short time, the data is preferably saved in a flip-flop circuit itself (referred to as a flip-flop circuit capable of backup operation). Furthermore, the data is preferably saved in an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation can save and restore data in a short time in some cases.

Figure 37:
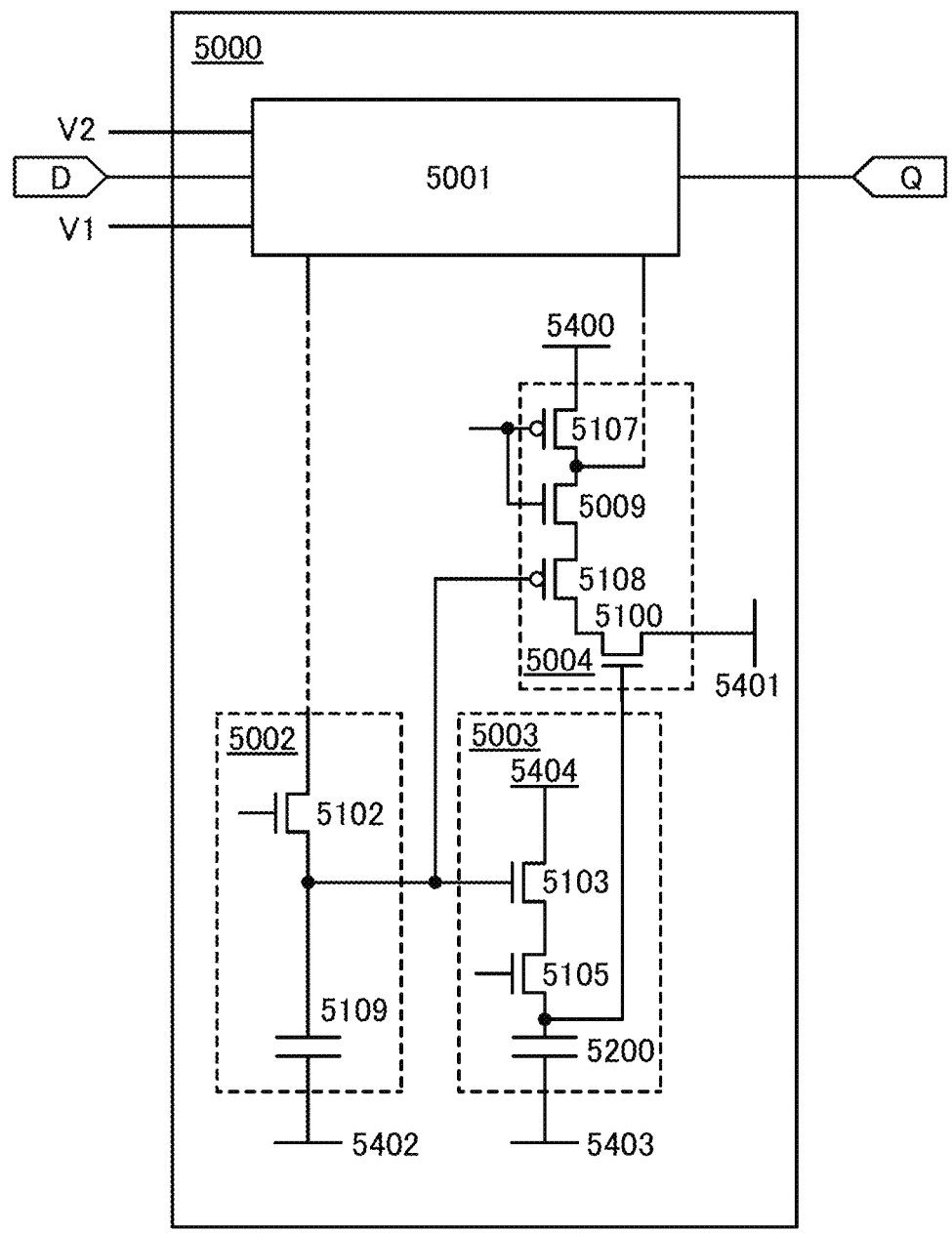
FIG. 37 is a circuit diagram illustrating a semiconductor device of one embodiment of the present invention.

An example of the flip-flop circuit capable of backup operation is described using FIG. 37.

A semiconductor device 5000 shown in FIG. 37 is an example of the flip-flop circuit capable of backup operation. The semiconductor device 5000 includes a first memory circuit 5001, a second memory circuit 5002, a third memory circuit 5003, and a read circuit 5004. As a power supply voltage, a potential difference between a potential V1 and a potential V2 is supplied to the semiconductor device 5000. One of the potential V1 and the potential V2 is at a high level, and the other is at a low level. An example of the structure of the semiconductor device 5000 when the potential V1 is at a low level and the potential V2 is at a high level will be described below.

The first memory circuit 5001 has a function of retaining data when a signal D including the data is input in a period during which the power supply voltage is supplied to the semiconductor device 5000. Furthermore, the first memory circuit 5001 outputs a signal Q including the retained data in the period during which the power supply voltage is supplied to the semiconductor device 5000. On the other hand, the first memory circuit 5001 cannot retain data in a period during which the power supply voltage is not supplied to the semiconductor device 5000. That is, the first memory circuit 5001 can be referred to as a volatile memory circuit.

The second memory circuit 5002 has a function of reading the data held in the first memory circuit 5001 to store (or save) it. The third memory circuit 5003 has a function of reading the data held in the second memory circuit 5002 to store (or save) it. The read circuit 5004 has a function of reading the data held in the second memory circuit 5002 or the third memory circuit 5003 to store (or restore) it in (to) the first memory circuit 5001.

In particular, the third memory circuit 5003 has a function of reading the data held in the second memory circuit 5002 to store (or save) it even in the period during which the power supply voltage is not supplied to the semiconductor device 5000.

As shown in FIG. 37, the second memory circuit 5002 includes a transistor 5102 and a capacitor 5109. The third memory circuit 5003 includes a transistor 5103, a transistor 5105, and a capacitor 5200. The read circuit 5004 includes a transistor 5100, a transistor 5108, a transistor 5009, and a transistor 5107.

The transistor 5102 has a function of charging and discharging the capacitor 5109 in accordance with data held in the first memory circuit 5001. The transistor 5102 is desirably capable of charging and discharging the capacitor 5109 at a high speed in accordance with data held in the first memory circuit 5001. Specifically, the transistor 5102 desirably contains crystalline silicon (preferably polycrystalline silicon, further preferably single crystal silicon) in a channel formation region.

The conduction state or the non-conduction state of the transistor 5103 is determined in accordance with the charge held in the capacitor 5109. The transistor 5105 has a function of charging and discharging the capacitor 5200 in accordance with the potential of a wiring 5404 when the transistor 5103 is in a conduction state. It is desirable that the off-state current of the transistor 5105 be extremely low. Specifically, the transistor 5105 desirably contains an oxide semiconductor (preferably an oxide containing In, Ga, and Zn) in a channel formation region.

Specific connection relations between the elements are described. One of a source electrode and a drain electrode of the transistor 5102 is connected to the first memory circuit 5001. The other of the source electrode and the drain electrode of the transistor 5102 is connected to one electrode of the capacitor 5109, a gate electrode of the transistor 5103, and a gate electrode of the transistor 5108. The other electrode of the capacitor 5109 is connected to the wiring 5402. One of a source electrode and a drain electrode of the transistor 5103 is connected to the wiring 5404. The other of the source electrode and the drain electrode of the transistor 5103 is connected to one of a source electrode and a drain electrode of the transistor 5105. The other of the source electrode and the drain electrode of the transistor 5105 is connected to one electrode of the capacitor 5200 and a gate electrode of the transistor 5100. The other electrode of the capacitor 5200 is connected to the wiring 5403. One of a source electrode and a drain electrode of the transistor 5100 is connected to a wiring 5401. The other of the source electrode and the drain electrode of the transistor 5100 is connected to one of a source electrode and a drain electrode of the transistor 5108. The other of the source electrode and the drain electrode of the transistor 5108 is connected to one of a source electrode and a drain electrode of the transistor 5009. The other of the source electrode and the drain electrode of the transistor 5009 is connected to one of a source electrode and a drain electrode of the transistor 5107 and the first memory circuit 5001. The other of the source electrode and the drain electrode of the transistor 5107 is connected to a wiring 5400. Furthermore, although a gate electrode of the transistor 5009 is connected to a gate electrode of the transistor 5107 in FIG. 37, the gate electrode of the transistor 5009 is not necessarily connected to the gate electrode of the transistor 5107.

The transistor described in the above embodiment as an example can be applied to the transistor 5105. Because of the low off-state current of the transistor 5105, the semiconductor device 5000 can retain data for a long time without power supply. The favorable switching characteristics of the transistor 5105 allow the semiconductor device 5000 to perform high-speed backup and recovery.

The structure described in this embodiment can be combined with any of the structures described in the other embodiments as appropriate.

Embodiment 6

In this embodiment, an example of an imaging device including the transistor or the like of one embodiment of the present invention is described.

<Imaging Device>

An imaging device of one embodiment of the present invention is described below.

Figure 38A:
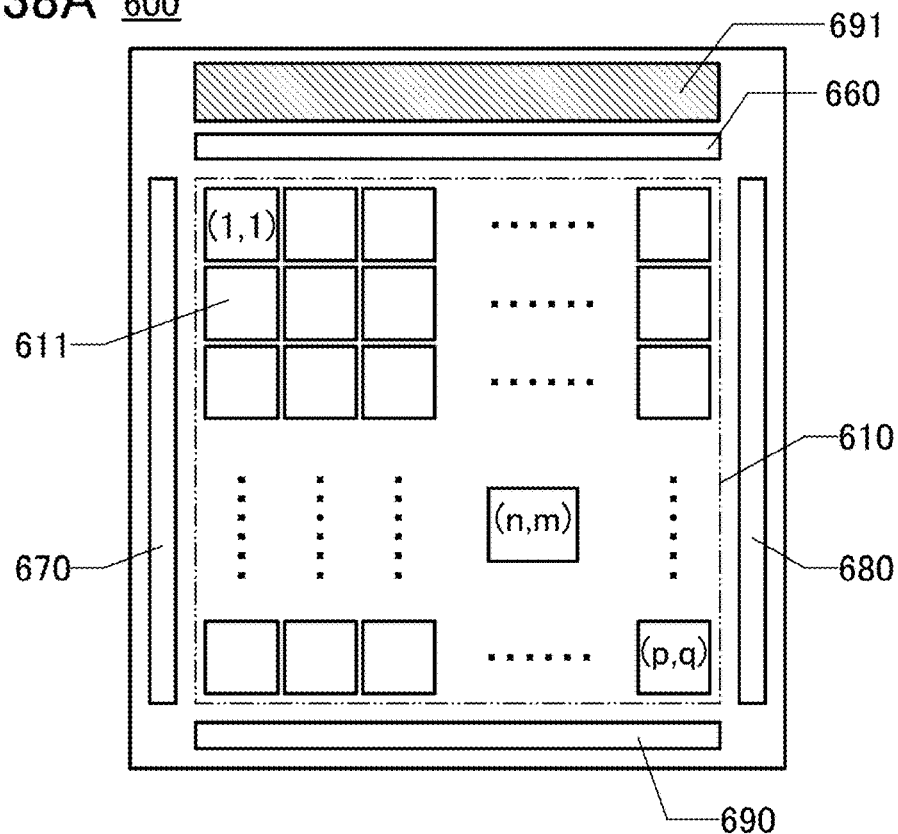
FIGS. 38A and 38B each a plan view illustrating an imaging device of one embodiment of the present invention.

FIG. 38A is a plan view illustrating an example of an imaging device 600 of one embodiment of the present invention. The imaging device 600 includes a pixel portion 610 and peripheral circuits for driving the pixel portion 610 (a peripheral circuit 660, a peripheral circuit 670, a peripheral circuit 680, and a peripheral circuit 690). The pixel portion 610 includes a plurality of pixels 611 arranged in a matrix with p rows and q columns (p and q are each an integer of 2 or more). The peripheral circuit 660, the peripheral circuit 670, the peripheral circuit 680, and the peripheral circuit 690 are each connected to the plurality of pixels 611, and a signal for driving the plurality of pixels 611 is supplied. In this specification and the like, in some cases, a "peripheral circuit" or a "driver circuit" indicate all of the peripheral circuits 660, 670, 680, and 690. For example, the peripheral circuit 660 can be regarded as part of the peripheral circuit.

The imaging device 600 preferably includes a light source 691. The light source 691 can emit detection light P1.

The peripheral circuit includes at least one of a logic circuit, a switch, a buffer, an amplifier circuit, and a converter circuit. The peripheral circuit may be formed over a substrate where the pixel portion 610 is formed. A semiconductor device such as an IC chip may be used as part or the whole of the peripheral circuit. Note that as the peripheral circuit, one or more of the peripheral circuits 660, 670, 680, and 690 may be omitted.

Figure 38B:
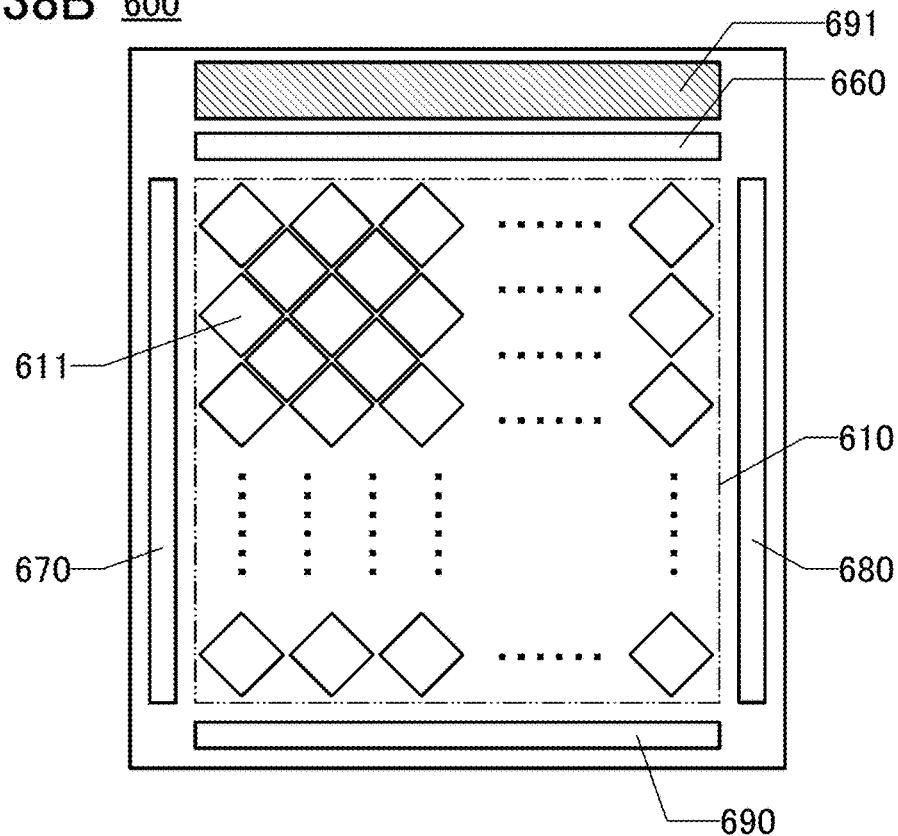

As illustrated in FIG. 38B, the pixels 611 may be provided to be inclined in the pixel portion 610 included in the imaging device 600. When the pixels 611 are obliquely arranged, the distance between pixels (pitch) can be shortened in the row direction and the column direction. Accordingly, the quality of an image taken with the imaging device 600 can be improved.

Configuration Example 1 of Pixel

The pixel 611 included in the imaging device 600 is formed with a plurality of subpixels 612, and each subpixel 612 is combined with a filter (color filter) which transmits light in a specific wavelength band, whereby data for achieving color image display can be obtained.

Figure 39A:
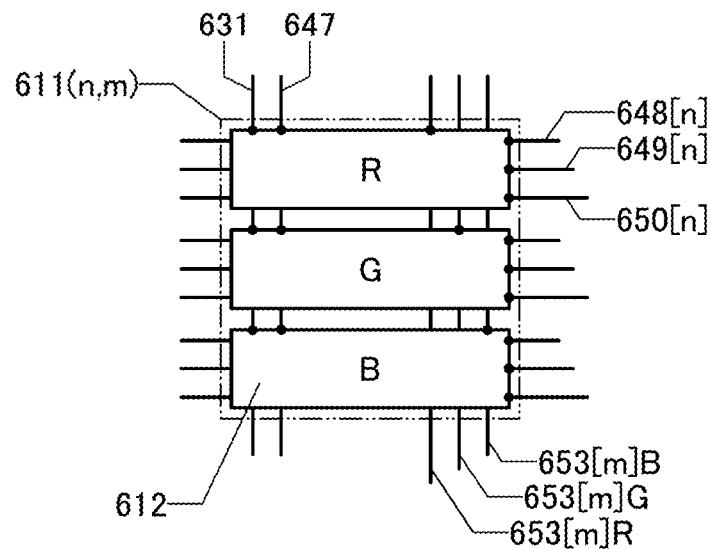
FIGS. 39A and 39B are plan views illustrating pixels of an imaging device of one embodiment of the present invention.

FIG. 39A is a top view showing an example of the pixel 611 with which a color image is obtained. The pixel 611 illustrated in FIG. 39A includes a subpixel 612 provided with a color filter that transmits light in a red (R) wavelength band (also referred to as a subpixel 612R), a subpixel 612 provided with a color filter that transmits light in a green (G) wavelength band (also referred to as a subpixel 612G), and a subpixel 612 provided with a color filter that transmits light in a blue (B) wavelength band (also referred to as a subpixel 612B). The subpixel 612 can function as a photosensor.

The subpixel 612 (the subpixel 612R, the subpixel 612G, and the subpixel 612B) is electrically connected to a wiring 631, a wiring 647, a wiring 648, a wiring 649, and a wiring 650. In addition, the subpixel 612R, the subpixel 612G, and the subpixel 612B are connected to respective wirings 653 which are independently provided. In this specification and the like, for example, the wiring 648, the wiring 649, and the wiring 650 that are connected to the pixel 611 in the n-th row are referred to as a wiring 648[n], a wiring 649[n], and a wiring 650[n]. For example, the wiring 653 connected to the pixel 611 in the m-th column is referred to as a wiring 653[m]. Note that in FIG. 39A, the wirings 653 connected to the subpixel 612R, the subpixel 612G, and the subpixel 612B in the pixel 611 in the m-th column are referred to as a wiring 653[m]R, a wiring 653[m]G, and a wiring 653[m]B. The subpixels 612 are electrically connected to the peripheral circuit through the above wirings.

Figure 39B:
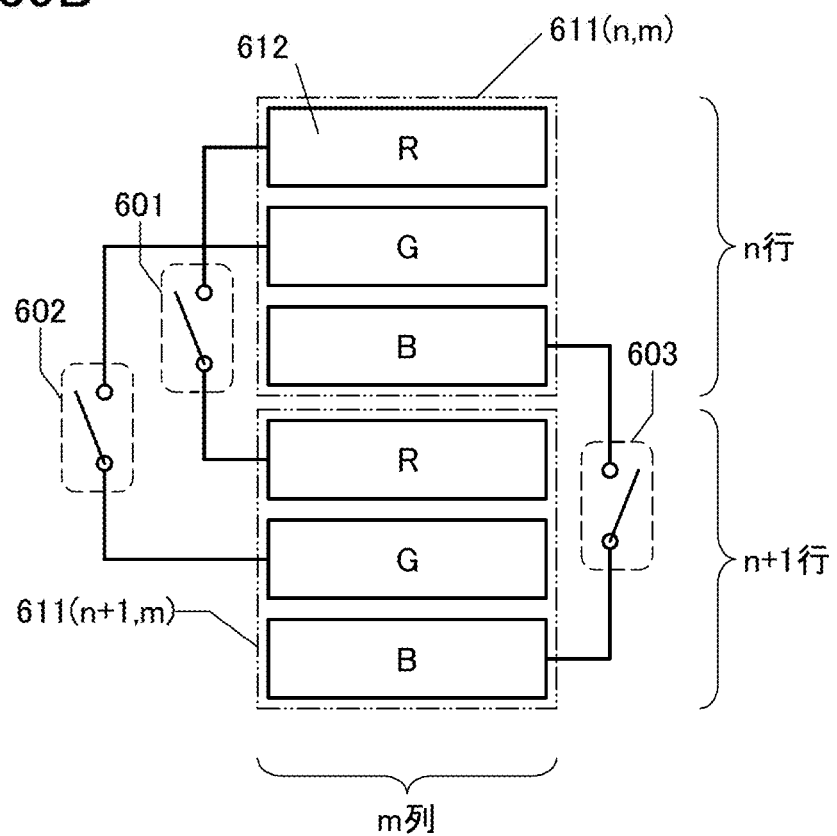

The imaging device 600 has a structure in which the subpixel 612 is electrically connected to the subpixel 612 in an adjacent pixel 611 which is provided with a color filter transmitting light in the same wavelength band as the subpixel 612, via a switch. FIG. 39B shows a connection example of the subpixels 612: the subpixel 612 in the pixel 611 arranged in the n-th (n is an integer greater than or equal to 1 and less than or equal to p) row and the m-th (m is an integer greater than or equal to 1 and less than or equal to q) column and the subpixel 612 in the adjacent pixel 611 arranged in an (n+1)-th row and the m-th column. In FIG. 39B, the subpixel 612R arranged in the n-th row and the m-th column and the subpixel 612R arranged in the (n+1)-th row and the m-th column are connected to each other via a switch 601. The subpixel 612G arranged in the n-th row and the m-th column and the subpixel 612G arranged in the (n+1)-th row and the m-th column are connected to each other via a switch 602. The subpixel 612B arranged in the n-th row and the m-th column and the subpixel 612B arranged in the (n+1)-th row and the m-th column are connected to each other via a switch 603.

The color filter used in the subpixel 612 is not limited to red (R), green (G), and blue (B) color filters, and color filters that transmit light of cyan (C), yellow (Y), and magenta (M) may be used. By provision of the subpixels 612 that sense light in three different wavelength bands in one pixel 611, a full-color image can be obtained.

The pixel 611 including the subpixel 612 provided with a color filter transmitting yellow (Y) light may be provided, in addition to the subpixels 612 provided with the color filters transmitting red (R), green (G), and blue (B) light. The pixel 611 including the subpixel 612 provided with a color filter transmitting blue (B) light may be provided, in addition to the subpixels 612 provided with the color filters transmitting cyan (C), yellow (Y), and magenta (M) light. When the subpixels 612 sensing light in four different wavelength bands are provided in one pixel 611, the reproducibility of colors of an obtained image can be increased.

For example, in FIG. 39A, in regard to the subpixel 612 sensing light in a red wavelength band, the subpixel 612 sensing light in a green wavelength band, and the subpixel 612 sensing light in a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 612 provided in the pixel 611 may be one, two or more subpixels are preferably provided. For example, when two or more subpixels 612 sensing light in the same wavelength band are provided, the redundancy is increased, and the reliability of the imaging device 600 can be increased.

When an infrared (IR) filter that transmits infrared light and absorbs or reflects visible light is used as the filter, the imaging device 600 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 611 may be provided with a lens. An arrangement example of the pixel 611, a filter 654, and a lens 655 is described with cross-sectional views in FIGS. 40A and 40B. With the lens 655, the photoelectric conversion element provided in the subpixel 612 scan receive incident light efficiently. Specifically, as illustrated in FIG. 40A, light 656 enters a photoelectric conversion element 620 through the lens 655, the filter 654 (a filter 654R, a filter 654G, and a filter 654B), a pixel circuit 630, and the like which are provided in the pixel 611.

As indicated by a region surrounded with dashed dotted lines, however, part of the light 656 indicated by arrows might be blocked by some wirings 657. Thus, a preferable structure is such that the lens 655 and the filter 654 are provided on the photoelectric conversion element 620 side as illustrated in FIG. 40B, whereby the photoelectric conversion element 620 can efficiently receive the light 656. When the light 656 enters the photoelectric conversion element 620 from the photoelectric conversion element 620 side, the imaging device 600 with high sensitivity can be provided.

Figure 40A:
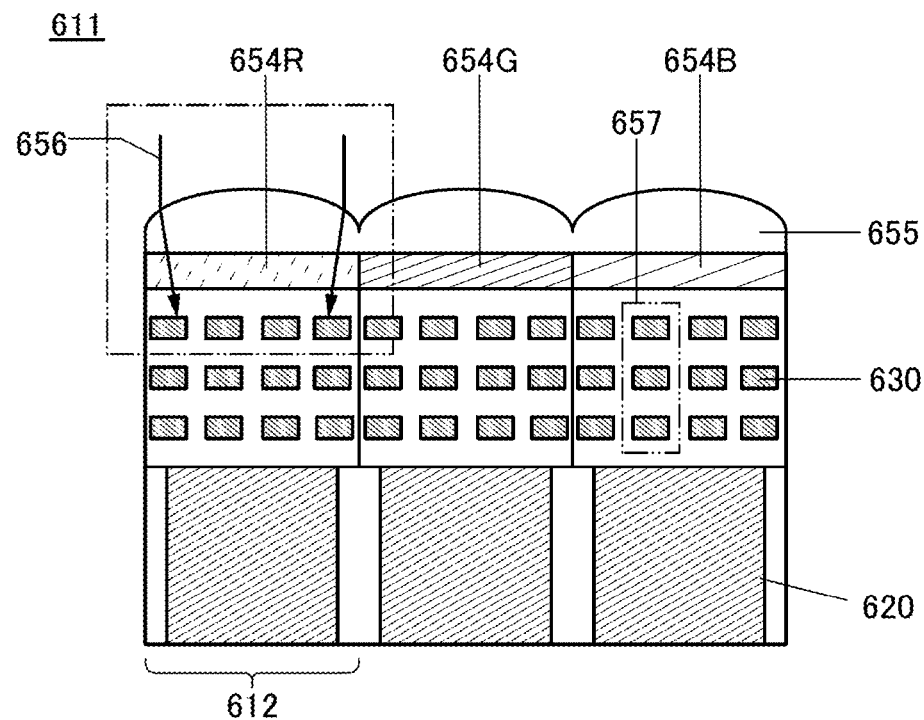
FIGS. 40A and 40B are cross-sectional views each illustrating an imaging device of one embodiment of the present invention.
Figure 40B:
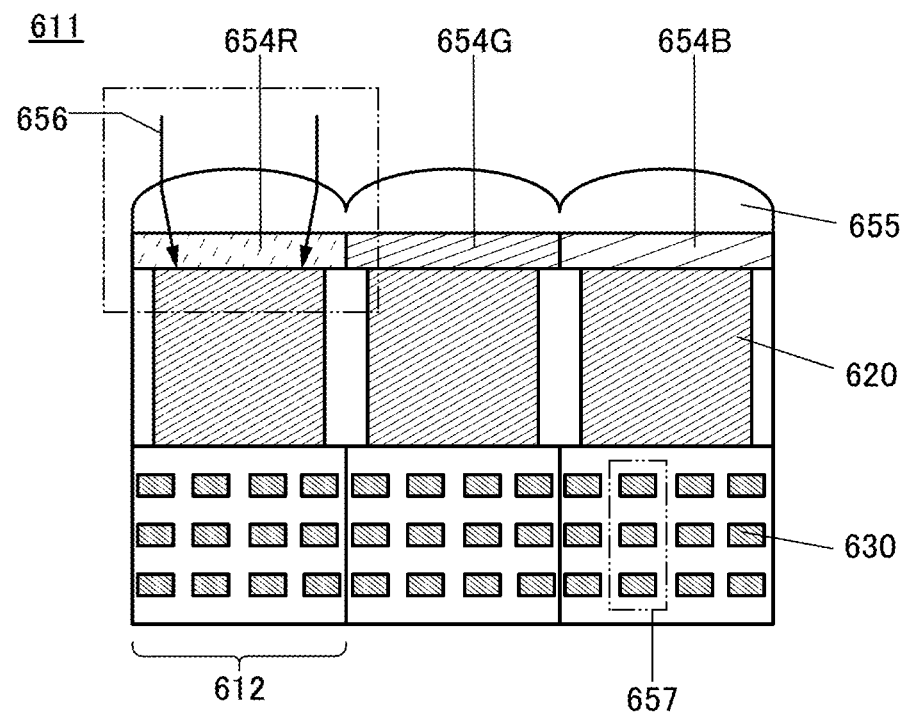

As the photoelectric conversion element 620 illustrated in FIGS. 40A and 40B, a photoelectric conversion element in which a p-n junction or a p-i-n junction is formed may be used.

The photoelectric conversion element 620 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 620, the photoelectric conversion element 620 can have a light absorption coefficient in a wide wavelength band, such as visible light, ultraviolet light, infrared light, X-rays, and gamma rays.

One pixel 611 included in the imaging device 600 may include the subpixel 612 with a first filter in addition to the subpixel 612 illustrated in FIGS. 40A and 40B.

Configuration Example 2 of Pixel

An example of a pixel including a transistor including silicon and a transistor including an oxide semiconductor is described below. A transistor similar to any of the transistors described in the above embodiment can be used as each of the transistors.

Figure 41:
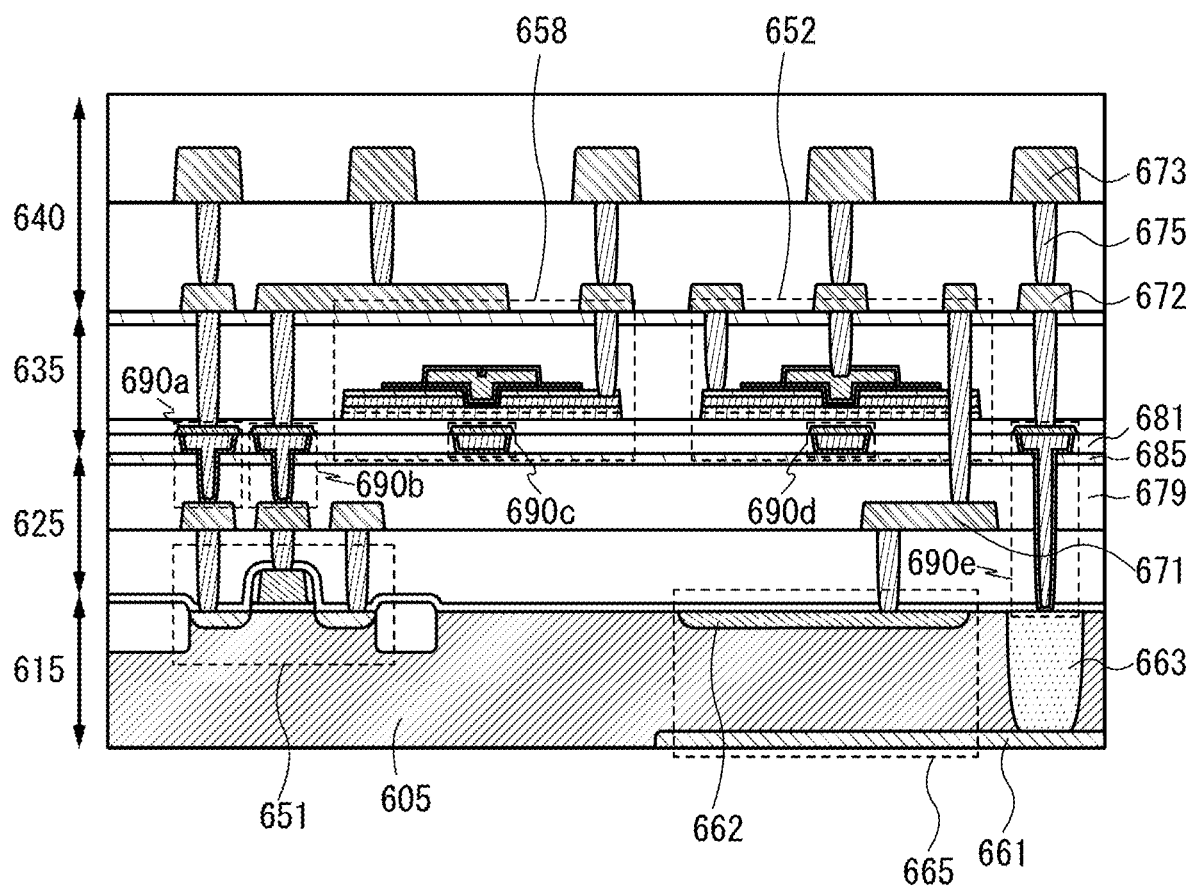
FIG. 41 is a cross-sectional view illustrating an imaging device of one embodiment of the present invention.

FIG. 41 is a cross-sectional view of an element included in an imaging device. The imaging device illustrated in FIG. 41 includes a transistor 651 including silicon over a silicon substrate 605, transistors 652 and 658 which include an oxide semiconductor and are stacked over the transistor 651, and a photodiode 665 provided in the silicon substrate 605. The transistors and the photodiode 665 are electrically connected to various plugs 675 and wirings 671. In addition, an anode 661 of the photodiode 665 is electrically connected to the plug 675 through a low-resistance region 663.

The imaging device includes a layer 615 including the transistor 651 provided on the silicon substrate 605 and the photodiode 665 provided in the silicon substrate 605, a layer 625 which is in contact with the layer 615 and includes the wirings 671, a layer 635 which is in contact with the layer 625 and includes the transistors 652 and 658, and a layer 640 which is in contact with the layer 635 and includes a wiring 672 and a wiring 673.

In the example of the cross-sectional view in FIG. 41, a light-receiving surface of the photodiode 665 is provided on the side opposite to a surface of the silicon substrate 605 where the transistor 651 is formed. With this structure, a light path can be secured without an influence of the transistors and the wirings. Thus, a pixel with a high aperture ratio can be formed. Note that the light-receiving surface of the photodiode 665 can be the same as the surface where the transistor 651 is formed.

In the case where a pixel is formed with use of only transistors including an oxide semiconductor, the layer 615 may include the transistor including an oxide semiconductor. Alternatively, the layer 615 may be omitted, and the pixel may include only transistors including an oxide semiconductor.

Note that the silicon substrate 605 may be an SOI substrate. Furthermore, the silicon substrate 605 can be replaced with a substrate made of germanium, silicon germanium, silicon carbide, gallium arsenide, aluminum gallium arsenide, indium phosphide, gallium nitride, or an organic semiconductor.

Here, an insulator 685 is provided between the layer 615 including the transistor 651 and the photodiode 665 and the layer 635 including the transistors 652 and 658. However, there is no limitation on the position of the insulator 685. An insulator 679 is provided under the insulator 685, and an insulator 681 is provided over the insulator 685.

Conductors 691a to 691e are provided in openings formed in the insulators 679 and 685. The conductors 691a, 691b, and 691e function as plugs and wirings. The conductor 691c functions as a back gate of the transistor 658. The conductor 691d functions as a back gate of the transistor 652.

Hydrogen in an insulator provided in the vicinity of a channel formation region of the transistor 651 terminates dangling bonds of silicon; accordingly, the reliability of the transistor 651 can be improved. In contrast, hydrogen in the insulator provided in the vicinity of the transistor 652, the transistor 658, and the like becomes one of factors generating a carrier in the oxide semiconductor. Thus, the hydrogen may cause a reduction of the reliability of the transistor 652, the transistor 658, and the like. For this reason, in the case where the transistor including an oxide semiconductor is provided over the transistor including a silicon-based semiconductor, it is preferable that the insulator 685 having a function of blocking hydrogen be provided between the transistors. When the hydrogen is confined in layers below the insulator 685, the reliability of the transistor 651 can be improved. In addition, the hydrogen can be prevented from diffusing from the layers below the insulator 685 to layers above the insulator 685; thus, the reliability of the transistor 652, the transistor 658, and the like can be increased. The conductors 691a, 691b, and 691e can prevent hydrogen from diffusing to the layers provided thereover through the via holes formed in the insulator 685, resulting in improvement in the reliability of the transistors 652 and 658 and the like.

In the cross-sectional view in FIG. 41, the photodiode 665 in the layer 615 and the transistor in the layer 635 can be formed so as to overlap with each other. Thus, the degree of integration of pixels can be increased. In other words, the resolution of the imaging device can be increased.

Part or the whole of the imaging device may be bent. The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction in size or weight of electronic devices using the imaging device, and the like, can be achieved. In addition, the quality of a captured image can be improved.

The structure described in this embodiment can be used as appropriate in combination with any of the structures described in the other embodiments.

Embodiment 7

In this embodiment, display devices each including the transistor or the like of one embodiment of the present invention will be described with reference to FIGS. 42A to 42C and FIGS. 43A and 43B.

<Structure of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or a TCP; a module in which a printed wiring board is provided at the end of TCP; and a module in which an IC is mounted directly on a display element by a COG method.

Figure 42A:
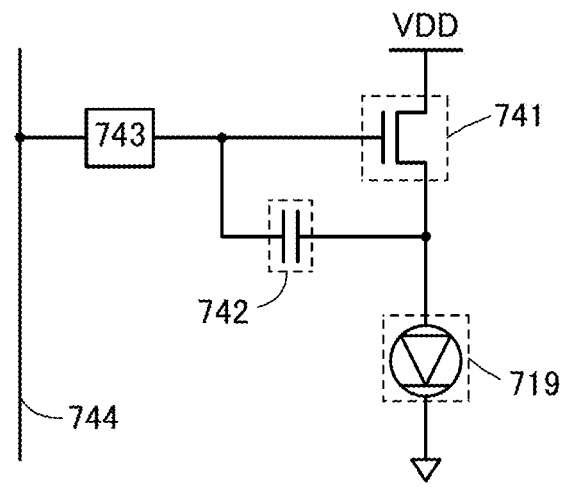
FIGS. 42A to 42C are a circuit diagram, a top view, and a cross-sectional view illustrating a semiconductor device of one embodiment of the present invention.
Figure 42B:
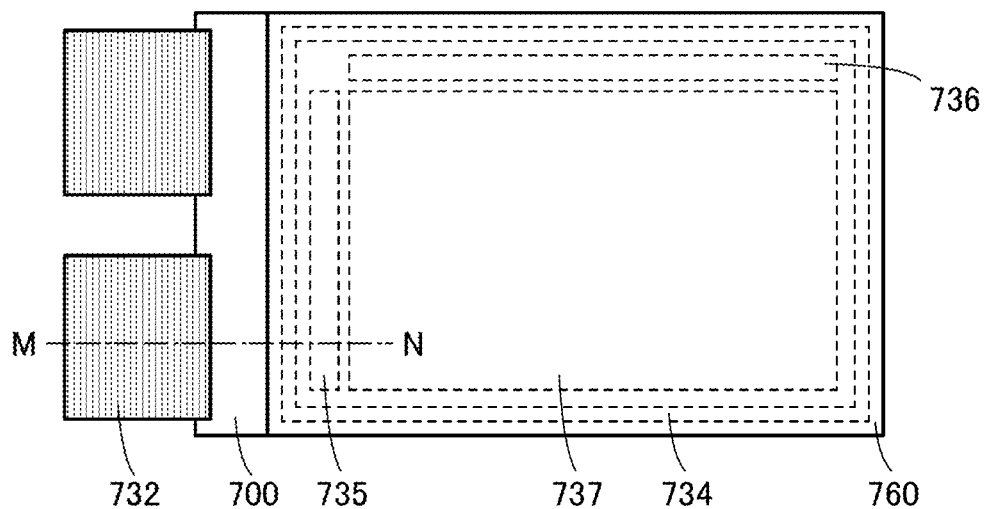
Figure 42C:
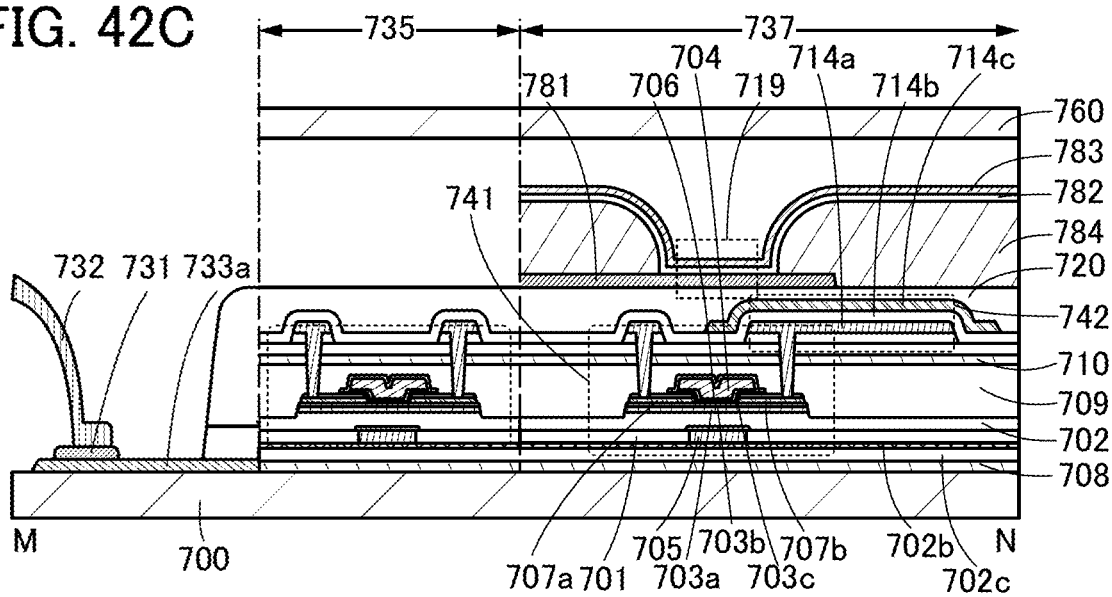

FIGS. 42A to 42C illustrate an example of an EL display device of one embodiment of the present invention. FIG. 42A is a circuit diagram of a pixel in an EL display device. FIG. 42B is a top view showing the whole of the EL display device. FIG. 42C is a cross-sectional view taken along part of dashed-dotted line M-N in FIG. 42B.

FIG. 42A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 42A includes a switching element 743, a transistor 741, a capacitor 742, and a light-emitting element 719.

Note that FIG. 42A and the like each illustrate an example of a circuit structure; therefore, a transistor can be provided additionally. In contrast, for each node in FIG. 42A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, the above-described transistor can be used, for example.

FIG. 42B is a top view of the EL display device. The EL display device includes a substrate 700, a substrate 760, a sealant 734, a driver circuit 735, a driver circuit 736, a pixel 737, and an FPC 732. The sealant 734 is provided between the substrate 700 and the substrate 760 so as to surround the pixel 737, the driver circuit 735, and the driver circuit 736. Note that the driver circuit 735 and/or the driver circuit 736 may be provided outside the sealant 734.

FIG. 42C is a cross-sectional view of the EL display device taken along part of dashed-dotted line M-N in FIG. 42B.

FIG. 42C illustrates the transistor 741 which includes an insulator 708 over the substrate 700, an insulator 702c over the insulator 708, an insulator 702b over the insulator 702c, a conductor 705 over the insulator 702b, an insulator 701 in which the conductor 705 is embedded, an insulator 702 over the insulator 701, an oxide 703a over the insulator 702, an oxide 703b over the oxide 703a, a conductor 707a and a conductor 707b over the oxide 703b, an oxide 703c over the oxide 703b, an insulator 706 over the oxide 703c, and a conductor 704 over the insulator 706. Note that the structure of the transistor 741 is just an example; the transistor 741 may have a structure different from that illustrated in FIG. 42C.

Therefore, in the transistor 741 illustrated in FIG. 42C, the conductor 704 and the conductor 705 each function as a gate electrode, the insulator 702 and the insulator 706 each function as a gate insulator, and the conductor 707a and the conductor 707b function as a source electrode and a drain electrode. Note that in some cases, electrical characteristics of the oxides 703a, 703b, and 703c change if light enters the oxides 703a, 703b, and 703c. To prevent this, it is preferable that one or both of the conductor 705 and the conductor 704 have a light-blocking property.

Note that an insulator 709 including an excess-oxygen region is provided over the transistor 741. The transistor 741 is provided between an insulator 708 and an insulator 710 having a barrier property.

FIG. 42C illustrates a structure including, as the capacitor 742, a conductor 714a over an insulator 710, an insulator 714b over the conductor 714a, and a conductor 714c over the insulator 714b.

In the capacitor 742, the conductor 714a serves as one electrode, and the conductor 714c serves as the other electrode.

The capacitor 742 illustrated in FIG. 42C has a large capacitance per area occupied by the capacitor. Therefore, the EL display device illustrated in FIG. 42C has high display quality.

An insulator 720 is provided over the transistor 741 and the capacitor 742. Here, the insulator 720 may have an opening reaching the conductor 707a or 707b that functions as the source or drain electrode of the transistor 741. A conductor 781 is provided over the insulator 720. The conductor 781 is electrically connected to the transistor 741 through the opening in the insulator 720.

A partition wall 784 having an opening portion reaching the conductor 781 is provided over the conductor 781. A light-emitting layer 782 in contact with the conductor 781 through the opening portion formed in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 43A:
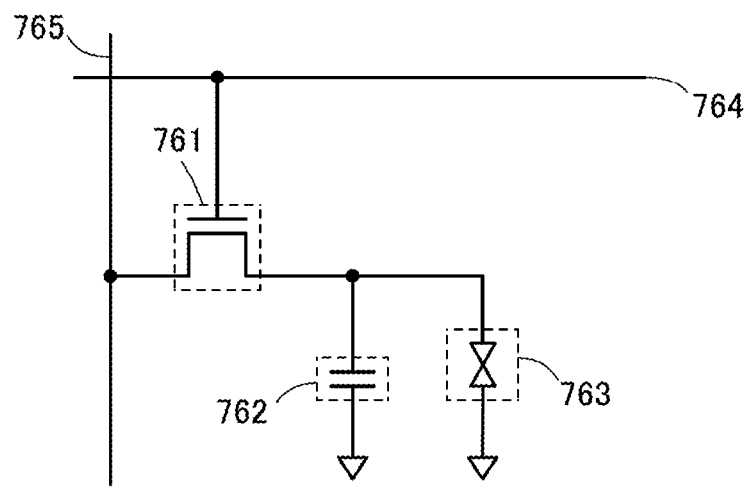
FIGS. 43A and 43B are a circuit diagram and a cross-sectional view illustrating a semiconductor device of one embodiment of the present invention.

FIG. 43A is a circuit diagram showing a structural example of a pixel of the liquid crystal display device. A pixel illustrated in FIG. 43A includes a transistor 761, a capacitor 762, and an element (liquid crystal element) 763 in which a space between a pair of electrodes is filled with a liquid crystal.

One of a source and a drain of the transistor 761 is electrically connected to a signal line 765, and a gate of the transistor 761 is electrically connected to a scan line 764.

One electrode of the capacitor 762 is electrically connected to the other of the source and the drain of the transistor 761, and the other electrode of the capacitor 762 is electrically connected to a wiring for supplying a common potential.

One electrode of the liquid crystal element 763 is electrically connected to the other of the source and the drain of the transistor 761, and the other electrode of the liquid crystal element 763 is electrically connected to a wiring for supplying a common potential. The common potential supplied to the wiring electrically connected to the other electrode of the capacitor 762 may be different from that supplied to the other electrode of the liquid crystal element 763.

Figure 43B:
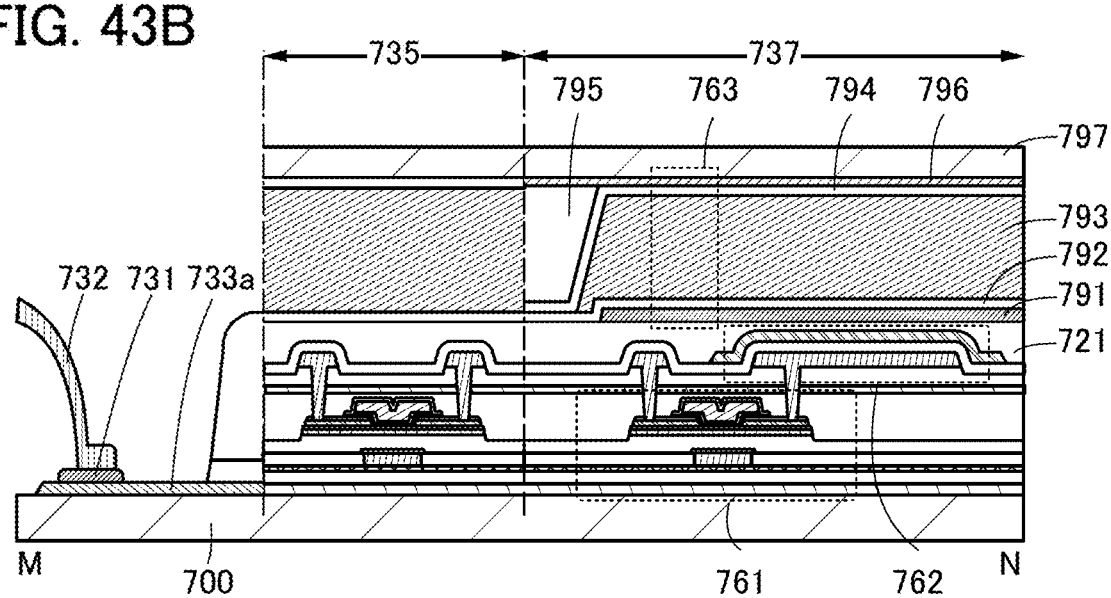

Note that the description of the liquid crystal display device is made on the assumption that the top view of the liquid crystal display device is similar to that of the EL display device. FIG. 43B is a cross-sectional view of the liquid crystal display device taken along part of dashed-dotted line M-N in FIG. 42B. In FIG. 43B, the FPC 732 is connected to the wiring 733a via the terminal 731. Note that the wiring 733a may be formed using the same kind of conductor as the conductor of the transistor 761 or using the same kind of semiconductor as the semiconductor of the transistor 761.

For the transistor 761, the description of the transistor 741 is referred to. For the capacitor 762, the description of the capacitor 742 is referred to. Note that the structure of the capacitor 762 in FIG. 43B corresponds to, but is not limited to, the structure of the capacitor 742 in FIG. 42C.

Note that in the case where an oxide semiconductor is used as the semiconductor of the transistor 761, the off-state current of the transistor 761 can be extremely small. Therefore, an electric charge held in the capacitor 762 is unlikely to leak, so that the voltage applied to the liquid crystal element 763 can be maintained for a long time. Accordingly, the transistor 761 can be kept off during a period in which moving images with few motions or a still image are/is displayed, whereby power for the operation of the transistor 761 can be saved in that period; accordingly a liquid crystal display device with low power consumption can be provided. Furthermore, the area occupied by the capacitor 762 can be reduced; thus, a liquid crystal display device with a high aperture ratio or a high-resolution liquid crystal display device can be provided.

An insulator 721 is provided over the transistor 761 and the capacitor 762. The insulator 721 has an opening reaching the transistor 761. A conductor 791 is provided over the insulator 721. The conductor 791 is electrically connected to the transistor 761 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of a display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display devices having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structure described above in this embodiment can be combined with any of the structures described in the other embodiments as appropriate.

Embodiment 8

In this embodiment, circuit configuration examples to which the OS transistors described in the above embodiment can be used are described with reference to FIGS. 44A to 44C, FIGS. 45A to 45C, FIGS. 46A and 46B, and FIGS. 47A and 47B.

Figure 44A:
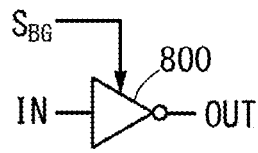
FIGS. 44A to 44C are circuit diagrams and a timing chart illustrating one embodiment of the present invention.

FIG. 44A is a circuit diagram of an inverter. An inverter 800 outputs a signal whose logic is inverted from the logic of a signal supplied to an input terminal IN from an output terminal OUT. The inverter 800 includes a plurality of OS transistors. A signal $S_{BG}$ can switch electrical characteristics of the OS transistors.

Figure 44B:
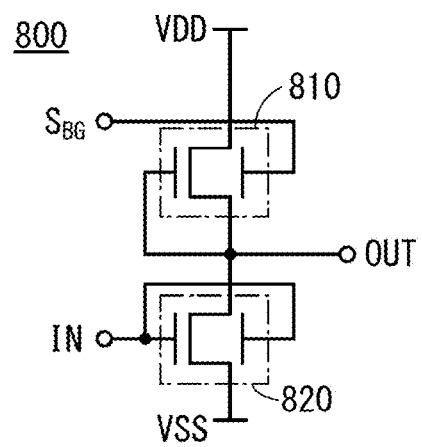

FIG. 44B illustrates an example of the inverter 800. The inverter 800 includes an OS transistor 810 and an OS transistor 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 44C:
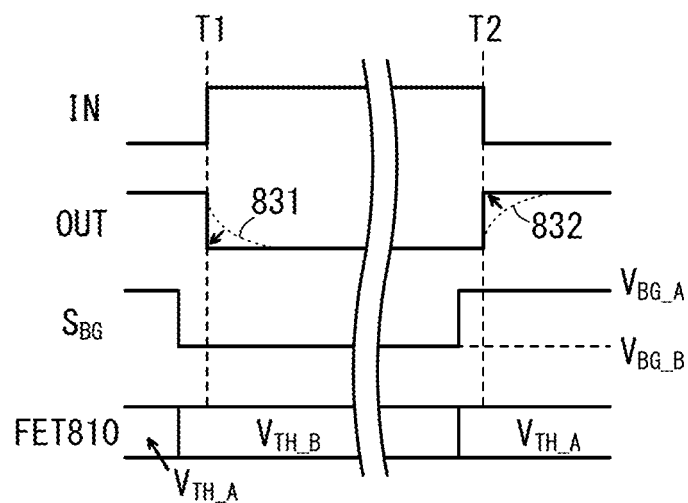

FIG. 44C is a timing chart illustrating the operation of the inverter 800. The timing chart in FIG. 44C illustrates changes of a signal waveform of the input terminal IN, a signal waveform of the output terminal OUT, a signal waveform of the signal $S_{BG}$, and the threshold voltage of the OS transistor 810 (FET 810).

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG}$ B is applied to the second gate.

Figure 45A:
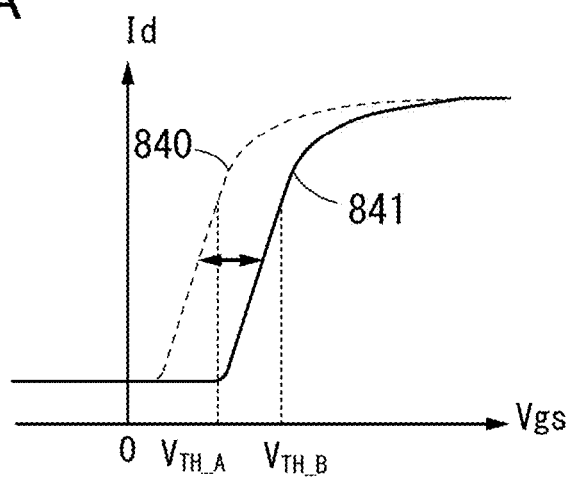
FIGS. 45A to 45C are a graph and circuit diagrams illustrating one embodiment of the present invention.

To visualize the above description, FIG. 45A shows a $V_g$-$I_d$ curve, which is one of indicators of the transistor's electrical characteristics.

When a high voltage such as the voltage $V_{BG\_A}$ is applied to the second gate, the electrical characteristics of the OS transistor 810 can be shifted to match a curve shown by a dashed line 840 in FIG. 45A. When a low voltage such as the voltage $V_{BG\_B}$ is applied to the second gate, the electrical characteristics of the OS transistor 810 can be shifted to match a curve shown by a solid line 841 in FIG. 45A. As shown in FIG. 45A, switching the signal $S_{BG}$ between the voltage $V_{BG\_A}$ and the voltage $V_{BG\_B}$ enables the threshold voltage of the OS transistor 810 to be shifted in the negative direction or the positive direction.

Figure 45B:
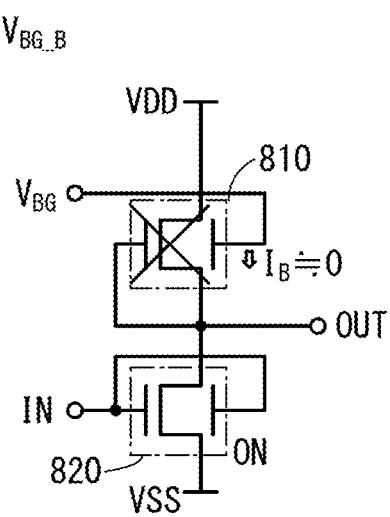

The shift of the threshold voltage in the positive direction toward the threshold voltage $V_{TH\_B}$ can make a current less likely to flow in the OS transistor 810. FIG. 45B visualizes the state. As illustrated in FIG. 45B, a current $I_B$ that flows in the OS transistor 810 can be extremely low. Thus, when a signal supplied to the input terminal IN is at a high level and the OS transistor 820 is on (ON), the voltage of the output terminal OUT can drop sharply.

Since a state in which a current is less likely to flow in the OS transistor 810 as illustrated in FIG. 45B can be obtained, a signal waveform 831 of the output terminal in the timing chart in FIG. 44C can be made steep. Shoot-through current between the wiring that supplies the voltage VDD and the wiring that supplies the voltage VSS can be low, leading to low-power operation.

Figure 45C:
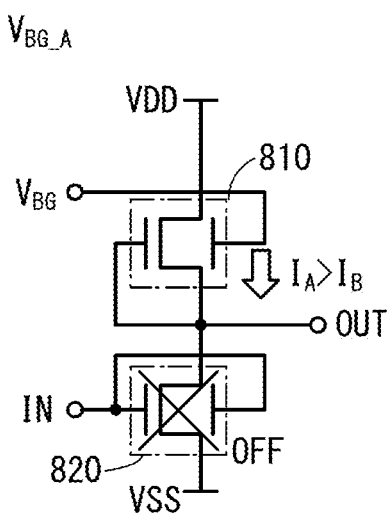

The shift of the threshold voltage in the negative direction toward the threshold voltage $V_{TH\_A}$ can make a current flow easily in the OS transistor 810. FIG. 45C visualizes the state. As illustrated in FIG. 45C, a current IA flowing at this time can be higher than at least the current $I_B$. Thus, when a signal supplied to the input terminal IN is at a low level and the OS transistor 820 is off (OFF), the voltage of the output terminal OUT can be increased sharply.

Since a state in which current is likely to flow in the OS transistor 810 as illustrated in FIG. 45C can be obtained, a signal waveform 832 of the output terminal in the timing chart in FIG. 44C can be made steep.

Note that the threshold voltage of the OS transistor 810 is preferably controlled by the signal $S_{BG}$ before the state of the OS transistor 820 is switched, i.e., before time T1 or time T2. For example, as in FIG. 44C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 44C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 46A:
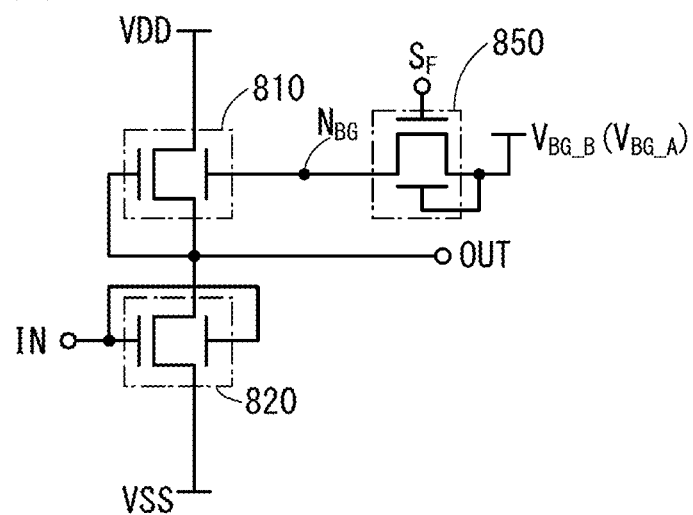
FIGS. 46A and 46B are a circuit diagram and a timing chart illustrating one embodiment of the present invention.

Although the timing chart in FIG. 44C illustrates the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 46A illustrates an example of such a circuit configuration.

The circuit configuration in FIG. 46A is the same as that in FIG. 44B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 46B:
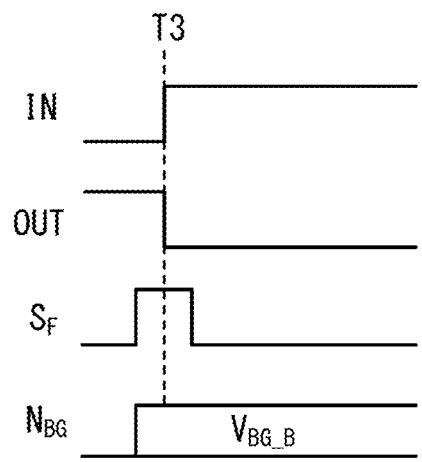

The operation with the circuit configuration in FIG. 46A is described with reference to a timing chart in FIG. 46B.

The voltage for controlling the threshold voltage of the OS transistor 810 is supplied to the second gate of the OS transistor 810 before time T3 at which the level of the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off and the node $N_{BG}$ is in a state that is very close to a floating state. Therefore, the number of times the voltage $V_{BG\_B}$ is supplied to the second gate of the OS transistor 850 can be reduced and accordingly, the power consumption for rewriting the voltage $V_{BG\_B}$ can be reduced.

Figure 47A:
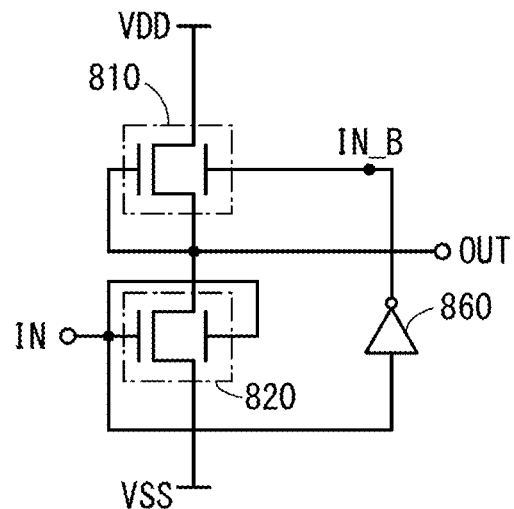
FIGS. 47A and 47B are a circuit diagram and a timing chart illustrating one embodiment of the present invention.

Although FIG. 44B and FIG. 46A each illustrate the case where the voltage is supplied to the second gate of the OS transistor 810 by control from the outside, a different structure may be employed in which voltage for controlling the threshold voltage is generated on the basis of the signal supplied to the input terminal IN and supplied to the second gate of the OS transistor 810, for example. FIG. 47A illustrates an example of such a circuit configuration.

The circuit configuration in FIG. 47A is the same as that in FIG. 44B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 47A is described with reference to a timing chart in FIG. 47B. The timing chart in FIG. 47B illustrates changes of a signal waveform of the input terminal IN, a signal waveform of the output terminal OUT, an output waveform IN_B of the CMOS inverter 860, and a threshold voltage of the OS transistor 810 (FET 810).

The output waveform IN_B which corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIGS. 44A to 44C. For example, the signal supplied to the input terminal IN is at a high level and the OS transistor 820 is turned on at time T4 in FIG. 47B. At this time, the output waveform IN_B is at a low level. Accordingly, a current can be made less likely to flow in the OS transistor 810; thus, the voltage of the output terminal OUT can be sharply decreased.

Figure 47B:
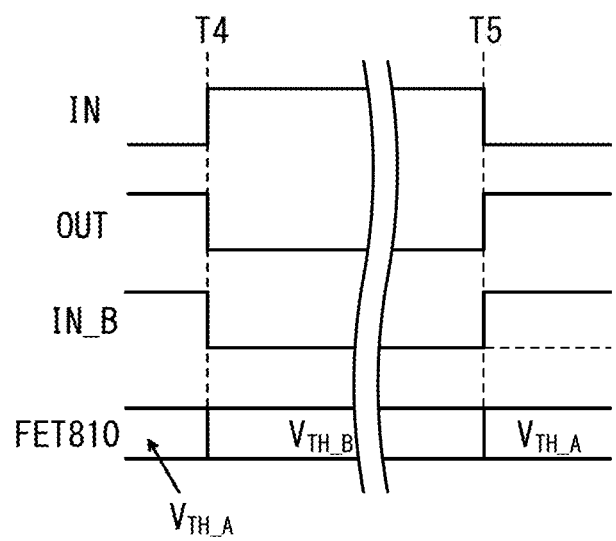

Moreover, the signal supplied to the input terminal IN is at a low level and the OS transistor 820 is turned off at time T5 in FIG. 47B. At this time, the output waveform IN_B is at a high level. Accordingly, a current can easily flow in the OS transistor 810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

The structure described above in this embodiment can be combined with any of the structures described in the other embodiments as appropriate.

Embodiment 9

In this embodiment, examples of a semiconductor device which includes a plurality of circuits including OS transistors described in the above embodiment are described with reference to FIGS. 48A to 48E, FIGS. 49A and 49B, FIGS.

50A and 50B, FIGS. 51A to 51C, FIGS. 52 and 52B, FIGS. 53A to 53C, and FIGS. 54A and 54B.

Figure 48A:
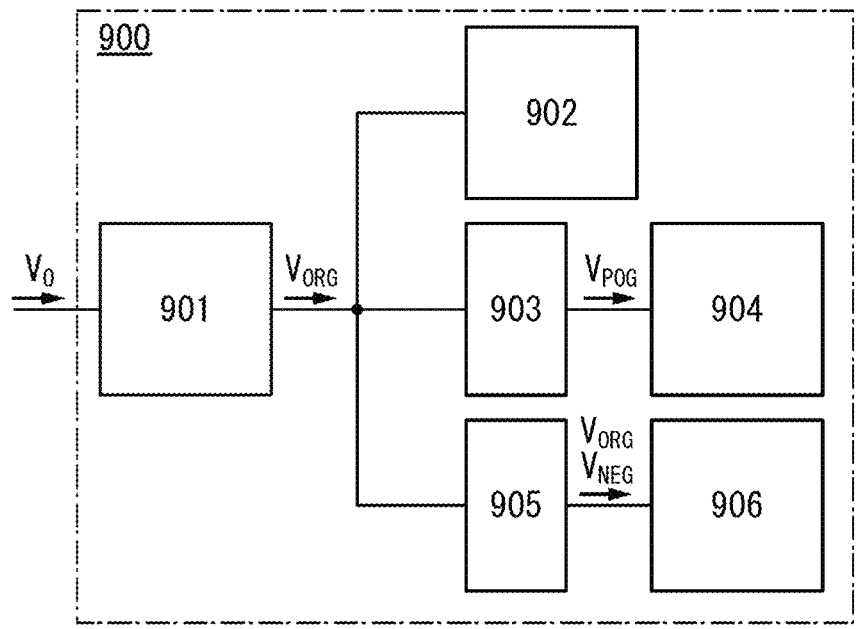
FIGS. 48A to 48E are a block diagram, circuit diagrams, and waveform diagrams illustrating one embodiment of the present invention.

FIG. 48A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without the supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}$>$V_{SS}$). For example, the power supply voltage of the circuit 904 is a voltage applied on the basis of a voltage $V_{POG}$ and the voltage $V_{SS}$ ($V_{POG}$>$V_{ORG}$). For example, the power supply voltages of the circuit 906 are voltages applied on the basis of the voltage $V_{ORG}$ and a voltage $V_{NEG}$ ($V_{ORG}$>$V_{SS}$>$V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 48B:
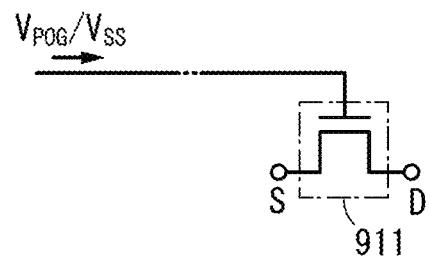
Figure 48C:
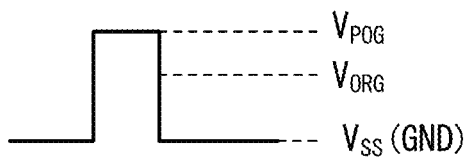

FIG. 48B illustrates an example of the circuit 904 that operates with the voltage $V_{POG}$ and FIG. 48C illustrates an example of a waveform of a signal for operating the circuit 904.

FIG. 48B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ at the time when the transistor 911 is turned on and on the basis of the voltage $V_{SS}$ at the time when the transistor 911 is turned off. As shown in FIG. 48C, the voltage $V_{POG}$ is higher than the voltage $V_{ORG}$. Thus, a source (S) and a drain (D) of the transistor 911 can be electrically connected to each other without fail. As a result, the frequency of malfunction of the circuit 904 can be reduced.

Figure 48D:
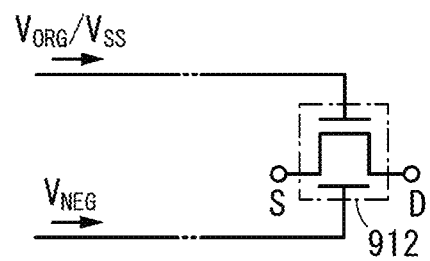
Figure 48E:
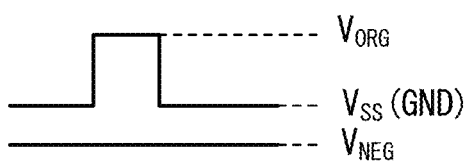

FIG. 48D illustrates an example of the circuit 906 that operates with the voltage $V_{NEG}$ and FIG. 48E illustrates an example of a waveform of a signal for operating the circuit 906.

FIG. 48D illustrates a transistor 912 having a back gate. A signal supplied to a gate of the transistor 912 is generated on the basis of, for example, the voltage $V_{ORG}$ and the voltage $V_{SS}$. The signal has generated on the basis of the voltage $V_{ORG}$ at the time when the transistor 912 is turned on and on the basis of the voltage $V_{SS}$ at the time when the transistor 912 is turned off. A signal supplied to the back gate of the transistor 912 is generated on the basis of the voltage $V_{NEG}$. As shown in FIG. 48E, the voltage $V_{NEG}$ is lower than the voltage $V_{SS}$ (GND). Therefore, the threshold voltage of the transistor 912 can be controlled so as to be shifted in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may be supplied to the back gate of the transistor 912.

Figure 49A:
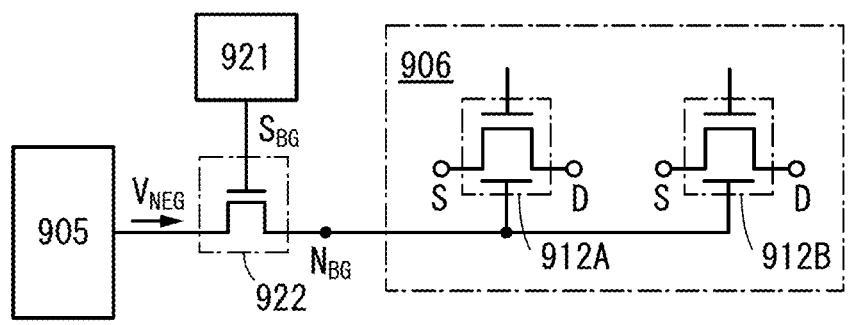
FIGS. 49A and 49B are a circuit diagram and a timing chart illustrating one embodiment of the present invention.
Figure 49B:
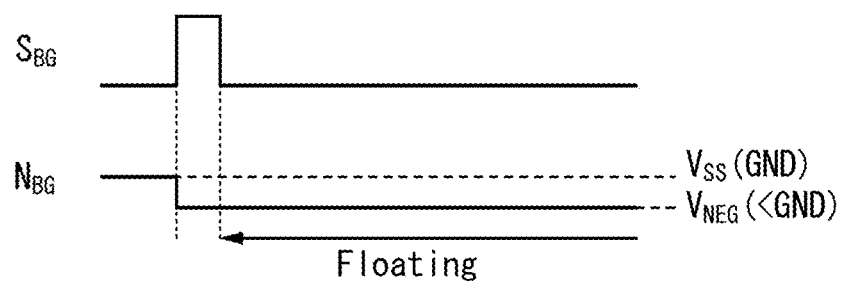

FIGS. 49A and 49B illustrate a modification example of FIGS. 48D and 48E.

In a circuit diagram illustrated in FIG. 49A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the conduction state of the transistor 922. Transistors 912A and 912B included in the circuit 906 are the same OS transistors as the transistor 922.

A timing chart in FIG. 49B shows changes in a potential of the control signal $S_{BG}$ and a potential of the node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 50A:
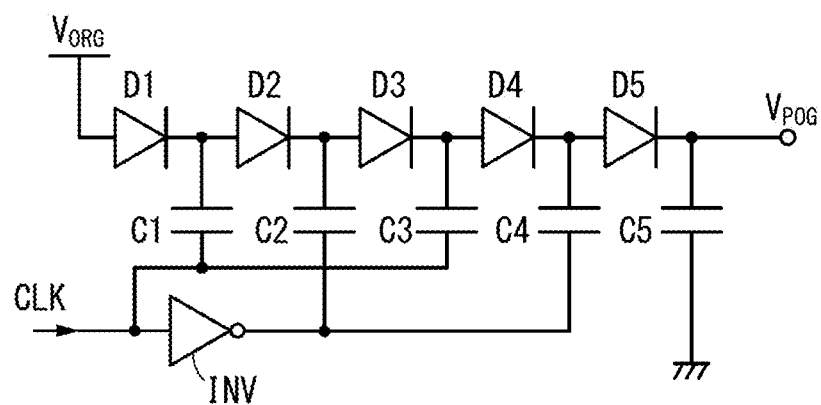
FIGS. 50A and 50B are each a circuit diagram illustrating one embodiment of the present invention.

FIG. 50A illustrates an example of a circuit configuration applicable to the above-described voltage generation circuit 903. The voltage generation circuit 903 illustrated in FIG. 50A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that a forward voltage of the diodes D1 to D5 is 0 V. A desired voltage $V_{POG}$ can be obtained when the number of stages of the charge pump is changed.

Figure 50B:
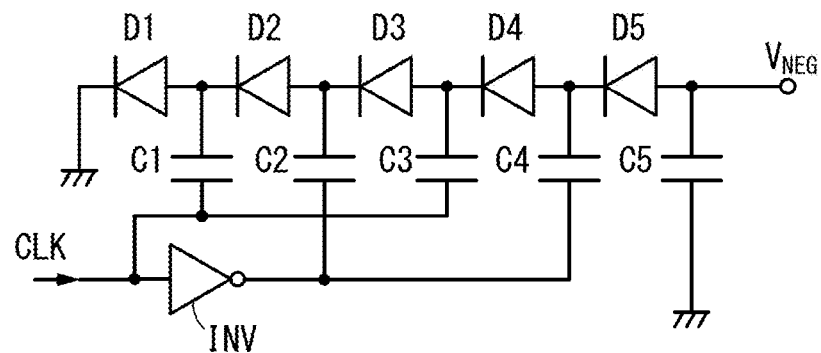

FIG. 50B illustrates an example of a circuit configuration applicable to the above-described voltage generation circuit 905. The voltage generation circuit 905 illustrated in FIG. 50B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that a forward voltage of the diodes D1 to D5 is 0 V. A desired voltage $V_{NEG}$ can be obtained when the number of stages of the charge pump is changed.

The circuit configuration of the voltage generation circuit 903 is not limited to the configuration of the circuit diagram illustrated in FIG. 50A. Modification examples of the voltage generation circuit 903 are shown in FIGS. 51A to 51C and FIGS. 52A and 52B.

Figure 51A:
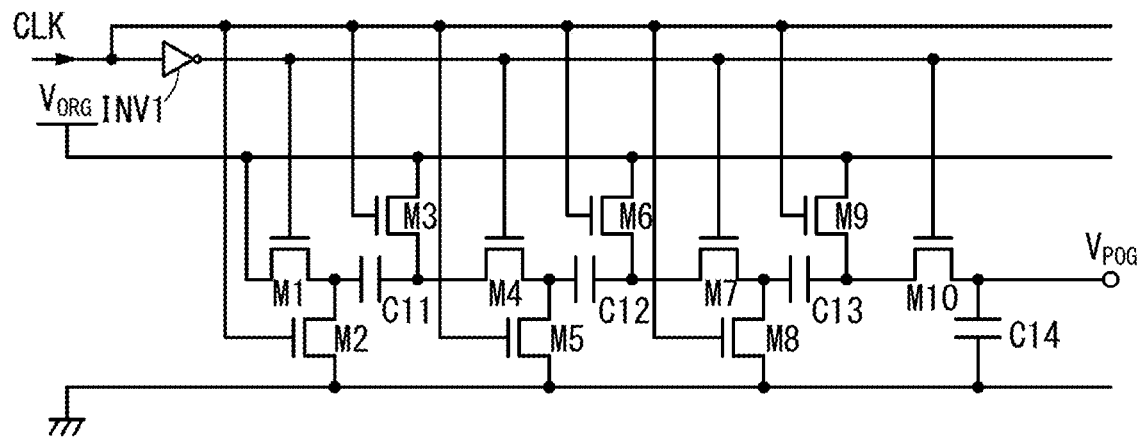
FIGS. 51A to 51C are each a circuit diagram illustrating one embodiment of the present invention.

The voltage generation circuit 903A illustrated in FIG. 51A includes transistors M1 to M10, capacitors C11 to C14, and an inverter INV1. The clock signal CLK is supplied to gates of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. A desired voltage $V_{POG}$ can be obtained when the number of stages is changed. In the voltage generation circuit 903A in FIG. 51A, off-state current of each of the transistors M1 to M10 can be low when the transistors M1 to M10 are OS transistors, and leakage of charge held in the capacitors C11 to C14 can be suppressed. Accordingly, raising from the voltage $V_{ORG}$ to the voltage $V_{POG}$ can be efficiently performed.

Figure 51B:
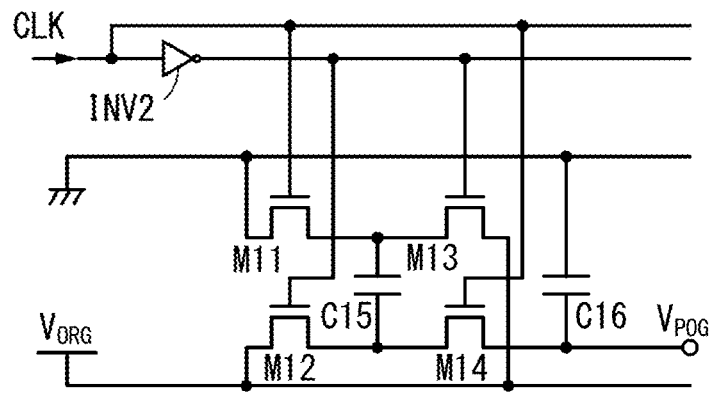

The voltage generation circuit 903B illustrated in FIG. 51B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 903B in FIG. 51B, off-state current of each of the transistors M11 to M14 can be low when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed.

Figure 51C:
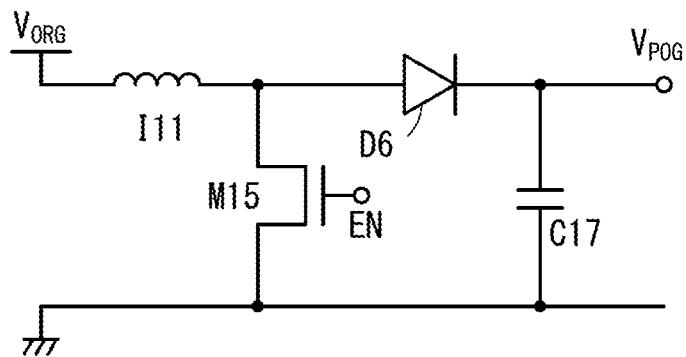

The voltage generation circuit 903C in FIG. 51C includes an inductor I11, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 51C increases the voltage using the inductor I11, the voltage can be increased efficiently.

Figure 52A:
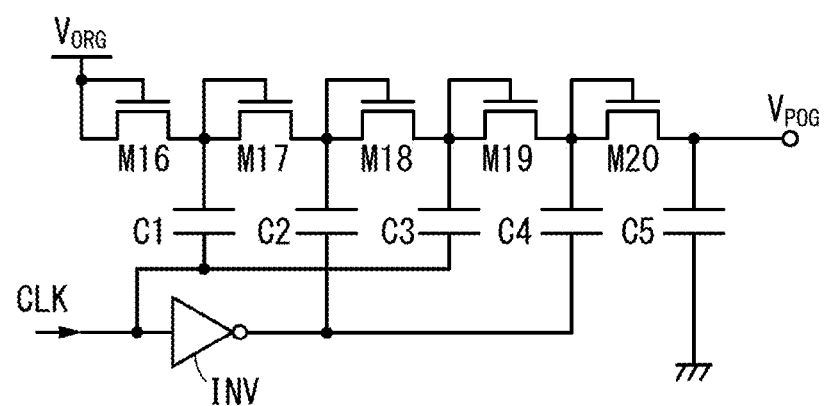
FIGS. 52A and 52B are each a circuit diagram illustrating one embodiment of the present invention.

A voltage generation circuit 903D in FIG. 52A has a configuration in which the diodes D1 to D5 of the voltage generation circuit 903 in FIG. 50A are replaced with diode-connected transistors M16 to M20. In the voltage generation circuit 903D in FIG. 52A, when the OS transistors are used as the transistors M16 to M20, the off-state current can be reduced, so that leakage of charge held in the capacitors C1 to C5 can be inhibited. Thus, efficient voltage increase from the voltage $V_{ORG}$ to the voltage $V_{POG}$ is possible.

Figure 52B:
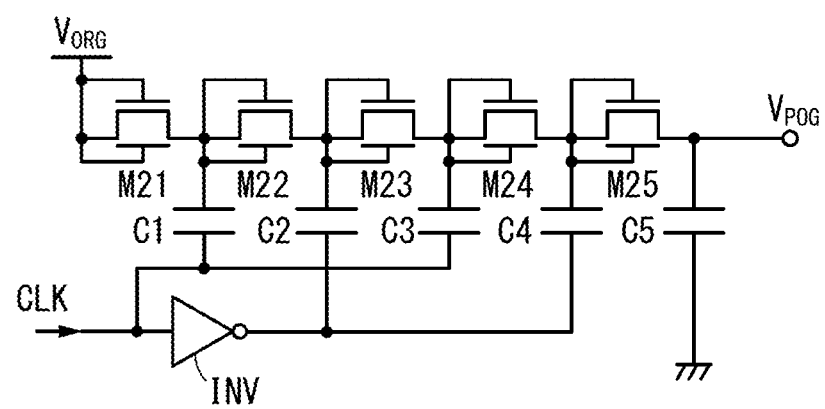
Figure 53A:
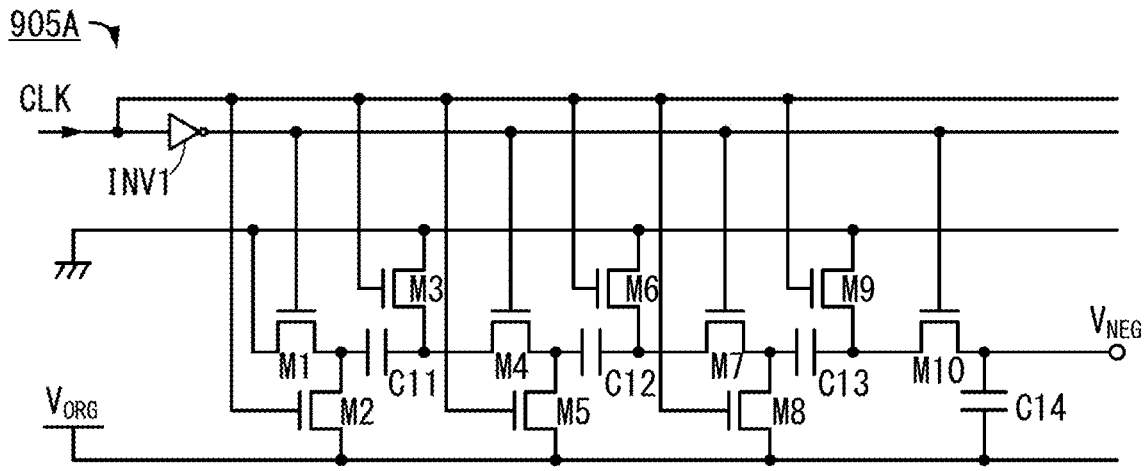
FIGS. 53A to 53C are each a circuit diagram illustrating one embodiment of the present invention.
Figure 53B:
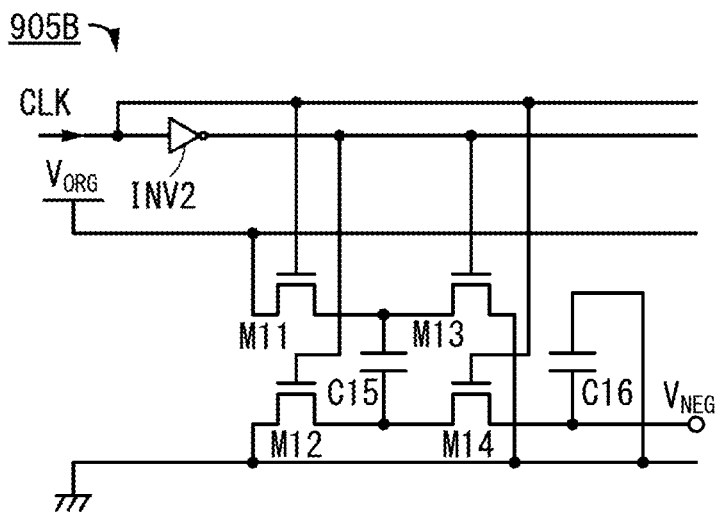
Figure 53C:
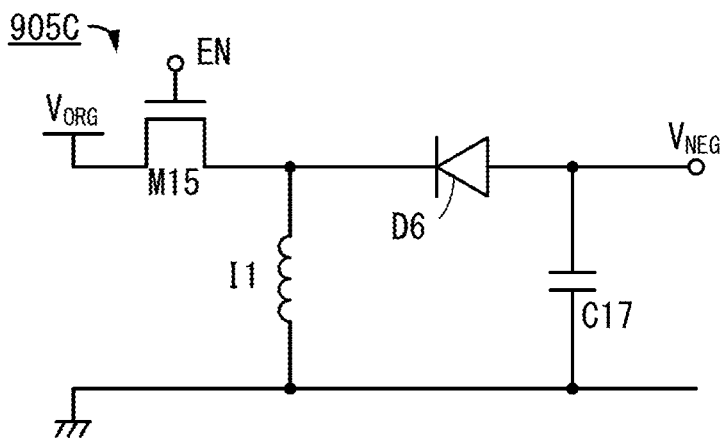
Figure 54A:
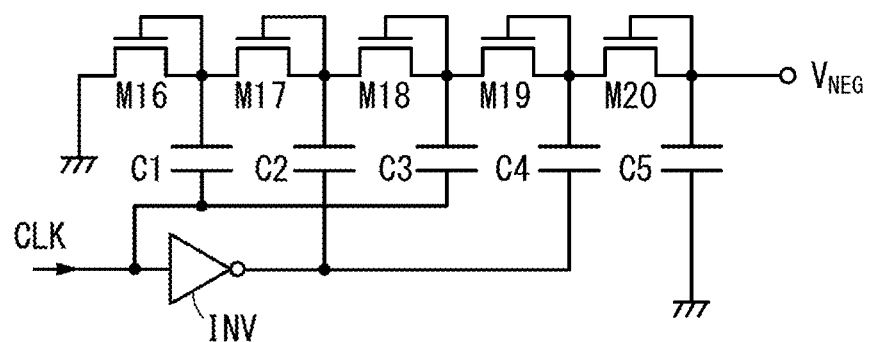
FIGS. 54A and 54B are each a circuit diagram illustrating one embodiment of the present invention.
Figure 54B:
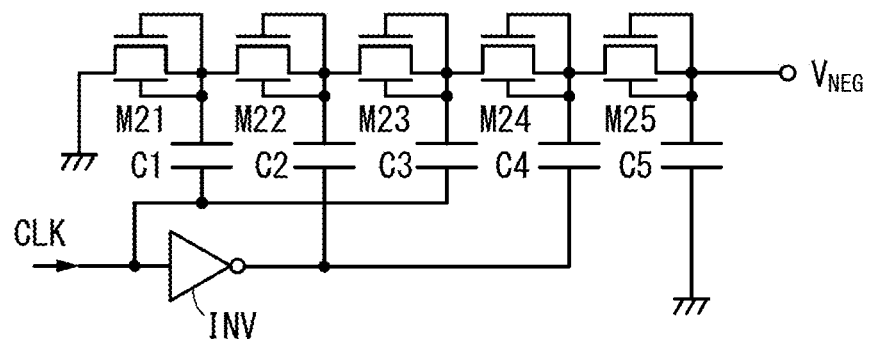

A voltage generation circuit 903E in FIG. 52B has a configuration in which the transistors M16 to M20 of the voltage generation circuit 903D in FIG. 52A are replaced with transistor M21 to M25 having back gates. In the voltage generation circuit 903E in FIG. 52B, the back gates can be supplied with voltages that are the same as those of the gates, so that the current flowing through the transistors can be increased. Thus, efficient voltage increase from the voltage $V_{ORG}$ to the voltage $V_{POG}$ is possible.

Note that the modification examples of the voltage generation circuit 903 can also be applied to the voltage generation circuit 905 in FIG. 50B. The configurations of a circuit diagram in this case are illustrated in FIGS. 53A to 53C and FIGS. 54A and 54B. In a voltage generation circuit 905A illustrated in FIG. 53A, the voltage $V_{NEG}$ which has been reduced from the voltage $V_{SS}$ to a negative voltage having a negatively tripled value of the voltage $V_{ORG}$ by application of the clock signal CLK, can be obtained. In a voltage generation circuit 905B illustrated in FIG. 53B, the voltage $V_{NEG}$ which has been reduced from the voltage $V_{SS}$ to a negative voltage having a negatively doubled value of the voltage $V_{ORG}$ by application of the clock signal CLK, can be obtained.

The voltage generation circuits 905A to 905E illustrated in FIGS. 53A to 53C and FIGS. 54A and 54B have configurations formed by changing the voltages applied to the wirings or the arrangement of the elements of the voltage generation circuits 903A to 903E illustrated in FIGS. 51A to 51C and FIGS. 52A and 52B. In the voltage generation circuits 905A to 905E illustrated in FIGS. 53A to 53C and FIGS. 54A and 54B, as in the voltage generation circuits 903A to 903E, an efficient voltage decrease from the voltage $V_{SS}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

The structure described in this embodiment can be used as appropriate in combination with any of the structures described in the other embodiments.

Embodiment 10

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 55A to 55F illustrate specific examples of these electronic devices.

Figure 55A:
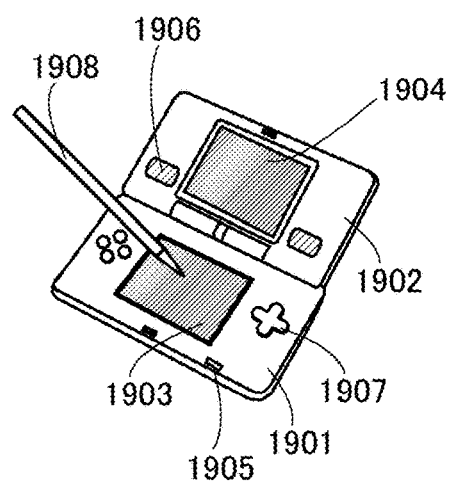
FIGS. 55A to 55F illustrate electronic devices of one embodiment of the present invention.

FIG. 55A illustrates a portable game console including a housing 1901, a housing 1902, a display portion 1903, a display portion 1904, a microphone 1905, a speaker 1906, an operation key 1907, a stylus 1908, and the like. Although the portable game console in FIG. 55A has the two display portions 1903 and 1904, the number of display portions included in a portable game console is not limited to this.

Figure 55B:
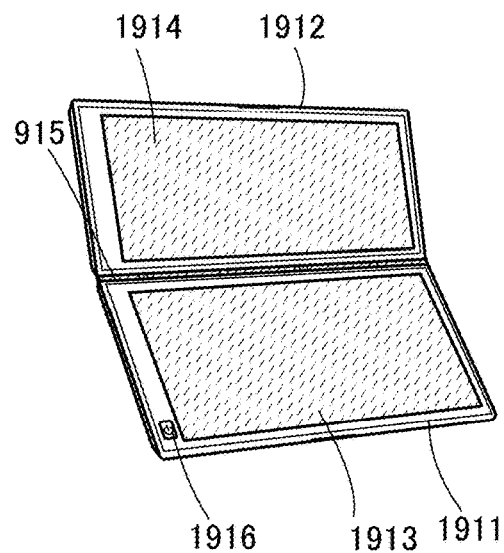

FIG. 55B illustrates a portable data terminal including a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. An image on the first display portion 1913 may be switched in accordance with the angle at the joint 1915 between the first housing 1911 and the second housing 1912. A display device with a position input function may be used as at least one of the first display portion 1913 and the second display portion 1914. Note that the position input function can be added by providing a touch panel in a display device. Alternatively, the position input function can be added by providing a photoelectric conversion element called a photosensor in a pixel portion of a display device.

Figure 55C:
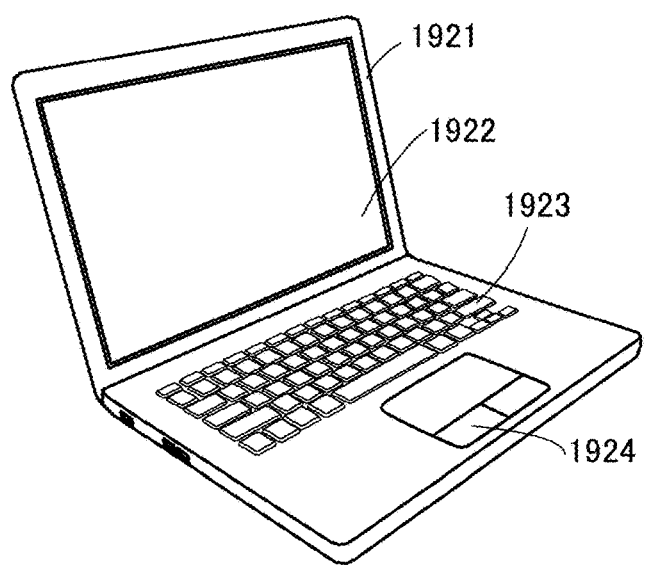

FIG. 55C illustrates a notebook personal computer, which includes a housing 1921, a display portion 1922, a keyboard 1923, a pointing device 1924, and the like.

Figure 55D:
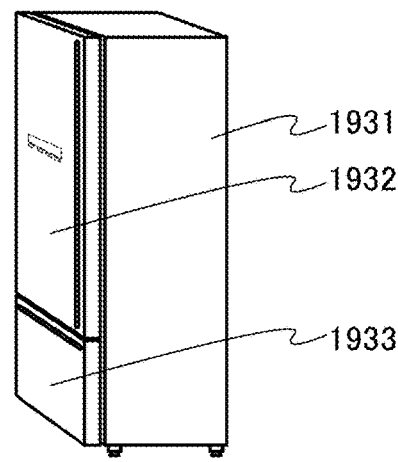

FIG. 55D illustrates an electric refrigerator-freezer, which includes a housing 1931, a door for a refrigerator 1932, a door for a freezer 1933, and the like.

Figure 55E:
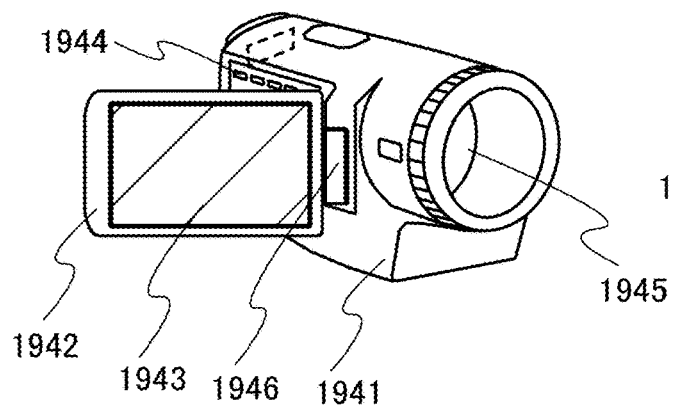

FIG. 55E illustrates a video camera, which includes a first housing 1941, a second housing 1942, a display portion 1943, operation keys 1944, a lens 1945, a joint 1946, and the like. The operation keys 1944 and the lens 1945 are provided for the first housing 1941, and the display portion 1943 is provided for the second housing 1942. The first housing 1941 and the second housing 1942 are connected to each other with the joint 1946, and the angle between the first housing 1941 and the second housing 1942 can be changed with the joint 1946. Images displayed on the display portion 1943 may be switched in accordance with the angle at the joint 1946 between the first housing 1941 and the second housing 1942.

Figure 55F:
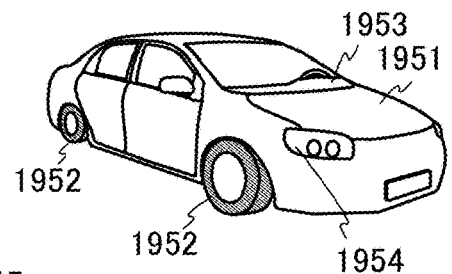

FIG. 55F illustrates a car including a car body 1951, wheels 1952, a dashboard 1953, lights 1954, and the like.

The structure described in this embodiment can be combined with any of the structures described in the other embodiments as appropriate.

Embodiment 11

In this embodiment, a semiconductor wafer, a chip, and an electronic component of one embodiment of the present invention will be described.

<Semiconductor Wafer and Chip>

Figure 56A:
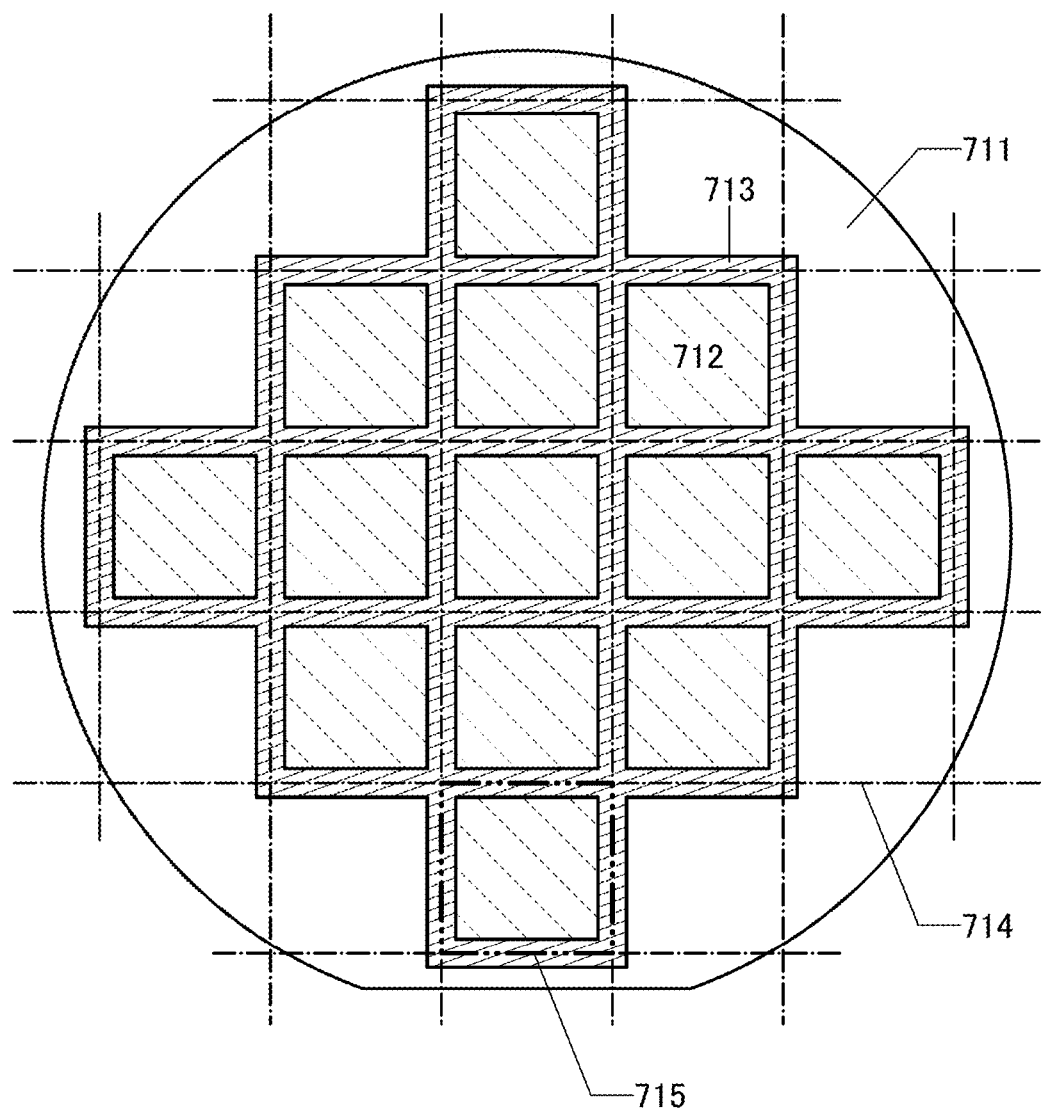
FIGS. 56A and 56B are top views of a semiconductor wafer of one embodiment of the present invention.

FIG. 56A is a top view illustrating a substrate 711 before dicing treatment. As the substrate 711, a semiconductor substrate (also referred to as a "semiconductor wafer") can be used, for example. A plurality of circuit regions 712 are provided over the substrate 711. A semiconductor device, a CPU, or an RF tag according to one embodiment of the present invention, an image sensor, or the like can be provided in the circuit region 712.

Figure 56B:
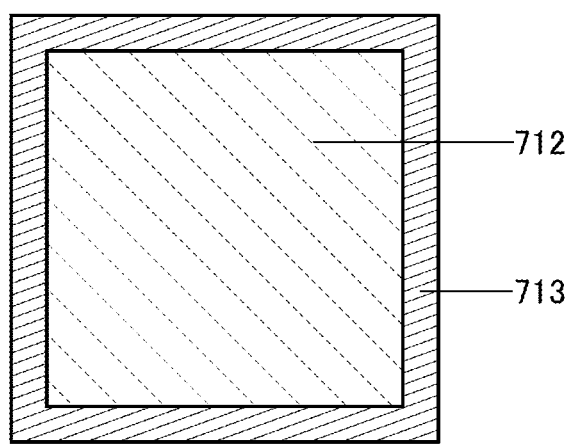

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 56B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing semiconductor devices can be reduced. Thus, semiconductor devices can be manufactured with improved productivity.

For a semiconductor layer provided in the separation regions 713, a material having a band gap greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

<Electronic Component>

Figure 57A:
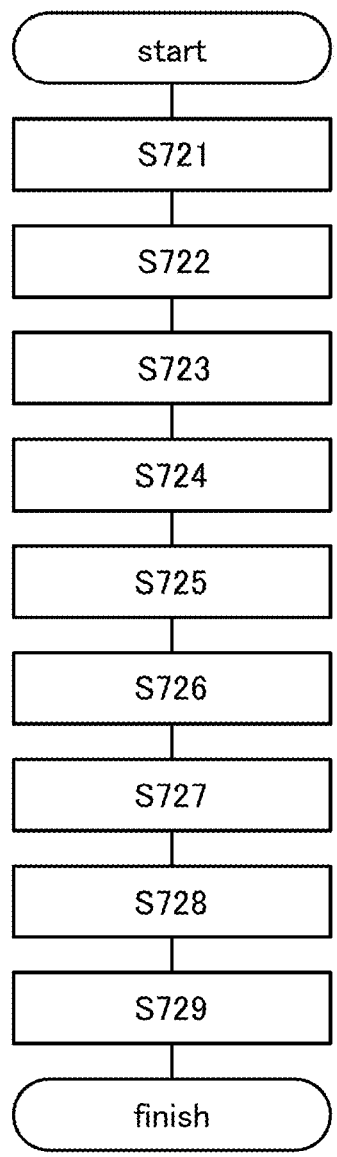
FIG. 57A is a flowchart showing a manufacturing process example of an electronic component.
Figure 57B:
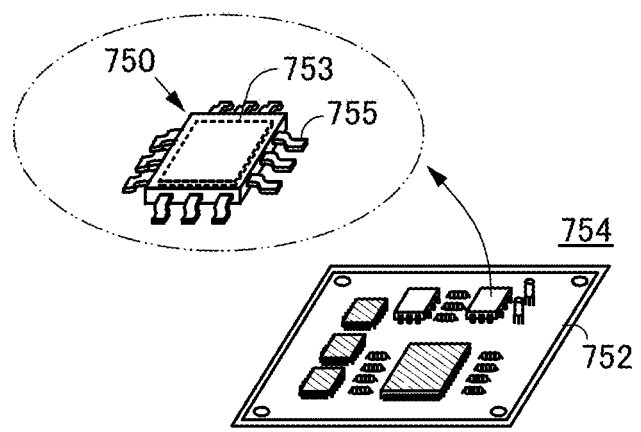
FIG. 57B is a schematic perspective view of the electronic component.

FIGS. 57A and 57B show an example where the chip 715 is used to make an electronic component. Note that the electronic component is also referred to as a semiconductor package or an IC package. This electronic component has a plurality of standards and names depending on a terminal extraction direction and a terminal shape.

The electronic component can be completed in an assembly process (post-process) in which the semiconductor device described in the above embodiment and a component other than the semiconductor device are combined.

The post-process will be described with reference to a flow chart in FIG. 57A. After an element substrate including the semiconductor device described in any of the above embodiments is completed in a pre-process, a back surface grinding step in which a back surface (a surface where a semiconductor device and the like are not formed) of the element substrate is ground is performed (Step S721). When the element substrate is thinned by grinding, warpage or the like of the element substrate is reduced, so that the size of the electronic component can be reduced.

Next, the element substrate is divided into a plurality of chips (chips 715) in a dicing step (Step S722). Then, the separated chips are individually picked up to be bonded to a lead frame in a die bonding step (Step S723). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S724). As the metal wire, a silver wire or a gold wire can be used. Ball bonding or wedge bonding can be used as the wire bonding.

The wire-bonded chip is subjected to a molding step of sealing the chip with an epoxy resin or the like (Step S725). Through the molding step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed circuit board in a later step. Then, the lead is cut and processed in a formation step (Step S727).

Next, a printing (marking) step is performed on a surface of the package (Step S728). After a testing step (Step S729) for checking whether an external shape is good and whether there is a malfunction, for example, the electronic component is completed.

FIG. 57B is a perspective schematic diagram of a completed electronic component. FIG. 57B is a perspective schematic diagram illustrating a quad flat package (QFP) as an example of the electronic component. An electronic component 750 in FIG. 57B includes a lead 755 and a semiconductor device 753. As the semiconductor device 753, the semiconductor device described in any of the above embodiments can be used.

The electronic component 750 in FIG. 57B is mounted on a printed circuit board 752, for example. A plurality of electronic components 750 that are combined and electrically connected to each other over the printed circuit board 752; thus, a substrate on which the electronic components are mounted (a circuit board 754) is completed. The completed circuit board 754 is provided in an electronic device or the like.

The structure described above in this embodiment can be combined with any of the structures described in the other embodiments as appropriate.

Embodiments of the present invention have been described in the above embodiments. Note that one embodiment of the present invention is not limited to the above examples. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

This application is based on Japanese Patent Application serial no. 2016-048267 filed with Japan Patent Office on Mar. 11, 2016, the entire contents of which are hereby incorporated by reference.

What is claimed is:

1. A semiconductor device comprising a transistor,
    wherein the transistor comprises first to fourth conductors, first to third oxides, first and second barrier films, and first and second insulators,
    wherein the first insulator comprises a region overlapping the first conductor;
    wherein the first oxide is located over the first insulator,
    wherein the second oxide is located over the first oxide,
    wherein the second oxide comprises first to third regions,
    wherein the second region is located between the first region and the third region,
    wherein the second conductor is located over the second oxide,
    wherein the first barrier film is located over and in contact with the second conductor,
    wherein the second conductor and the first barrier film each comprise a region overlapping the first region,
    wherein the third conductor is located over the second oxide,
    wherein the second barrier film is located over and in contact with the third conductor,
    wherein the third conductor and the second barrier film each include a region overlapping the third region,
    wherein the third oxide comprises a region overlapping the first barrier film, a region overlapping the second barrier film, and a region overlapping the second region,
    wherein the second insulator is located over the third oxide,
    wherein the fourth conductor is located over the second insulator,
    wherein the second insulator and the fourth conductor each comprise a region overlapping the second region,
    wherein a side surface of the first barrier film, a side surface of the second conductor, a side surface of the second oxide, and a side surface of the first oxide are aligned with each other,
    wherein a side surface of the second barrier film, a side surface of the third conductor, a side surface of the second oxide, and a side surface of the first oxide are aligned with each other, and
    wherein an edge portion of the third oxide recedes from an edge portion of the second insulator.

2. The semiconductor device according to claim 1, wherein the first to third oxides each comprise an oxide semiconductor.

3. The semiconductor device according to claim 1, wherein the first and second barrier films each comprise metal and oxygen.

4. A module comprising:
    the semiconductor device according to claim 1; and
    a printed circuit board.

5. An electronic device comprising:
    the module according to claim 4; and
    a speaker or an operation key.

6. A semiconductor wafer comprising:
    a plurality of semiconductor devices; and
    a region for dicing,
    wherein at least one of the plurality of semiconductor devices is the semiconductor device according to claim 1.

7. A semiconductor device comprising:
    a first conductor;
    a first insulator over the first conductor;
    a first oxide over the first insulator;
    a second oxide over the first oxide;
    a second conductor over the second oxide;
    a third conductor over the second oxide;
    a first barrier film over and in contact with the second conductor;
    a second barrier film over and in contact with the third conductor;
    a third oxide over and in contact with the second oxide;
    a second insulator over the third oxide; and
    a fourth conductor over the third oxide,
    wherein the first conductor overlaps with the fourth conductor,
    wherein a side surface of the first barrier film, a side surface of the second conductor, a side surface of the second oxide, and a side surface of the first oxide are aligned with each other,
    wherein a side surface of the second barrier film, a side surface of the third conductor, a side surface of the second oxide, and a side surface of the first oxide are aligned with each other, and wherein an edge portion of the third oxide recedes from an edge portion of the second insulator.

8. The semiconductor device according to claim 7, wherein the first to third oxides each comprise an oxide semiconductor.

9. The semiconductor device according to claim 7, wherein the first and second barrier films each comprise metal and oxygen.

10. The semiconductor device according to claim 7, wherein the third oxide is in contact with the second conductor, the first barrier film, the third conductor, and the second barrier film.

11. The semiconductor device according to claim 1, wherein in a first direction the first insulator and the second insulator surround the third oxide.

12. The semiconductor device according to claim 7, wherein in a first direction the first insulator and the second insulator surround the third oxide.

* * * * *